United States Patent
Yamazaki et al.

(10) Patent No.: US 9,627,198 B2
(45) Date of Patent: Apr. 18, 2017

(54) METHOD FOR MANUFACTURING THIN FILM SEMICONDUCTOR DEVICE

(75) Inventors: Shunpei Yamazaki, Setagaya (JP);
Akiharu Miyanaga, Hadano (JP);
Masahiro Takahashi, Atsugi (JP);
Hideyuki Kishida, Atsugi (JP);
Junichiro Sakata, Atsugi (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 200 days.

(21) Appl. No.: 12/894,791

(22) Filed: Sep. 30, 2010

(65) Prior Publication Data

US 2011/0079778 A1   Apr. 7, 2011

(30) Foreign Application Priority Data

Oct. 5, 2009   (JP) .................. 2009-231966

(51) Int. Cl.
*H01L 21/00* (2006.01)
*H01L 21/84* (2006.01)
(Continued)

(52) U.S. Cl.
CPC .. *H01L 21/02565* (2013.01); *H01L 21/02164* (2013.01); *H01L 21/02266* (2013.01);
(Continued)

(58) Field of Classification Search
CPC ......... H01L 21/02565; H01L 21/02554; H01L 29/7869; H01L 21/02631; H01L 27/1225;
(Continued)

(56) References Cited

U.S. PATENT DOCUMENTS 5,440,157 A * 8/1995 Imai et al. ............... 257/310
5,440,168 A   8/1995 Nishimura et al.
(Continued)

FOREIGN PATENT DOCUMENTS

CN   101258607 A   9/2008
CN   101506986 A   8/2009
(Continued)

OTHER PUBLICATIONS

Written Opinion (Application No. PCT/JP2010/065888) Dated Nov. 22, 2010.
(Continued)

*Primary Examiner* — Shouxiang Hu
(74) *Attorney, Agent, or Firm* — Robinson Intellectual Property Law Office; Eric J. Robinson

(57) ABSTRACT

An object is to provide a semiconductor device with stable electric characteristics in which an oxide semiconductor is used. The impurity concentration in the oxide semiconductor layer is reduced in the following manner: a silicon oxide layer including many defects typified by dangling bonds is formed in contact with the oxide semiconductor layer, and an impurity such as hydrogen or moisture (a hydrogen atom or a compound including a hydrogen atom such as $H_2O$) included in the oxide semiconductor layer is diffused into the silicon oxide layer. Further, a mixed region is provided between the oxide semiconductor layer and the silicon oxide layer. The mixed region includes oxygen, silicon, and at least one kind of metal element that is included in the oxide semiconductor.

14 Claims, 21 Drawing Sheets

(51) Int. Cl.
  *H01L 21/02*    (2006.01)
  *H01L 29/786*   (2006.01)
  *H01L 27/12*    (2006.01)

(52) U.S. Cl.
  CPC .. *H01L 21/02422* (2013.01); *H01L 21/02554* (2013.01); *H01L 21/02631* (2013.01); *H01L 29/7869* (2013.01); *H01L 27/1225* (2013.01)

(58) Field of Classification Search
  CPC ......... H01L 21/02422; H01L 21/02164; H01L 21/02266
  USPC ................... 438/104, 149, 158; 257/E21.46
  See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 5,885,858 A | 3/1999 | Nishimura et al. | |
| 6,103,556 A | 8/2000 | Nishimura et al. | |
| 6,200,653 B1 * | 3/2001 | Tsai | H01L 21/02131 257/E21.244 |
| 6,294,274 B1 | 9/2001 | Kawazoe et al. | |
| 6,346,489 B1 | 2/2002 | Cohen et al. | |
| 6,563,174 B2 | 5/2003 | Kawasaki et al. | |
| 6,589,890 B2 | 7/2003 | Cohen et al. | |
| 6,727,522 B1 | 4/2004 | Kawasaki et al. | |
| 6,852,623 B2 | 2/2005 | Park et al. | |
| 7,014,887 B1 | 3/2006 | Cohen et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,141,821 B1 | 11/2006 | Yamazaki et al. | |
| 7,189,654 B2 | 3/2007 | Yamazaki et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,470,607 B2 | 12/2008 | Carcia et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,791,074 B2 | 9/2010 | Iwasaki | |
| 7,833,845 B2 | 11/2010 | Yamazaki et al. | |
| 7,910,490 B2 | 3/2011 | Akimoto et al. | |
| 7,932,521 B2 | 4/2011 | Akimoto et al. | |
| 7,935,582 B2 | 5/2011 | Iwasaki | |
| 7,956,361 B2 | 6/2011 | Iwasaki | |
| 7,960,218 B2 * | 6/2011 | Ma et al. | 438/149 |
| 8,053,780 B2 | 11/2011 | Kanno et al. | |
| 8,110,436 B2 | 2/2012 | Hayashi et al. | |
| 8,129,714 B2 | 3/2012 | Yano et al. | |
| 8,148,245 B2 | 4/2012 | Ikisawa et al. | |
| 8,154,024 B2 | 4/2012 | Iwasaki | |
| 8,164,256 B2 | 4/2012 | Sano et al. | |
| 8,193,045 B2 | 6/2012 | Omura et al. | |
| 8,263,421 B2 | 9/2012 | Yamazaki et al. | |
| 8,274,077 B2 | 9/2012 | Akimoto et al. | |
| 8,304,779 B2 | 11/2012 | Yamazaki et al. | |
| 8,377,762 B2 | 2/2013 | Eguchi et al. | |
| 8,384,077 B2 | 2/2013 | Yano et al. | |
| 8,415,198 B2 | 4/2013 | Itagaki et al. | |
| 8,461,583 B2 | 6/2013 | Yano et al. | |
| 8,466,463 B2 | 6/2013 | Akimoto et al. | |
| 8,502,217 B2 | 8/2013 | Sato et al. | |
| 8,541,944 B2 | 9/2013 | Sano et al. | |
| 8,563,977 B2 | 10/2013 | Shimada et al. | |
| 8,581,243 B2 | 11/2013 | Takahashi et al. | |
| 8,592,814 B2 | 11/2013 | Yamazaki et al. | |
| 8,629,069 B2 | 1/2014 | Akimoto et al. | |
| 8,654,272 B2 | 2/2014 | Yamazaki et al. | |
| 8,669,550 B2 | 3/2014 | Akimoto et al. | |
| 8,709,864 B2 * | 4/2014 | Yamazaki et al. | 438/104 |
| 8,735,229 B2 | 5/2014 | Son et al. | |
| 8,748,223 B2 * | 6/2014 | Yamazaki et al. | 438/104 |
| 8,790,959 B2 | 7/2014 | Akimoto et al. | |
| 8,791,458 B2 | 7/2014 | Yamazaki et al. | |
| 8,796,069 B2 | 8/2014 | Akimoto et al. | |
| 2001/0046027 A1 | 11/2001 | Tai et al. | |
| 2002/0020839 A1 | 2/2002 | Yamazaki et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2003/0234424 A1 | 12/2003 | Suzawa et al. | |
| 2004/0038446 A1 | 2/2004 | Takeda et al. | |
| 2004/0076835 A1 | 4/2004 | Watanabe | |
| 2004/0077134 A1 | 4/2004 | Takayama et al. | |
| 2004/0099926 A1 * | 5/2004 | Yamazaki et al. | 257/632 |
| 2004/0112735 A1 * | 6/2004 | Saigal et al. | 204/192.12 |
| 2004/0121591 A1 * | 6/2004 | Ichinose et al. | 438/649 |
| 2004/0127038 A1 | 7/2004 | Carcia et al. | |
| 2005/0011752 A1 | 1/2005 | Yamazaki et al. | |
| 2005/0017302 A1 | 1/2005 | Hoffman | |
| 2005/0199959 A1 | 9/2005 | Chiang et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 * | 5/2006 | Yabuta et al. | 438/151 |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0121700 A1 | 6/2006 | Peng et al. | |
| 2006/0138399 A1 | 6/2006 | Itano et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0263949 A1 | 11/2006 | Tsai et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0167023 A1 | 7/2007 | Yamazaki et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0129933 A1 | 6/2008 | Nishida et al. | |
| 2008/0166834 A1 | 7/2008 | Kim et al. | |

(56) References Cited

U.S. PATENT DOCUMENTS

| | | |
|---|---|---|
| 2008/0182358 A1 | 7/2008 | Cowdery-Corvan et al. |
| 2008/0197344 A1* | 8/2008 | Yano .................. H01L 51/0545 257/40 |
| 2008/0224133 A1 | 9/2008 | Park et al. |
| 2008/0237598 A1 | 10/2008 | Nakayama |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0299702 A1* | 12/2008 | Son et al. ..................... 438/104 |
| 2008/0308805 A1 | 12/2008 | Akimoto et al. |
| 2009/0042394 A1 | 2/2009 | Yamazaki et al. |
| 2009/0045397 A1* | 2/2009 | Iwasaki ........................... 257/43 |
| 2009/0068773 A1 | 3/2009 | Lai et al. |
| 2009/0072232 A1 | 3/2009 | Hayashi et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0140438 A1 | 6/2009 | Yamazaki et al. |
| 2009/0152506 A1 | 6/2009 | Umeda et al. |
| 2009/0152541 A1 | 6/2009 | Maekawa et al. |
| 2009/0159894 A1 | 6/2009 | Yasumatsu |
| 2009/0166616 A1 | 7/2009 | Uchiyama |
| 2009/0179199 A1 | 7/2009 | Sano et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2009/0325341 A1 | 12/2009 | Itagaki et al. |
| 2010/0025675 A1 | 2/2010 | Yamazaki et al. |
| 2010/0025678 A1 | 2/2010 | Yamazaki et al. |
| 2010/0035429 A1 | 2/2010 | Jang et al. |
| 2010/0051937 A1 | 3/2010 | Kaji et al. |
| 2010/0051940 A1 | 3/2010 | Yamazaki et al. |
| 2010/0051949 A1 | 3/2010 | Yamazaki et al. |
| 2010/0065844 A1 | 3/2010 | Tokunaga |
| 2010/0065851 A1 | 3/2010 | Makita |
| 2010/0072468 A1 | 3/2010 | Yamazaki et al. |
| 2010/0072469 A1 | 3/2010 | Yamazaki et al. |
| 2010/0084648 A1 | 4/2010 | Watanabe |
| 2010/0092800 A1 | 4/2010 | Itagaki et al. |
| 2010/0109002 A1 | 5/2010 | Itagaki et al. |
| 2010/0213459 A1* | 8/2010 | Shimada et al. ................. 257/43 |
| 2010/0276685 A1 | 11/2010 | Itagaki et al. |
| 2010/0276689 A1 | 11/2010 | Iwasaki |
| 2010/0279462 A1 | 11/2010 | Iwasaki |
| 2010/0283049 A1 | 11/2010 | Sato et al. |
| 2011/0062433 A1 | 3/2011 | Yamazaki |
| 2011/0068336 A1* | 3/2011 | Yamazaki et al. .............. 257/43 |
| 2011/0068388 A1* | 3/2011 | Yamazaki et al. ............ 257/329 |
| 2011/0070693 A1* | 3/2011 | Yamazaki et al. ............ 438/104 |
| 2011/0104851 A1 | 5/2011 | Akimoto et al. |
| 2011/0121290 A1 | 5/2011 | Akimoto et al. |
| 2011/0180392 A1* | 7/2011 | Yano et al. .............. 204/192.25 |
| 2012/0132911 A1 | 5/2012 | Shimada et al. |
| 2013/0140175 A1 | 6/2013 | Yano et al. |
| 2013/0146452 A1 | 6/2013 | Yano et al. |
| 2013/0153877 A1 | 6/2013 | Eguchi et al. |
| 2014/0113407 A1 | 4/2014 | Yamazaki et al. |
| 2014/0138681 A1 | 5/2014 | Yamazaki et al. |

FOREIGN PATENT DOCUMENTS

| | | |
|---|---|---|
| EP | 1081750 A | 3/2001 |
| EP | 1081751 A | 3/2001 |
| EP | 1592053 A | 11/2005 |
| EP | 1737044 A | 12/2006 |
| EP | 1770788 A | 4/2007 |
| EP | 1976018 A | 10/2008 |
| EP | 1995787 A | 11/2008 |
| EP | 1998373 A | 12/2008 |
| EP | 1998374 A | 12/2008 |
| EP | 1998375 A | 12/2008 |
| EP | 2 192 437 | 6/2010 |
| EP | 2226847 A | 9/2010 |
| EP | 2339639 A | 6/2011 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 05-331619 A | 12/1993 |
| JP | 06-244421 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-288864 A | 10/2004 |
| JP | 2007-073698 A | 3/2007 |
| JP | 2007-096055 A | 4/2007 |
| JP | 2007-103918 A | 4/2007 |
| JP | 2007-123861 | 5/2007 |
| JP | 2007-158304 A | 6/2007 |
| JP | 2007-173489 A | 7/2007 |
| JP | 2007-194594 A | 8/2007 |
| JP | 2007-311404 A | 11/2007 |
| JP | 2008-053356 A | 3/2008 |
| JP | 2008-121034 A | 5/2008 |
| JP | 2008-141119 A | 6/2008 |
| JP | 2008-218495 A | 9/2008 |
| JP | 2008-235835 A | 10/2008 |
| JP | 2008-281988 A | 11/2008 |
| JP | 2008-311342 A | 12/2008 |
| JP | 2009-010362 A | 1/2009 |
| JP | 2009-099944 A | 5/2009 |
| JP | 2009-099953 A | 5/2009 |
| JP | 2009-135436 A | 6/2009 |
| JP | 2009-141002 A | 6/2009 |
| JP | 2009-158663 A | 7/2009 |
| JP | 2009-194351 A | 8/2009 |
| JP | 2009-212497 A | 9/2009 |
| JP | 2009-224479 A | 10/2009 |
| JP | 2010-062229 A | 3/2010 |
| KR | 2004-0079516 A | 9/2004 |
| KR | 2008-0104588 A | 12/2008 |
| KR | 2009-0018587 A | 2/2009 |
| TW | 476131 | 2/2002 |
| TW | 200929546 | 7/2009 |
| WO | WO-2004/070820 | 8/2004 |
| WO | WO-2004/114391 | 12/2004 |
| WO | WO 2007/029844 | 3/2007 |
| WO | WO-2008/023553 | 2/2008 |
| WO | WO-2008/069286 | 6/2008 |
| WO | WO-2008/099863 | 8/2008 |
| WO | WO-2008/105250 | 9/2008 |
| WO | WO-2008/126879 | 10/2008 |
| WO | WO-2008/139859 | 11/2008 |
| WO | WO-2008/149873 | 12/2008 |
| WO | WO-2009/031634 | 3/2009 |
| WO | WO-2009/041544 | 4/2009 |
| WO | WO-2009/041713 | 4/2009 |
| WO | WO-2009/072532 | 6/2009 |
| WO | WO-2009/075281 | 6/2009 |
| WO | WO-2009/081885 | 7/2009 |
| WO | WO-2009/084537 | 7/2009 |
| WO | WO-2009/087943 | 7/2009 |
| WO | WO 2010/029865 | 3/2010 |
| WO | WO 2010/053060 | 5/2010 |

(56) References Cited

FOREIGN PATENT DOCUMENTS

| WO | WO 2010/058746 | 5/2010 |
|---|---|---|
| WO | WO 2010071183 | 6/2010 |

OTHER PUBLICATIONS

International Search Report (Application No. PCT/JP2010/065888) Dated Nov. 22, 2010.

Fortunato.E et al., "Wide-Bandgap High-Mobility ZNO Thin-Film Transistors Produced At Roo, Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda. T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Films Transistors By Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letter) , Sep. 13, 2004, vol. 85, No. 11, pp. 1993-1995.

Li.C et al., "Modulated Structures of Homologous Compounds InMo3(ZnO)m (M=In, Ga; m=Interger) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symosium Digest of Technical Papers, May 20, 2008, vol. 39, pp. 625-628.

Nowatari.H et al., "60.2: Intermediate Connector With Suppressed Voltage Loss for White TANDEM OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employinh MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van De Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The 'Blue Phase',", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTS,", IDW '09 : Proceedings of the 16th International Display Workshops, 2009, pp. 689-692.

Park.J et al., "Amorphous Indium-Gallium Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure For Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (Zno TFTS) for AMLCDS,", Journals of the SID , 2007, vol. 15, No. 1, pp. 17-22.

(56) References Cited

OTHER PUBLICATIONS

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N. et al., "SPINEL,YbFe2O4, and Yb2Fe3O7 Types of Structures for Compounds in the In2O3 and Sc2O3—A2O3—BO Systems [A;Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 16, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No 5B, pp. 4303-4308.

Janotti.A et al., "Native Point Defects in ZnO,", Phys. Rev. B (Physical Review. B), 2007, vol. 76, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Cyrstalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vaccum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Nakamura.M et al., "Syntheses and crystal structures of new homologous compounds, indium iron zinc oxides (InFeO3(ZnO)m) (m natural number) and related compounds", KOTAI Butsuri (Solid State Physics), 1993, vol. 28, No. 5, pp. 317-327.

Dehuff.N. et al., "Transparent thin-film transistors with zinc indium oxide channel layer", J. Appl. Phys. (Journal of Applied Physics) , 2005, vol. 97, pp. 064505-1-064505-5.

Honda.S et al., "Oxygen content of indium tin oxide films fabricated by reactive sputtering", J. Vac. Sci. Technol. A (Journal of Vacuum Science & Technology A), 1995, pp. 1100-1103.

Takeda.K et al., "Thermal annealing effects of dangling bonds in hydrogenated polymorphous silicon", Journal of Applied Physics (J.Appl.Phys), 2008, vol. 104, pp. 053715-1-053715-6.

Taiwanese Office Action (Application No. 099133691) Dated Jul. 21, 2015.

Korean Office Action (Application No. 2012-7011502) Dated Nov. 29, 2016.

\* cited by examiner 100 120 101 102

121

115a 115b 116 119

103 112

110

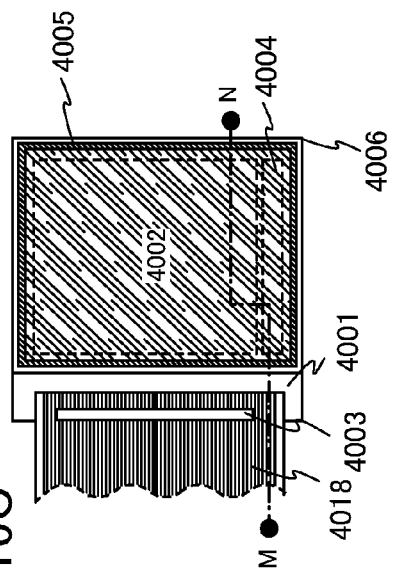
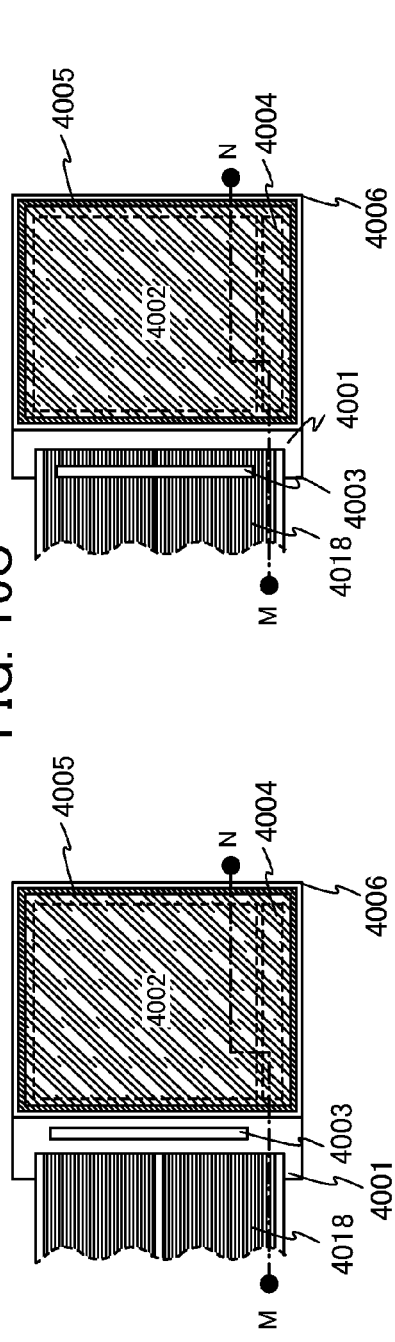
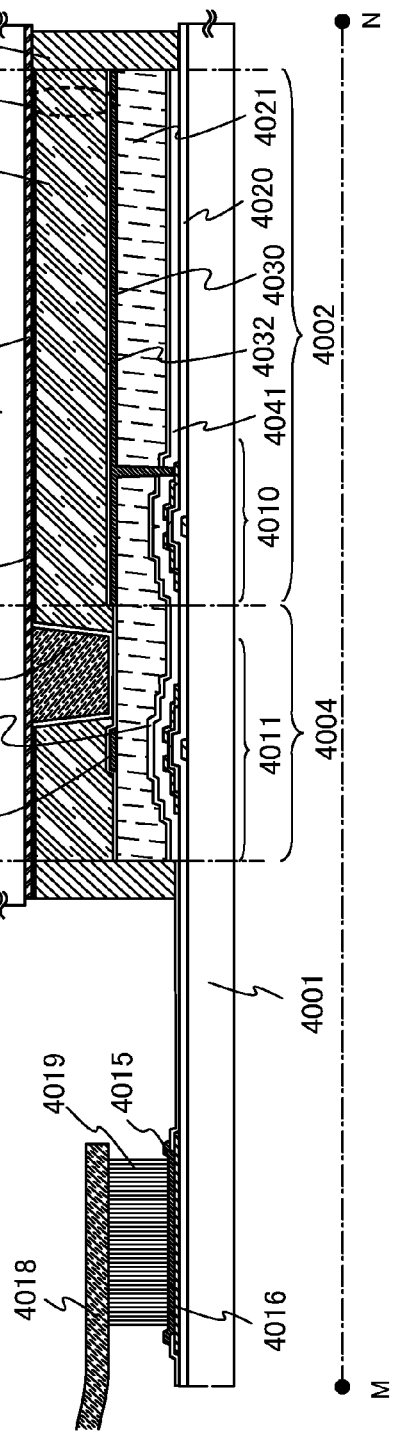

METHOD FOR MANUFACTURING THIN FILM SEMICONDUCTOR DEVICE

TECHNICAL FIELD

The present invention relates to a semiconductor device including an oxide semiconductor and a manufacturing method thereof.

In this specification, a semiconductor device means all types of devices which can function by utilizing semiconductor characteristics, and an electrooptic device, a semiconductor circuit, and an electronic appliance are all semiconductor devices.

BACKGROUND ART

In recent years, a technique for forming a thin film transistor (TFT) by using a semiconductor thin film (having a thickness of approximately several nanometers to several hundreds of nanometers) formed over a substrate having an insulating surface has attracted attention. Thin film transistors are applied to a wide range of electronic devices such as integrated circuits (ICs) and electro-optical devices, and, in particular, thin film transistors that are used as switching elements in image display devices are urgently developed. There exists a wide variety of metal oxides and such metal oxides are used for various applications. Indium oxide is a well-known material and is used as a transparent electrode material which is necessary for liquid crystal displays and the like.

Some metal oxides have semiconductor characteristics. Examples of the metal oxides having semiconductor characteristics are tungsten oxide, tin oxide, indium oxide, zinc oxide, and the like. Thin film transistors in which a channel formation region is formed using such a metal oxide having semiconductor characteristics are already known (see Patent Document 1 and Patent Document 2).

REFERENCE

Patent Document

[Patent Document 1] Japanese Published Patent Application No. 2007-123861
[Patent Document 2] Japanese Published Patent Application No. 2007-96055

DISCLOSURE OF INVENTION

However, a difference from the stoichiometric composition in an oxide semiconductor arises in a thin film formation process. For example, electric conductivity of the oxide semiconductor changes due to the excess or deficiency of oxygen. Further, hydrogen or moisture that enters the oxide semiconductor thin film during the formation of the thin film forms an oxygen (O)-hydrogen (H) bond and serves as an electron donor, which is a factor of changing electric conductivity. Furthermore, since the O—H bond is a polar molecule, it serves as a factor of varying characteristics of an active device such as a thin film transistor manufactured using an oxide semiconductor.

In view of such problems, it is an object of an embodiment of the present invention to provide a semiconductor device with stable electric characteristics in which an oxide semiconductor is used.

In order to suppress variation in electric characteristics of a thin film transistor in which an oxide semiconductor layer is used, hydrogen and moisture which are factors of the variations are eliminated from the oxide semiconductor layer. Specifically, it is preferable that the concentration of hydrogen included in the oxide semiconductor layer be higher than or equal to $1\times10^{18}$ $cm^{-3}$ and lower than or equal to $2\times10^{20}$ $cm^{-3}$.

The impurity concentration in the oxide semiconductor layer may be reduced in the following manner: a silicon oxide layer ($SiO_x$, x is preferably 2 or larger) including many defects which are typified by dangling bonds is formed in contact with the oxide semiconductor layer, and impurities such as hydrogen or moisture (a hydrogen atom or a compound including a hydrogen atom such as $H_2O$) included in the oxide semiconductor layer are diffused into the silicon oxide layer.

The defects included in the silicon oxide layer include either a silicon dangling bond or an oxygen dangling bond or both of them. A silicon oxide layer including many oxygen dangling bonds as defects is preferable because it has a high binding energy mainly with respect to hydrogen, which promotes diffusion from the oxide semiconductor film into the silicon oxide layer; accordingly, the impurity can be stabilized in the silicon oxide layer.

Further, the oxide semiconductor layer or the silicon oxide layer in contact with the oxide semiconductor layer may be formed in a treatment chamber in which the impurity concentration is reduced by exhaustion with the use of a cryopump.

An embodiment of the structure of the invention disclosed in this specification is a semiconductor device which includes a gate electrode layer over a substrate; a gate insulating layer over the gate electrode layer; an oxide semiconductor layer over the gate insulating layer; a source electrode layer and a drain electrode layer over the oxide semiconductor layer; and a silicon oxide layer which is provided over the oxide semiconductor layer, the source electrode layer, and the drain electrode layer and is in contact with part of the oxide semiconductor layer. A mixed region is provided at an interface between the oxide semiconductor layer and the silicon oxide layer, and the mixed region includes oxygen, silicon, and at least one kind of metal element which is included in the oxide semiconductor layer.

The mixed region may have a thickness of 1 nm to 10 nm (preferably, 2 nm to 5 nm). A clearly defined interface is not formed between the oxide semiconductor layer and the silicon oxide layer by provision of the mixed region, whereby hydrogen can be more easily diffused from the oxide semiconductor layer into the silicon oxide layer.

Another embodiment of the structure of the invention disclosed in this specification is a semiconductor device which includes a gate electrode layer over a substrate; a gate insulating layer over the gate electrode layer; an oxide semiconductor layer over the gate insulating layer; a source electrode layer and a drain electrode layer over the oxide semiconductor layer; and a silicon oxide layer which is provided over the oxide semiconductor layer, the source electrode layer, and the drain electrode layer and is in contact with part of the oxide semiconductor layer, in which the silicon oxide layer includes defects.

In the above-described structures, a protective insulating layer which covers the silicon oxide layer may be included.

Another embodiment of the structure of the invention disclosed in this specification is a manufacturing method of a semiconductor device which includes the steps of introducing a substrate into a first treatment chamber in which an atmosphere is in a reduced pressure state, after formation of a gate electrode layer and a gate insulating layer which covers the gate electrode layer over the substrate; forming an oxide semiconductor layer over the gate insulating layer by introducing a sputtering gas from which hydrogen and moisture are removed and using a target of a metal oxide which is placed inside the first treatment chamber, while removing residual moisture from the first treatment chamber; forming a silicon oxide layer including defects over the oxide semiconductor layer by introducing the substrate into a second treatment chamber, removing residual moisture in the second treatment chamber, introducing a sputtering gas containing oxygen from which hydrogen and moisture are removed and using a target including silicon which is placed inside the second treatment chamber, after formation of a source electrode layer and a drain electrode layer over the oxide semiconductor layer; and heating the substrate to a temperature comprised between 100° C. and 400° C. to diffuse hydrogen or moisture included in the oxide semiconductor layer to the silicon oxide layer side.

Another embodiment of the structure of the invention disclosed in this specification is a manufacturing method of a semiconductor device which includes the steps of introducing a substrate into a first treatment chamber in which an atmosphere is in a reduced pressure state, after formation of a gate electrode layer and a gate insulating layer which covers the gate electrode layer over the substrate; forming an oxide semiconductor layer over the gate insulating layer by introducing a sputtering gas from which hydrogen and moisture are removed and using a target of a metal oxide which is placed inside the first treatment chamber while removing residual moisture from the first treatment chamber; forming a silicon oxide layer including defects over the oxide semiconductor layer by introducing the substrate into a second treatment chamber, introducing a sputtering gas containing oxygen from which hydrogen and moisture are removed and using a target including silicon which is placed inside the second treatment chamber, while removing residual moisture from the second treatment chamber, after formation of a source electrode layer and a drain electrode layer over the oxide semiconductor layer; then forming a silicon nitride layer over the silicon oxide layer by introducing the substrate into a third treatment chamber in which an atmosphere is in a reduced pressure state, removing residual moisture in the third treatment chamber, introducing a sputtering gas containing nitrogen from which hydrogen and moisture are removed and using a target including silicon which is placed inside the third treatment chamber; and heating the substrate to a temperature comprised between 100° C. and 400° C. to diffuse hydrogen or moisture included in the oxide semiconductor layer to the silicon oxide layer side.

Another embodiment of the structure of the invention disclosed in this specification is a manufacturing method of a semiconductor device which includes the steps of introducing a substrate into a first treatment chamber in which an atmosphere is in a reduced pressure state, after formation of a gate electrode layer and a gate insulating layer which covers the gate electrode layer over the substrate; forming an oxide semiconductor layer over the gate insulating layer by introducing a sputtering gas from which hydrogen and moisture are removed and using a target of a metal oxide which is placed inside the first treatment chamber, while removing residual moisture from the first treatment chamber; forming a silicon oxide layer including defects over the oxide semiconductor layer by introducing the substrate into a second treatment chamber, introducing a sputtering gas containing oxygen from which hydrogen and moisture are removed and using a target including silicon which is placed inside the second treatment chamber, while removing residual moisture from the second treatment chamber, after formation of a source electrode layer and a drain electrode layer over the oxide semiconductor layer; then forming a silicon nitride layer over the silicon oxide layer by introducing the substrate into a third treatment chamber in which an atmosphere is in a reduced pressure state, heating the substrate to a temperature comprised between 100° C. and 400° C., introducing a sputtering gas containing nitrogen from which hydrogen and moisture are removed, and using a target including silicon which is placed inside the third treatment chamber, while removing residual moisture from the third treatment chamber; and diffusing hydrogen or moisture included in the oxide semiconductor layer to the silicon oxide layer side.

Another embodiment of the structure of the invention disclosed in this specification is a manufacturing method of a semiconductor device which includes the steps of introducing a substrate into a first treatment chamber in which an atmosphere is in a reduced pressure state, after formation of a gate electrode layer and a gate insulating layer which covers the gate electrode layer over the substrate; forming an oxide semiconductor layer over the gate insulating layer by introducing a sputtering gas from which hydrogen and moisture are removed and using a target of a metal oxide which is placed inside the first treatment chamber, while removing residual moisture from the first treatment chamber; forming a silicon oxide layer including defects over the oxide semiconductor layer by introducing the substrate into a second treatment chamber, introducing a sputtering gas containing oxygen from which hydrogen and moisture are removed and using a target including silicon which is placed inside the second treatment chamber, while removing residual moisture from the second treatment chamber, after formation of a source electrode layer and a drain electrode layer over the oxide semiconductor layer; forming a silicon nitride layer over the silicon oxide layer by switching from the sputtering gas containing oxygen to a sputtering gas containing nitrogen from which hydrogen and moisture are removed, and using the target including silicon which is placed inside the second treatment chamber; and heating the substrate over which the silicon nitride layer is formed to a temperature comprised between 100° C. and 400° C. to diffuse hydrogen or moisture included in the oxide semiconductor layer to the silicon oxide layer side.

In the above-described manufacturing methods of a semiconductor device, the silicon oxide layer including defects can be formed over the oxide semiconductor layer in a state such that the temperature of the substrate introduced into the second treatment chamber is comprised between 0° C. and 50° C.

In the above-described manufacturing methods of a semiconductor device, when the oxide semiconductor film and/or the silicon oxide film is/are formed, it is preferable that an adsorption-type vacuum pump be used for exhaustion in the first treatment chamber and/or the second treatment chamber. For example, a cryopump, an ion pump, or a titanium sublimation pump is preferably used. The adsorption-type vacuum pump is effective to reduce the amount of hydrogen, hydroxyl, or hydride included in the oxide semiconductor film and/or the silicon oxide film.

In the above-described manufacturing methods of a semiconductor device, as the target for forming the oxide semiconductor film, a target including zinc oxide as a main component can be used. A metal oxide including indium, gallium, or zinc can be used as the target.

In the above-described manufacturing methods of a semiconductor device, a silicon semiconductor target or a synthetic quartz target can be used as the target including silicon for forming the silicon oxide film.

With the above structures, at least one of the above problems is resolved.

The oxide semiconductor layer is a thin film of $InMO_3(ZnO)_m$ (m>0). A thin film transistor is formed using the thin film as an oxide semiconductor layer. Note that M denotes one or a plurality of metal elements selected from Ga, Fe, Ni, Mn, and Co. For example, M may be Ga or may include the above-described metal element in addition to Ga, for example, M may be Ga and Ni or M may be Ga and Fe. In the above-described oxide semiconductor, a transition metal element such as Fe or Ni or an oxide of the transition metal may be included as an impurity element in addition to the metal element included as M. In this specification, an oxide semiconductor layer whose composition formula is represented as $InMO_3(ZnO)_m$ (m>0) where at least Ga is included as M is referred to as an In—Ga—Zn—O-based oxide semiconductor, and a thin film thereof is also referred to as an In—Ga—Zn—O-based film.

As other examples of the metal oxide applicable to the oxide semiconductor layer, any of the following metal oxides can be applied: an In—Sn—O-based metal oxide; an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. Silicon oxide may be included in the oxide semiconductor layer formed using the above-described metal oxide.

Further, an oxide conductive layer may be formed between the oxide semiconductor layer and the source and drain electrodes. The oxide conductive layer and a metal layer for forming the source and drain electrodes can be formed in succession.

Since a thin film transistor is easily broken due to static electricity or the like, a protective circuit for protecting the thin film transistor in the pixel portion is preferably provided over the same substrate for a gate line or a source line. The protective circuit is preferably formed using a non-linear element including an oxide semiconductor layer.

Note that ordinal numbers such as "first" and "second" in this specification are used for convenience. Therefore, they do not denote the order of steps, the stacking order of layers, and particular names which specify the invention.

A semiconductor device with stable electric characteristics in which an oxide semiconductor is used can be provided.

BRIEF DESCRIPTION OF DRAWINGS

In the accompanying drawings:

FIGS. 16A to 16C each illustrate a semiconductor device;

BEST MODE FOR CARRYING OUT THE INVENTION

Figure 1A:
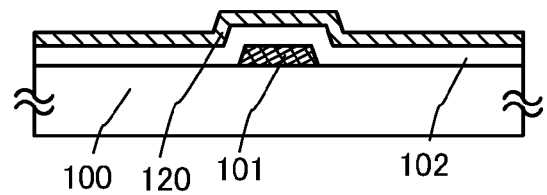
FIGS. 1A to 1E illustrate a manufacturing method of a semiconductor device.

Hereinafter, embodiments of the present invention will be described in detail with reference to the accompanying drawings. However, the present invention is not limited to the following description, and it is easily understood by those skilled in the art that modes and details can be modified in various ways. Therefore, the present invention is not construed as being limited to the description of the embodiments below.

Embodiment 1

In this embodiment, an embodiment of a semiconductor device and a manufacturing method of the semiconductor device will be described with reference to FIGS. 1A to 1E. The semiconductor device described in this embodiment is a thin film transistor.

FIGS. 1A to 1E illustrate an example of a cross-sectional structure of a semiconductor device. A thin film transistor 110 illustrated in FIGS. 1A to 1E has a bottom-gate structure called a channel-etched structure and is also referred to as an inverted staggered thin film transistor.

The thin film transistor 110 is described using a single-gate thin film transistor; however, a multi-gate thin film transistor including a plurality of channel formation regions can be formed as necessary.

Hereinafter, a process for manufacturing the thin film transistor 110 over a substrate 100 is described with reference to FIGS. 1A to 1E.

First, a conductive film is formed over the substrate 100 having an insulating surface, and then, a gate electrode layer 101 is formed through a first photolithography step. It is preferable that an end portion of the formed gate electrode layer have a tapered shape to improve coverage with a gate insulating layer stacked thereover. Note that a resist mask may be formed by an ink-jet method. A photomask is not used when the resist mask is formed by an ink-jet method, which results in reduction of manufacturing costs.

Although there is no particular limitation on a substrate which can be used as the substrate 100 having an insulating surface, the substrate need to have at least heat resistance high enough to withstand a heat treatment to be performed later. As the substrate 100 having an insulating surface, a glass substrate formed of barium borosilicate glass, aluminoborosilicate glass, or the like can be used.

In the case where a glass substrate is used and the temperature of the heat treatment to be performed later is high, a glass substrate whose strain point is greater than or equal to 730° C. is preferably used. As the glass substrate, a substrate of a glass material such as aluminosilicate glass, aluminoborosilicate glass, or barium borosilicate glass is used, for example. Note that by containing a larger amount of barium oxide (BaO) than boron oxide, a glass substrate that is heat-resistant and of more practical use can be obtained. Therefore, a glass substrate containing BaO and $B_2O_3$ so that the amount of BaO is larger than that of $B_2O_3$ is preferably used.

Note that a substrate formed of an insulator such as a ceramic substrate, a quartz substrate, or a sapphire substrate may be used instead of the above glass substrate. Alternatively, crystallized glass or the like can be used. Further alternatively, a plastic substrate or the like can be used as appropriate.

An insulating film serving as a base film may be provided between the substrate 100 and the gate electrode 101. The base film has a function of preventing diffusion of an impurity element from the substrate 100, and can be formed to have a single-layer structure or a stacked structure including one or more films selected from a silicon nitride film, a silicon oxide film, a silicon nitride oxide film, and a silicon oxynitride film.

The gate electrode layer 101 can be formed with a single-layer structure or a stacked structure using a metal material such as molybdenum, titanium, chromium, tantalum, tungsten, aluminum, copper, neodymium, or scandium, or an alloy material containing any of these materials as a main component.

For example, as a two-layer structure of the gate electrode layer 101, the following structures are preferable: a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, and a two-layer structure in which a titanium nitride layer and a molybdenum layer are stacked. As a three-layer structure, a stack of a tungsten layer or a tungsten nitride layer, a layer of an alloy of aluminum and silicon or an alloy of aluminum and titanium, and a titanium nitride layer or a titanium layer is preferable. Note that the gate electrode layer can be formed using a light-transmitting conductive film. As an example of the light-transmitting conductive film, a light-transmitting conductive oxide or the like can be given.

Then, a gate insulating layer 102 is formed over the gate electrode layer 101.

The gate insulating layer 102 can be formed with a single-layer structure or a stacked structure using one or more of a silicon oxide layer, a silicon nitride layer, a silicon oxynitride layer, a silicon nitride oxide layer, and an aluminum oxide layer by a plasma CVD method, a sputtering method, or the like. In order to prevent the gate insulating layer 102 from containing a large amount of hydrogen, the gate insulating layer 102 is preferably formed by a sputtering method. In the case of forming a silicon oxide film by a sputtering method, a silicon target or a quartz target is used as the target, and oxygen or a mixed gas of oxygen and argon is used as the sputtering gas.

The gate insulating layer 102 can have a structure in which a silicon nitride layer and a silicon oxide layer are stacked from the gate electrode layer 101 side. For example, a gate insulating layer having a thickness of 100 nm is formed in such a manner that a silicon nitride layer ($SiN_y$ (y>0)) having a thickness of 50 nm to 200 nm inclusive is formed by a sputtering method as a first gate insulating layer and then a silicon oxide layer ($SiO_x$ (x>0)) having a thickness of 5 nm to 300 nm inclusive is stacked as a second gate insulating layer over the first gate insulating layer.

In order that the gate insulating layer 102 contains as little hydrogen, hydroxyl, and moisture as possible, it is preferable that an impurity adsorbed on the substrate 100 be removed by heating the substrate 100, over which the gate electrode layer 101 is formed, at a temperature of 200° C. or higher in a preheating chamber of a sputtering apparatus, as a pretreatment for film formation.

Next, an oxide semiconductor film 120 having a thickness of greater than or equal to 2 nm and less than or equal to 200 nm is formed over the gate insulating layer 102 (see FIG. 1A).

Before the oxide semiconductor film 120 is formed by a sputtering method, dust on a surface of the gate insulating layer 102 is preferably removed by reverse sputtering in which an argon gas is introduced and plasma is generated. The reverse sputtering is a method in which voltage is applied to a substrate side with use of an RF power source in an argon atmosphere and the substrate surface is exposed to plasma so that the substrate surface is modified. Note that instead of an argon atmosphere, a nitrogen atmosphere, a helium atmosphere, an oxygen atmosphere, or the like may be used.

The oxide semiconductor film 120 is formed by a sputtering method. As the oxide semiconductor film 120, an In—Ga—Zn—O-based film, an In—Sn—Zn—O-based oxide semiconductor film, an In—Al—Zn—O-based oxide semiconductor film, an Sn—Ga—Zn—O-based oxide semiconductor film, an Al—Ga—Zn—O-based oxide semiconductor film, an Sn—Al—Zn—O-based oxide semiconductor film, an In—Zn—O-based oxide semiconductor film, an Sn—Zn—O-based oxide semiconductor film, an Al—Zn—O-based oxide semiconductor film, an In—O-based oxide semiconductor film, an Sn—O-based oxide semiconductor film, or a Zn—O-based oxide semiconductor film is used. In this embodiment, the oxide semiconductor film 120 is formed by a sputtering method using an In—Ga—Zn—O-based metal oxide target. Further, the oxide semiconductor film 120 can be formed by a sputtering method in a rare gas (typically argon) atmosphere, an oxygen atmosphere, or an atmosphere of a rare gas (typically argon) and oxygen. In the case of using a sputtering method, it is preferable that deposition be performed with the use of a target including $SiO_2$ at a concentration greater than or equal to 2 wt % and less than or equal to 10 wt %, so that $SiO_x$ (x>0) which hinders crystallization is contained in the oxide semiconductor film 120; in this way, the oxide semiconductor can be prevented from being crystallized in a heat treatment performed later.

As a target for forming the oxide semiconductor film 120 by a sputtering method, a metal oxide target including zinc oxide as a main component can be used. As another example of the metal oxide target, a metal oxide target including In, Ga, and Zn (composition ratio: $In_2O_3:Ga_2O_3:ZnO=1:1:1$ [molar ratio]) can be used. As the metal oxide target including In, Ga, and Zn, a target having the following composition ratio: $In_2O_3:Ga_2O_3:ZnO=2:2:1$ [molar ratio], or a target having the following composition ratio: $In_2O_3:Ga_2O_3:ZnO=1:1:4$ [molar ratio] can also be used. The filling rate of the metal oxide target is 90% to 100% inclusive, and preferably 95% to 99.9% inclusive. The use of the metal oxide target having a high filling rate makes it possible to form a dense oxide semiconductor film.

The substrate is held inside a treatment chamber which is kept in a reduced pressure state, and the substrate is heated to a temperature higher than or equal to room temperature and lower than 400° C. Residual moisture in the treatment chamber is removed, and a sputtering gas from which hydrogen and moisture are removed is introduced. A metal oxide is used as a target. Thus, the oxide semiconductor film 120 is formed over the substrate 100. In order to remove residual moisture from the treatment chamber, an adsorption-type vacuum pump is preferably used. For example, a cryopump, an ion pump, or a titanium sublimation pump is preferably used. As an exhaustion unit, a turbo molecular pump to which a cold trap is added may be used. In the chamber in which exhaustion is performed with the use of a cryopump, a hydrogen atom, a compound including a hydrogen atom such as $H_2O$, a compound including a carbon atom, or the like, for example, is exhausted. Accordingly, the concentration of an impurity included in the oxide semiconductor film formed in the film formation chamber can be reduced.

As an example of film formation conditions, the following conditions are employed: the distance between the substrate and the target is 100 mm, the pressure is 0.6 Pa, the direct current (DC) power supply is 0.5 kW, and an oxygen atmosphere (the proportion of oxygen in the oxygen flow is 100%) is used. A pulse direct current (DC) power supply is preferable because powder substances (also referred to as particles or dust) generated in the film formation can be reduced and the film thickness can be made uniform. The oxide semiconductor film preferably has a thickness of 5 nm to 30 nm inclusive. Note that appropriate thickness of the oxide semiconductor film varies depending on the material; therefore, the thickness may be determined as appropriate depending on the material.

Note that it is preferable that impurities such as water, hydrogen, and the like be not contained in the sputtering gas such as oxygen, nitrogen, or a rare gas such as helium, neon and argon introduced when the oxide semiconductor film is formed. It is for example preferable that the purity of oxygen, nitrogen or a rare gas such as helium, neon and argon used as the sputtering gas be 6N (99.9999%) or higher, preferably, 7N (99.99999%) or higher (that is, the impurity concentrations is 1 ppm or lower, preferably, 0.1 ppm or lower).

In the above-described manner, the oxide semiconductor film 120 is formed by a sputtering method, whereby an oxide semiconductor film whose quantified concentration of hydrogen is suppressed to $2 \times 10^{19}$ $cm^{-3}$ or less, preferably $5 \times 10^{18}$ $cm^{-3}$ or less when measured by secondary ion mass spectrometry (SIMS) can be obtained.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case of forming an insulating film, and a DC sputtering method is mainly used in the case of forming a metal film.

In addition, there is also a multi-source sputtering apparatus in which a plurality of targets of different materials can be set. With the multi-source sputtering apparatus, films of different materials can be deposited to be stacked in one chamber, and films of plural kinds of materials can be deposited by electric discharge at the same time in one chamber.

In addition, there are also a sputtering apparatus provided with a magnet system inside the chamber and used for a magnetron sputtering method, and a sputtering apparatus used for an ECR (Electron Cyclotron Resonance) sputtering method in which plasma generated with the use of microwaves is used without using glow discharge.

In addition, as a film formation method using a sputtering method, there are also a reactive sputtering method in which a target substance and a sputtering gas component are chemically reacted with each other during film formation to form a thin film of a compound thereof, and a bias sputtering method in which voltage is also applied to a substrate during film formation.

Figure 1B:
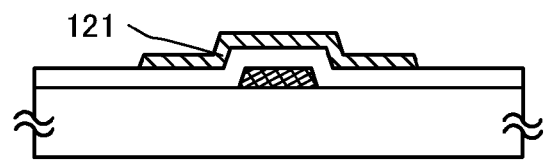

Next, the oxide semiconductor film is processed into an island-shaped oxide semiconductor layer 121 in a second photolithography step (see FIG. 1B). Note that the resist mask for forming the island-shaped oxide semiconductor layer 121 may be formed by an ink-jet method. When the resist mask is formed by an ink-jet method, a photomask is not used; thus, the manufacturing cost can be reduced.

In the case of forming a contact hole in the gate insulating layer 102, the step can be performed at the time of formation of the oxide semiconductor layer 121.

For the etching of the oxide semiconductor film 120, wet etching, dry etching, or both of them may be employed.

As the etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the layer into a desired shape, the etching conditions (the amount of electric power applied to a coil-shaped electrode, the amount of electric power applied to an electrode on a substrate side, the temperature of the electrode on the substrate side, or the like) are adjusted as appropriate.

As an etchant used for wet etching, a solution obtained by mixing phosphoric acid, acetic acid, and nitric acid, or the like can be used. In addition, ITO07N (produced by KANTO CHEMICAL CO., INC.) may also be used.

After the wet etching, the etchant is removed by cleaning together with the material which is etched off. Waste liquid of the etchant containing the removed material may be purified and the material contained in the waste liquid may be reused. When a material such as indium included in the oxide semiconductor layer is collected from the waste liquid after the etching and reused, the resources can be efficiently used and the cost can be reduced.

The etching conditions (such as an etchant, etching time, or temperature) are appropriately adjusted depending on the material so that the material can be etched into a desired shape.

It is preferable that the reverse sputtering be performed before formation of a conductive film in the next step, in order to remove resist residue or the like attached on surfaces of the oxide semiconductor layer 121 and the gate insulating layer 102.

Next, a conductive film is formed over the gate insulating layer 102 and the oxide semiconductor layer 121. The conductive film may be formed by a sputtering method or a vacuum evaporation method. As a material of the conductive film, an element selected from Al, Cr, Cu, Ta, Ti, Mo, or W; an alloy containing any of these elements as a component;

an alloy film containing any of these elements in combination; and the like can be given. One or more materials selected from manganese, magnesium, zirconium, and beryllium may be used. The metal conductive film may have a single-layer structure or a stacked-layer structure of two or more layers. For example, a single-layer structure of an aluminum film containing silicon; a two-layer structure of an aluminum film and a titanium film stacked thereover; a three-layer structure of a Ti film, an aluminum film stacked thereover, and a Ti film stacked thereover; and the like can be given. Alternatively, an alloy film containing aluminum and one or more elements selected from titanium (Ti), tantalum (Ta), tungsten (W), molybdenum (Mo), chromium (Cr), neodymium (Nd), or scandium (Sc), or a nitride film containing one or more of these elements may be used.

A resist mask is formed over the conductive film by a third photolithography step. The resist mask is selectively etched, so that a source electrode layer 115a and a drain electrode layer 115b are formed. Then, the resist mask is removed (see FIG. 1C).

Note that each material and etching conditions are adjusted as appropriate so that the oxide semiconductor layer 121 is not removed by etching of the conductive film. In this embodiment, a Ti film is used as the conductive film, an In—Ga—Zn—O-based oxide is used for the oxide semiconductor layer 121, and an ammonium hydroxide/hydrogen peroxide mixture (a 31 wt % hydrogen peroxide solution:28 wt % ammonia water:water=5:2:2) is used as an etchant to etch the conductive film of Ti.

Note that in the third photolithography step, the oxide semiconductor layer 121 may be partly etched in some cases, so that an oxide semiconductor layer having a groove (a depression portion) is formed. A resist mask for forming the source electrode layer 115a and the drain electrode layer 115b may be formed by an ink-jet method. When the resist mask is formed by an ink-jet method, a photomask is not used; thus, the manufacturing cost can be reduced.

In order to reduce the number of photomasks and steps in a photolithography step, etching may be performed with the use of a resist mask formed using a multi-tone mask which is a light-exposure mask through which light is transmitted so as to have a plurality of intensities. Since a resist mask formed using a multi-tone mask has a plurality of thicknesses and can be further changed in shape by performing etching, the resist mask can be used in a plurality of etching steps to provide different patterns. Therefore, a resist mask corresponding to at least two kinds of different patterns can be formed by using one multi-tone mask. Thus, the number of light-exposure masks can be reduced and the number of corresponding photolithography steps can also be reduced, whereby simplification of a process can be realized.

Plasma treatment using a gas such as $N_2O$, $N_2$, or Ar may be performed to remove water or the like adsorbed on a surface of the oxide semiconductor layer which is exposed. Plasma treatment may be performed using a mixed gas of oxygen and argon.

After the plasma treatment, a silicon oxide layer 116 is formed as an oxide insulating layer which serves as a protective insulating film in contact with part of the oxide semiconductor layer, without exposure to the air. In this embodiment, the silicon oxide layer 116 is formed in contact with the oxide semiconductor layer 121 in a region where the oxide semiconductor layer 121 is overlapped with neither the source electrode layer 115a nor the drain electrode layer 115b.

As the silicon oxide layer 116, a silicon oxide layer including defects is formed in the following manner: the substrate 100 over which the island-shaped oxide semiconductor layer 121, the source electrode layer 115a, and the drain electrode layer 115b are formed is heated at a temperature comprised between room temperature and a temperature lower than 100° C.; a sputtering gas containing high-purity oxygen from which hydrogen and moisture are removed is introduced; and a silicon semiconductor target is used. Note that the silicon oxide layer 116 is formed to be a silicon oxide ($SiO_x$, x is preferably 2 or larger) layer.

For example, a silicon oxide film is formed by a pulsed DC sputtering method, in which a silicon target doped with boron and having a purity of 6N (99.9999%) (resistivity: 0.01 Ωcm) is used, the distance between the target and the substrate (T-S distance) is 89 mm, the pressure is 0.4 Pa, the direct current (DC) power supply is 6 kW, and an oxygen atmosphere (the proportion of oxygen in the oxygen flow is 100%) is used. The thickness of the silicon oxide film is 300 nm. Instead of the silicon target, quartz (preferably, synthetic quartz) can be used as the target for forming the silicon oxide film. As the sputtering gas, oxygen or a mixed gas of oxygen and argon is used.

Note that it is preferable that impurities such as water, hydrogen, and the like be not contained in the sputtering gas introduced when the silicon oxide layer is formed. It is for example preferable that the purity of the oxygen gas be 6N (99.9999%) or higher, preferably, 7N (99.99999%) or higher (that is, the impurity concentrations is 1 ppm or lower, preferably, 0.1 ppm or lower).

In this case, it is preferable that residual moisture be removed from the treatment chamber in the formation of the silicon oxide layer 116, for the purpose of preventing hydrogen, hydroxyl, or moisture from being contained in the oxide semiconductor layer 121 and the silicon oxide layer 116.

Instead of the silicon oxide layer, a silicon oxynitride layer, an aluminum oxide layer, an aluminum oxynitride layer, or the like can be used.

Next, heat treatment is performed at a temperature comprised between 100° C. and 400° C. in the state where the silicon oxide layer 116 including defects is in contact with the oxide semiconductor layer 121. This heat treatment can diffuse hydrogen or moisture included in the oxide semiconductor layer 121 into the silicon oxide layer 116 including defects. Since the silicon oxide layer 116 includes many defects (dangling bonds), an impurity such as hydrogen, hydroxyl, or moisture included in the island-shaped oxide semiconductor layer 121 is diffused into the silicon oxide layer 116 through the interface at which the oxide semiconductor layer 121 and the silicon oxide layer 116 are in contact with each other. Specifically, a hydrogen atom, a compound including a hydrogen atom such as $H_2O$, a compound including a carbon atom, or the like included in the oxide semiconductor layer 121 can be easily diffused into the silicon oxide layer 116.

Concerning the diffusion of hydrogen from the oxide semiconductor layer into the silicon oxide layer, it was calculated in which of the following layers a hydrogen atom is more likely to be present: the oxide semiconductor layer (amorphous IGZO) or the silicon oxide layer (amorphous $SiO_x$).

A binding energy of a hydrogen atom E_bind was defined as follows, so that stability of the hydrogen atom in an environment was evaluated.

$$E\_bind = \{E(\text{original structure}) + E(H)\} - E(\text{structure with } H)$$

The larger this binding energy E_bind becomes, the more likely the hydrogen atom is to be present. E(original structure), E(H), and E(structure with H) respectively represent energy of the original structure, energy of the hydrogen atom, and energy of the structure with H. The binding energy of four samples was calculated: amorphous IGZO, amorphous $SiO_2$ without dangling bonds (hereinafter abbreviated to DB), and two kinds of amorphous SiOx with DB.

For calculation, CASTEP, which is a calculation program for a density functional theory, was used. As a method for the density functional theory, a plan wave basis pseudopotential method was used. As a functional, LDA was used. Cut-off energy was set at 300 eV. K-point was set to be a grid of 2×2×2.

The calculated structures are described below. First, the original structure is described. A unit cell of amorphous IGZO includes 84 atoms in total: 12 In atoms, 12 Ga atoms, 12 Zn atoms, and 48 O atoms. A unit cell of amorphous $SiO_2$ without DB includes 48 atoms in total: 16 Si atoms and 32 O atoms. Amorphous SiOx with DB (1) has such a structure that an O atom is removed from the amorphous $SiO_2$ without DB and one atom of Si which has been bonded to the O atom is bonded to H; that is, it includes 48 atoms in total: 16 Si atoms, 31 O atoms, and 1 H atom. Amorphous SiOx with DB (2) has such a structure that Si is removed from the amorphous $SiO_2$ without DB and three atoms of O which have been bonded to the Si are each bonded to H; that is, it includes 50 atoms in total: 15 Si atoms, 32 O atoms, and 3 H atoms. The structure with H is a structure in which H was attached to each of the above four structures. Note that H was attached to an O atom in the amorphous IGZO, a Si atom in the amorphous $SiO_2$ without DB, and an atom that has DB in the amorphous SiOx with DB. The structure in which H was calculated includes 1 H atom in a unit cell. Note that the cell size of each structure is shown in Table 1.

TABLE 1

| Structure | Cell size (nm)<br>Angle |
|---|---|
| Amorphous IGZO | 1.0197 × 1.0197 × 1.0197<br>α = β = γ = 90° |
| Amorphous SiO2 without DB<br>Amorphous SiOx with DB (1)<br>Amorphous SiOx with DB (2) | 0.9127 × 0.9127 × 0.9127<br>α = β = γ = 90° |
| Hydrogen atom | 1.0000 × 1.0000 × 1.0000<br>α = β = γ = 90° |

Calculation results are shown in Table 2.

TABLE 2

| | Energy of a structure to which H has been added (eV) | Energy of the original structure (eV) | Energy of H atom (eV) | Binding energy (eV) |
|---|---|---|---|---|
| Amorphous IGZO | −84951.3359 | −84935.6442 | −13.0015 | 2.69 |
| Amorphous SiO2 without DB | −15783.8101 | −15770.6279 | −13.0015 | 0.18 |
| Amorphous SiOx with DB (1) | −15363.1459 | −15345.6884 | −13.0015 | 4.46 |
| Amorphous SiOx with DB (2) | −15722.2053 | −15702.5905 | −13.0015 | 6.61 |

From the above, amorphous SiOx with DB (2) having a structure in which Si is removed from the amorphous $SiO_2$ without DB and three atoms of O which have been bonded to the Si are each bonded to H has the maximum binding energy, followed by SiOx (1) having a structure in which an O atom is removed from the amorphous $SiO_2$ without DB and one atom of Si which has been bonded to the O atom is bonded to H, amorphous IGZO, and amorphous $SiO_2$ without DB having the minimum binding energy. Therefore, hydrogen becomes the most stable when being bonded to DB in amorphous SiOx.

As a result, the following process can be assumed. There is a large amount of DB in amorphous SiOx. A hydrogen atom diffusing at the interface between amorphous IGZO and amorphous SiOx becomes stable by being bonded to the DB in the amorphous SiOx. Thus, the hydrogen atom in the amorphous IGZO moves to the DB in the amorphous SiOx.

From the fact that the amorphous SiOx with DB (2) having the structure in which dangling bonds are formed by removal of Si has a higher binding energy than the SiOx with DB (1) having the structure in which dangling bonds are formed by removal of O, a hydrogen atom is more stable in SiOx when being bonded to O. Accordingly, x of SiOx is preferably greater than or equal to 2.

If the silicon oxide layer including defects is a silicon oxide layer including many oxygen dangling bonds as defects, the binding energy with respect to hydrogen is high; accordingly, more hydrogen or more impurity including hydrogen can be diffused from the oxide semiconductor layer into the silicon oxide layer including defects. Therefore, x in $SiO_x$ is preferably larger than or equal to 2.

Figure 1C:
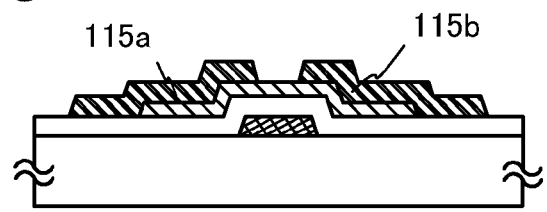
Figure 1D:
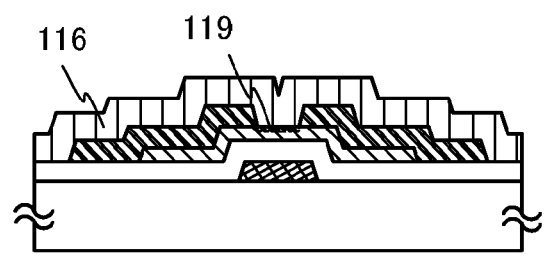

When the silicon oxide layer 116 is formed in contact with the oxide semiconductor layer 121, a mixed region 119 including an oxide semiconductor and silicon oxide is formed at an interface between the oxide semiconductor layer and the silicon oxide layer (see FIG. 1D).

The mixed region 119 includes oxygen, silicon, and at least one kind of metal element that is included in the oxide semiconductor. For example, in the case of using an In—Ga—Zn—O-based oxide as the oxide semiconductor, the mixed region includes silicon, oxygen, and at least one kind of metal element among In, Ga, and Zn. Assuming that the metal included in the oxide semiconductor in the mixed region is M, M can exist in a variety of states such as M-OH, M-H, M-O—Si—H, and M-O—Si—OH. As specific examples, Zn—H, Zn—OH, and the like can be given.

The thickness of the mixed region is comprised of 1 nm and 10 nm, preferably between 2 nm and 5 nm The thickness of the mixed region can be controlled by the film formation conditions of the sputtering method at the time of forming the silicon oxide layer. If the power supply is set higher and the distance between the substrate and the target is set shorter in the sputtering method, the mixed region can be formed thicker. When the sputtering method is conducted with higher power supply, water adsorbed on a surface of the oxide semiconductor layer or the like can be removed.

Provision of the mixed region 119 between the oxide semiconductor layer 121 and the silicon oxide layer 116 promotes diffusion of the hydrogen atom, the compound including a hydrogen atom such as $H_2O$, the compound including a carbon atom, or the like included in the oxide semiconductor layer 121 into the silicon oxide layer 116; thus, movement thereof becomes easier.

Figure 1E:
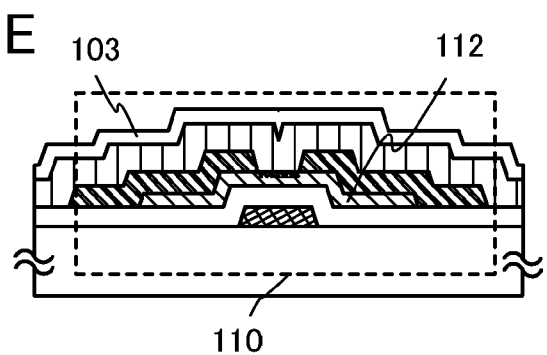

Through the above-described process, the thin film transistor 110 including the oxide semiconductor layer 112 in which the concentration of hydrogen or hydride is reduced can be formed (see FIG. 1E).

When residual moisture in the reaction atmosphere is removed at the time of the above-described formation of the oxide semiconductor film, the concentration of hydrogen or hydride in the oxide semiconductor film can be reduced. Accordingly, the oxide semiconductor film can be stabilized.

A protective insulating layer may be provided over the oxide insulating layer. In this embodiment, a protective insulating layer 103 is formed over the silicon oxide layer 116. As the protective insulating layer 103, a silicon nitride film, a silicon nitride oxide film, an aluminum nitride film, or the like can be used.

As the protective insulating layer 103, a silicon nitride film can be formed by heating the substrate 100 over which layers up to the silicon oxide layer 116 are formed, to a temperature comprised between 100° C. and 400° C., introducing a sputtering gas containing high-purity nitrogen from which hydrogen and moisture are removed, and using a target of silicon semiconductor. In this case also, it is preferable that residual moisture be removed from the treatment chamber in the formation of the protective insulating layer 103 in a manner similar to that of the silicon oxide layer 116.

Note that it is preferable that impurities such as water, hydrogen, and the like be not contained in the sputtering gas introduced when the silicon nitride film is formed. It is for example preferable that the purity of the nitrogen gas be 6N (99.9999%) or higher, preferably, 7N (99.99999%) or higher (that is, the impurity concentrations is 1 ppm or lower, preferably, 0.1 ppm or lower).

In the case of forming the protective insulating layer 103, the substrate 100 is heated to a temperature comprised between 100° C. and 400° C. at the time of formation of the protective insulating layer 103, whereby hydrogen or moisture included in the oxide semiconductor layer can be diffused into the oxide insulating layer (the silicon oxide film including defects). In such a case, heat treatment after the formation of the silicon oxide layer 116 is unnecessary.

In the case where the silicon oxide layer 116 and a silicon nitride layer as the protective insulating layer 103 are stacked, the silicon oxide layer and the silicon nitride layer can be formed in the same treatment chamber using a common silicon target. First, a sputtering gas containing oxygen is introduced and a silicon oxide layer is formed using a silicon target placed inside the treatment chamber, and then the sputtering gas is switched to a sputtering gas containing nitrogen and a silicon nitride layer is formed using the same silicon target. Since the silicon oxide layer and the silicon nitride layer can be formed in succession without exposure to the air, an impurity such as hydrogen or moisture can be prevented from being adsorbed on a surface of the silicon oxide layer. In this case, after the silicon oxide layer 116 and the silicon nitride layer as the protective insulating layer 103 are stacked, heat treatment (at a temperature comprised between 100° C. and 400° C.) for diffusing hydrogen or moisture included in the oxide semiconductor layer into the oxide insulating layer (the silicon oxide film including defects) may be performed.

Note that it is preferable that impurities such as water, hydrogen, and the like be not contained in the sputtering gas introduced when the silicon oxide layer or the silicon nitride layer are formed. It is for example preferable that the purity of the oxygen gas or the nitrogen gas be 6N (99.9999%) or higher, preferably, 7N (99.99999%) or higher (that is, the impurity concentrations is 1 ppm or lower, preferably, 0.1 ppm or lower).

After the formation of the protective insulating layer, heat treatment may be further performed at a temperature comprised between 100° C. and 200° C. inclusive in the air for 1 hour to 30 hours inclusive. This heat treatment may be performed at a fixed heating temperature. Alternatively, the following change in the heating temperature may be conducted plural times repeatedly: the heating temperature is increased from room temperature to a temperature comprised between 100° C. and 200° C. and then decreased to room temperature. Further, this heat treatment may be performed before formation of the oxide insulating film under a reduced pressure. Under the reduced pressure, the heat treatment time can be shortened. With this heat treatment, a normally-off thin film transistor can be obtained. Therefore, reliability of the semiconductor device can be improved.

When the silicon nitride layer is formed over the silicon oxide layer including defects under the state of heating the substrate, hydrogen or moisture can be diffused from the oxide semiconductor film to the silicon oxide film, and at the same time, the barrier film which prevents entry of moisture from the outside air can be provided.

When residual moisture in the reaction atmosphere is removed at the time of the formation of the oxide semiconductor layer, in which a channel formation region is to be formed over the gate insulating layer, the concentration of hydrogen or hydride in the oxide semiconductor layer can be reduced. Further, when the silicon oxide layer including defects is provided so as to be in contact with the oxide semiconductor layer, hydrogen or moisture in the oxide semiconductor layer can be diffused into the silicon oxide film and the concentration of hydrogen or a hydrogen compound in the oxide semiconductor layer can be reduced.

The above-described process can be used for manufacturing a backplane (a substrate over which a thin film transistor is formed) of a liquid crystal display panel, an electroluminescent display panel, a display device using electronic ink, or the like. Since the above-described process is performed at a temperature lower than or equal to 400° C., the process can be applied to a manufacturing process using a glass substrate having a side longer than or equal to 1 meter and a thickness less than or equal to 1 millimeter. Since the whole process can be performed at a treatment temperature of 400° C. or lower, a display panel can be manufactured without consuming too much energy.

Figure 3:
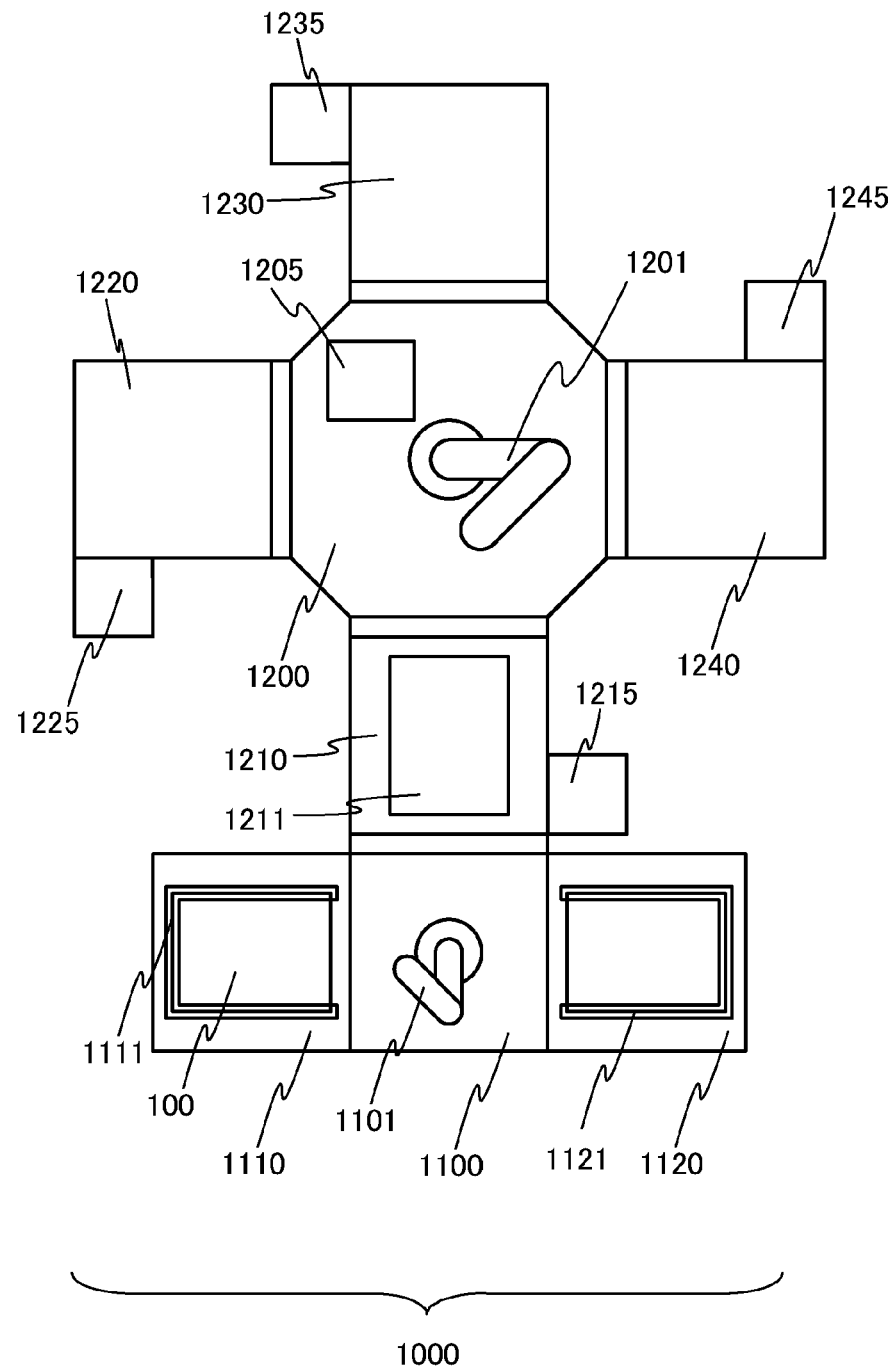
FIG. 3 illustrates an example of a film formation apparatus.

FIG. 3 illustrates an example of a film formation apparatus 1000 that can be used for forming an oxide semiconductor film and for manufacturing a semiconductor device in which an oxide semiconductor film is used.

The film formation apparatus 1000 includes a loading chamber 1110 and an unloading chamber 1120. The loading chamber 1110 and the unloading chamber 1120 are respectively provided with a cassette 1111 which stores a substrate before being treated and a cassette 1121 which stores the treated substrate. A first transfer chamber 1100 is provided between the loading chamber 1110 and the unloading chamber 1120, and is provided with a transfer unit 1101 which transfers a substrate.

In addition, the film formation apparatus 1000 includes a second transfer chamber 1200. The second transfer chamber 1200 is provided with a transfer unit 1201 and connected to four surrounding treatment chambers (a first treatment chamber 1210, a second treatment chamber 1220, a third treatment chamber 1230, and a fourth treatment chamber 1240) through gate valves. Note that one side of the first treatment chamber 1210 is connected to the first transfer chamber 1100 through a gate valve, and the other side of the first treatment chamber 1210 is connected to the second transfer chamber 1200 through a gate valve.

The second transfer chamber 1200, the first treatment chamber 1210, the second treatment chamber 1220, the third treatment chamber 1230, and the fourth treatment chamber 1240 are respectively provided with an exhaustion unit 1205, an exhaustion unit 1215, an exhaustion unit 1225, an exhaustion unit 1235, and an exhaustion unit 1245. Although the exhaustion unit may be selected in accordance with the use application of each treatment chamber, an exhaustion unit such as a cryopump is particularly preferable. Alternatively, a turbo molecular pump provided with a cold trap may be used.

In the case where the oxide semiconductor film is formed, an exhaustion unit such as a cryopump is preferably used in order to prevent impurities of moisture left in the treatment chamber from being mixed in steps before and after formation of films in contact with the oxide semiconductor film and steps before and after formation of the oxide semiconductor film, and needless to say, in the treatment chamber for forming the oxide semiconductor film.

A substrate heating unit 1211 is provided in the first treatment chamber 1210. The first treatment chamber 1210 serves as a delivery chamber for transferring a substrate from the first transfer chamber 1100 in an atmospheric pressure state into the second transfer chamber 1200 in a reduced pressure state. By provision of the delivery chamber, the second transfer chamber 1200 can be prevented from being contaminated by air.

The second treatment chamber 1220, the third treatment chamber 1230, and the fourth treatment chamber 1240 are provided with a structure for forming a silicon nitride film using a sputtering method, a structure for forming a silicon oxide film using a sputtering method, and a structure for forming an oxide semiconductor film using a sputtering method, respectively. In other words, each of the treatment chambers is provided with a target and a substrate heating unit, and a gas supply unit with which a sputtering gas is introduced and a glow discharge generation unit are added to each of the chamber.

An operation example of the film formation apparatus 1000 will be described. Here, a method for successively forming a gate insulating layer and an oxide semiconductor layer over a substrate over which the gate electrode layer 101 is formed, as illustrated in FIG. 1A will be described.

The transfer unit 1101 transfers the substrate 100, over which the gate electrode 101 is formed, from the cassette 1111 to the first treatment chamber 1210. Then, the gate valve is closed and the substrate 100 is preheated in the first treatment chamber 1210 to eliminate an impurity adsorbed on the substrate and exhaustion is performed. The impurity, for example, includes a hydrogen atom, a compound including a hydrogen atom such as $H_2O$, a compound including a carbon atom, or the like.

Next, the substrate 100 is transferred to the second treatment chamber 1220, and a silicon nitride film is formed. Then, the substrate 100 is transferred to the third treatment chamber 1230, and a silicon oxide film is formed. Thus, the gate insulating layer 102 is formed. It is preferable that exhaustion be performed in the second treatment chamber 1220 and the third treatment chamber 1230 using a cryopump or the like so that the impurity concentration in the film formation chambers is reduced. The silicon nitride film and the silicon oxide film that are stacked in the treatment chambers in which the impurity is reduced are used as the gate insulating layer 102 in which hydrogen, hydroxyl, moisture, or the like contained is suppressed.

Then, the substrate 100 is transferred to the fourth treatment chamber 1240. The fourth treatment chamber 1240 is provided with a target for an oxide semiconductor and includes a cryopump as an exhaustion unit. In the fourth treatment chamber 1240, an oxide semiconductor layer is formed.

Figure 2:
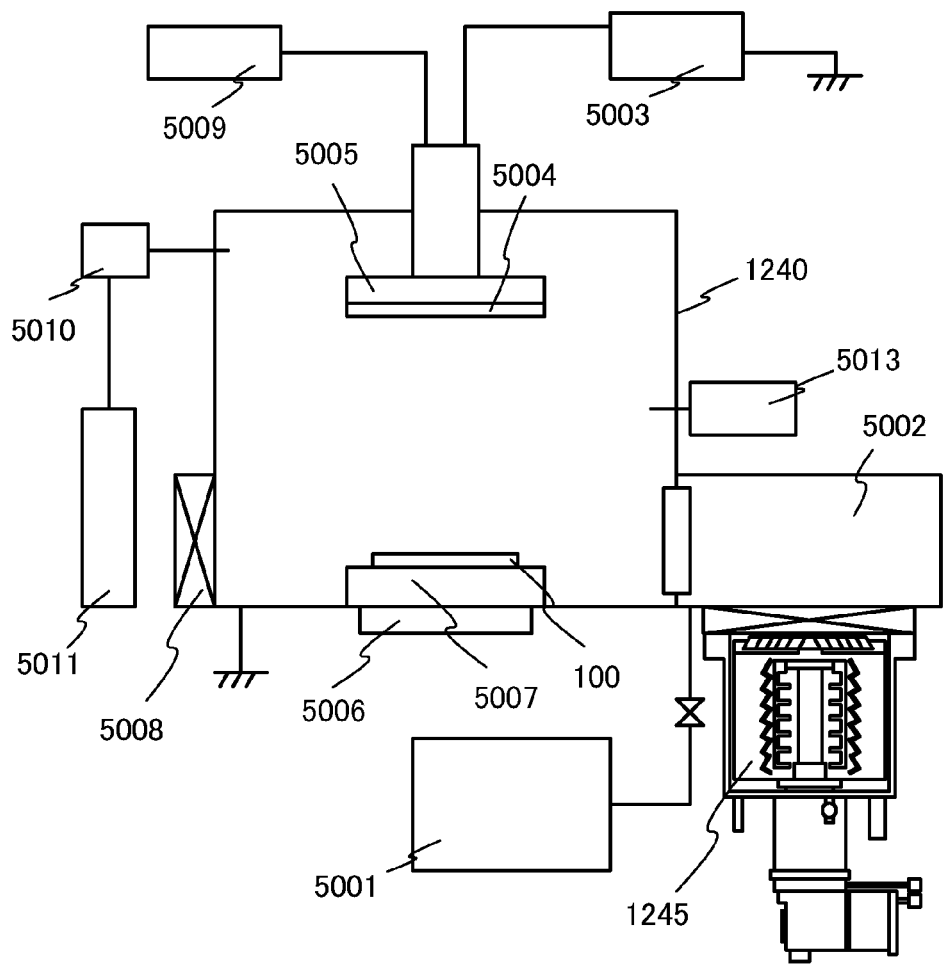
FIG. 2 illustrates an example of a film formation apparatus.

A method for forming the oxide semiconductor film 120 in the fourth treatment chamber 1240 will be described with reference to FIG. 2. As illustrated in FIG. 2, the fourth treatment chamber 1240 is connected to the exhaustion unit 1245 through an exhaustion chamber 5002 with the use of a main valve. The fourth treatment chamber 1240 is equipped with a power supply 5003, a dry pump 5001, a cathode 5005, a stage elevator 5006, a substrate stage 5007, a gate valve 5008, cooling water 5009, a flow rate controller 5010, and a gas tank 5011. The substrate 100 is held over the substrate stage 5007, and a target 5004 for an oxide semiconductor is placed on the cathode 5005 side.

First, exhaustion in the fourth treatment chamber 1240 is performed using the dry pump 5001 through the exhaustion chamber 5002, so that the pressure inside the fourth treatment chamber 1240 is reduced. Then, the air is exhausted with the exhaustion unit 1245 which is a cryopump, so that an impurity such as hydrogen, moisture, hydride, or a hydrogen compound inside the fourth treatment chamber 1240 is exhausted. Instead of the cryopump, a turbo molecular pump may be used; in that case, a cold trap for adsorbing moisture or the like may be provided above an inlet of the turbo molecular pump.

The substrate 100, over which layers up to the gate insulating layer 102 are formed, is transferred to the fourth treatment chamber 1240 through the gate valve 5008 and held over the substrate stage 5007. A sputtering gas is introduced from the gas tank 5011 into the fourth treatment chamber 1240 with the flow rate controlled by the flow rate controller 5010, voltage is applied to the cathode 5005 by the power supply 5003 so that plasma is generated, and the target 5004 is used; thus, the oxide semiconductor film 120 is formed over the substrate 100.

Although the fourth treatment chamber has been described as an example with reference to FIG. 2, the method of FIG. 2 can be applied to any treatment chamber of the film formation apparatus in this specification as appropriate.

Since residual moisture is removed from the fourth treatment chamber 1240 with the use of a cryopump, the hydrogen concentration in the oxide semiconductor film 120 can be reduced. In addition, the substrate is heated during the formation of the oxide semiconductor film 120. By film formation using a sputtering method under the state where residual moisture left in the treatment chamber is removed with a cryopump, the substrate temperature at the time of forming the oxide semiconductor film 120 can range from room temperature to 400° C. inclusive.

In the above-described manner, the gate insulating layer 102 and the oxide semiconductor film 120 can be successively formed in the film formation apparatus 1000. Note that although the structure in which three or more treatment chambers are connected through the transfer chamber is illustrated in FIG. 3, the present invention is not limited thereto. For example, a so-called in-line structure, in which a carry-in entrance and a carry-out exit for a substrate are provided for each treatment chamber and the treatment chambers are connected in series, may be employed.

Figure 4:
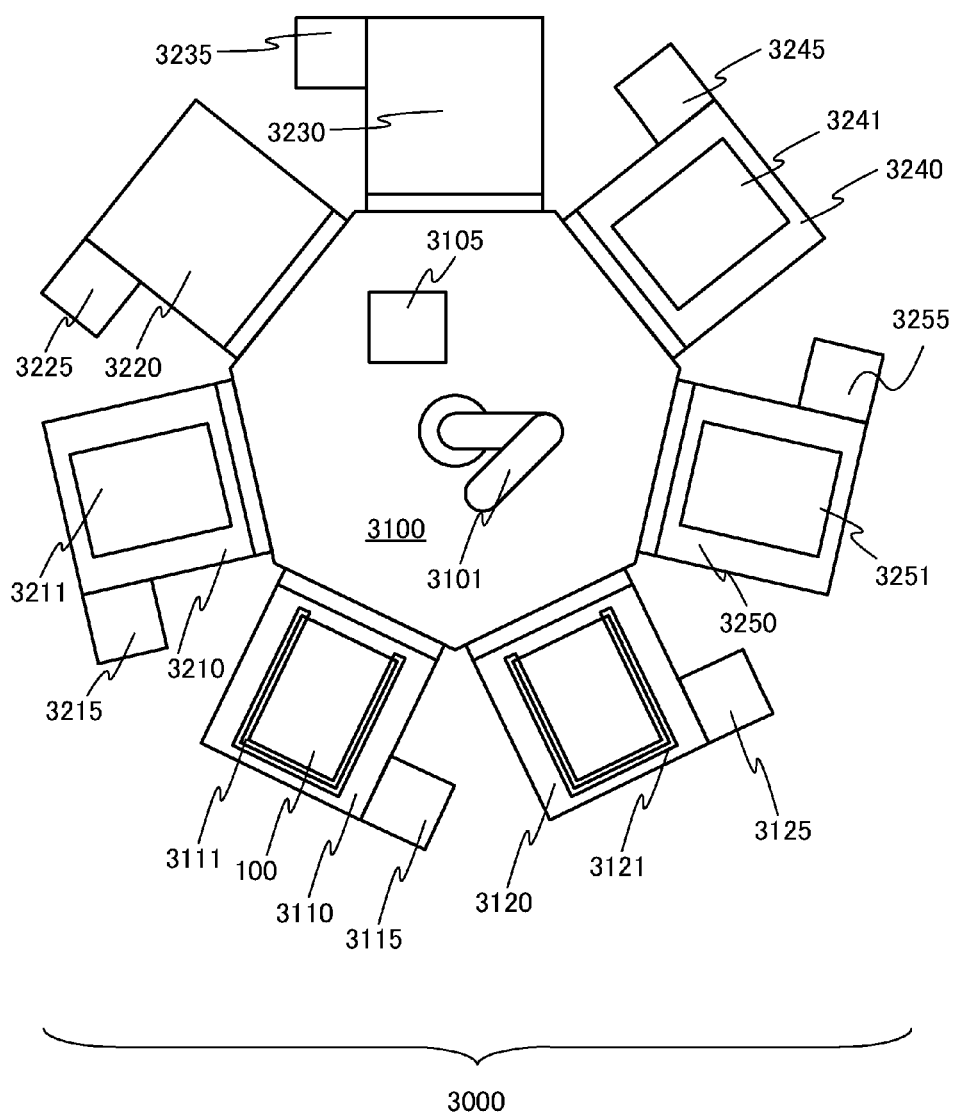
FIG. 4 illustrates an example of a film formation apparatus.

FIG. 4 illustrates an example of a film formation apparatus 3000 for forming the silicon oxide layer 116 and the protective insulating layer 103 over the island-shaped oxide semiconductor layer 121 as illustrated in FIG. 1C.

The film formation apparatus 3000 includes a loading chamber 3110 and an unloading chamber 3120, which are provided with a cassette 3111 for storing a substrate before being treated and a cassette 3121 for storing the treated substrate, respectively.

In addition, the film formation apparatus 3000 includes a first transfer chamber 3100. The first transfer chamber 3100 is provided with a transfer unit 3101 and connected to five surrounding chambers (a first treatment chamber 3210, a second treatment chamber 3220, a third treatment chamber 3230, a fourth treatment chamber 3240, and a fifth treatment chamber 3250), each through a gate valve.

The loading chamber 3110, the unloading chamber 3120, the first transfer chamber 3100, the first treatment chamber 3210, the second treatment chamber 3220, the third treatment chamber 3230, the fourth treatment chamber 3240, and the fifth treatment chamber 3250 are provided with an exhaustion unit 3115, an exhaustion unit 3125, an exhaustion unit 3105, an exhaustion unit 3215, an exhaustion unit 3225, an exhaustion unit 3235, an exhaustion unit 3245, and an exhaustion unit 3255 respectively, whereby a reduced pressure state can be realized. Although the exhaustion unit may be selected in accordance with the use application of each treatment chamber, an exhaustion unit such as a cryopump is particularly preferable. Alternatively, a turbo molecular pump provided with a cold trap may be used.

The loading chamber 3110 and the unloading chamber 3120 each serve as a delivery chamber for transferring a substrate to or from the first transfer chamber 3100. By provision of the delivery chamber, the first transfer chamber 3100 can be prevented from being contaminated by air.

The first treatment chamber 3210 and the fourth treatment chamber 3240 are provided with a substrate heating unit 3211 and a substrate heating unit 3241, respectively. The second treatment chamber 3220 and the third treatment chamber 3230 are provided with a structure for forming a silicon oxide film using a sputtering method and a structure for forming a silicon nitride film using a sputtering method, respectively. In other words, each of the treatment chambers is provided with a target and a substrate heating unit, and a gas supply unit with which a sputtering gas is introduced and a glow discharge generation unit are added to each of the chamber. In addition, the fifth treatment chamber 3250 is provided with a cooling unit 3251.

An operation example of the film formation apparatus 3000 will be described. Here, a method for forming the silicon oxide layer 116 and the protective insulating layer 103 over the island-shaped oxide semiconductor layer 121 illustrated in FIG. 1C will be described.

First, the air is exhausted from the loading chamber 3110, and after the pressure in the loading chamber 3110 become substantially equal to that in the first transfer chamber 3100, the gate valve is opened and the substrate 100 is transferred from the loading chamber 3110 to the first treatment chamber 3210 through the first transfer chamber 3100.

Next, an impurity adsorbed on the substrate is preferably eliminated by preheating the substrate 100 with the substrate heating unit 3211 of the first treatment chamber 3210, and it is preferable to perform exhaustion as well. Examples of the impurity are a hydrogen atom, a compound including a hydrogen atom such as $H_2O$, a compound including a carbon atom, and the like. The preheat temperature ranges from 100° C. to 400° C. inclusive, and preferably ranges from 150° C. to 300° C. inclusive. As the exhaustion unit provided in the first treatment chamber 3210, a cryopump is preferable. Since the impurity adsorbed on the substrate 100 is eliminated by the preheating and spread in the first treatment chamber 3210, the impurity need to be exhausted from the first treatment chamber 3210 using a cryopump. Note that this preheating treatment can be omitted.

Then, the substrate 100 is transferred to the second treatment chamber 3220, and the silicon oxide layer 116 is formed. For example, a silicon oxide film is formed as the silicon oxide layer 116. Exhaustion is performed in the second treatment chamber 3220 using a cryopump or the like, so that the impurity concentration in the film formation chamber is reduced. The oxide insulating film formed in the treatment chamber in which the impurity is reduced has a reduced impurity concentration. Specifically, the concentration of hydrogen included in the oxide insulating film can be reduced. The silicon oxide layer 116 may be formed while the substrate 100 is heated, but it is desirable that the silicon oxide layer 116 be formed at a temperature ranging from 0° C. to 50° C. inclusive, preferably at room temperature, so as to include defects.

In the case of forming the silicon oxide film as the silicon oxide layer 116 by a sputtering method, a quartz target or a silicon target can be used as the target, and a silicon target is particularly preferable. A silicon oxide film formed by a sputtering method using a silicon target under an atmosphere of oxygen and a rare gas can include a dangling bond of a silicon atom or an oxygen atom. If the silicon oxide layer 116 including defects includes many oxygen dangling bonds as defects, the binding energy with respect to the impurity such as hydrogen, hydroxyl, or moisture is high; accordingly, a larger amount of hydrogen or impurity including hydrogen can be diffused from the oxide semiconductor layer 121 into the silicon oxide layer including defects.

When the silicon oxide layer 116 including many dangling bonds is provided in contact with the island-shaped oxide semiconductor layer 121, the impurity such as hydrogen, hydroxyl, or moisture included in the island-shaped oxide semiconductor layer 121 can be easily diffused into the silicon oxide layer 116 through the interface at which the island-shaped oxide semiconductor layer 121 and the silicon oxide layer 116 are in contact with each other. Specifically, a hydrogen atom or a compound including a hydrogen atom such as $H_2O$ included in the island-shaped oxide semiconductor layer 121 can more easily move to be diffused into the silicon oxide layer 116. As a result, the impurity concentration in the island-shaped oxide semiconductor layer 121 is reduced.

Next, the substrate 100 is transferred to the third treatment chamber 3230, and the protective insulating layer 103 is formed over the silicon oxide layer 116. The protective insulating layer 103 has at least a function of preventing diffusion of an impurity element and, for example, can be formed using a silicon nitride film, a silicon nitride oxide film, or the like. It is preferable that the impurity concentration in the film formation chamber be reduced by exhaustion in the third treatment chamber 3230 using a cryopump or the like.

The protective insulating layer 103 prevents diffusion and entry of an impurity from the outside of the thin film transistor 110. Examples of the impurity are hydrogen, a compound including a hydrogen atom such as $H_2O$, a compound including a carbon atom, and the like.

In the case of forming a silicon nitride film as the protective insulating layer 103 by a sputtering method, film formation is performed by reactive sputtering for example in the following manner: a silicon target is used and a mixed gas of nitrogen and argon is introduced into the third treatment chamber 3230. The film formation is performed with a substrate temperature set at a temperature higher than or equal to 100° C. and lower than or equal to 400° C., for example, at a temperature higher than or equal to 200° C. and lower than or equal to 350° C. When film formation is performed in the state where heating is performed, an impurity including a hydrogen atom such as hydrogen, hydroxyl, or moisture can be diffused into the silicon oxide layer 116, so that the concentration of the impurity in the island-shaped oxide semiconductor layer 121 can be reduced. In particular, the temperature range of 200° C. to 350° C. inclusive, in which diffusion of hydrogen atoms is promoted, is favorable.

In the case where the silicon oxide layer 116 and a silicon nitride layer as the protective insulating layer 103 are stacked, the silicon oxide layer and the silicon nitride layer can be formed in the same treatment chamber using a common silicon target. First, a sputtering gas containing oxygen is introduced and a silicon oxide layer is formed using a silicon target placed inside the treatment chamber, and then the sputtering gas is switched to a sputtering gas containing nitrogen and a silicon nitride layer is formed using the same silicon target. Since the silicon oxide layer and the silicon nitride layer can be formed in succession without exposure to the air, an impurity such as hydrogen or moisture can be prevented from being adsorbed on the surface of the silicon oxide layer. In this case, after the silicon oxide layer 116 and the silicon nitride layer as the protective insulating layer 103 are stacked, heat treatment (at a temperature comprised between 100° C. to 400° C.) for diffusing hydrogen or moisture included in the oxide semiconductor layer into the oxide insulating layer (the silicon oxide film including defects) may be performed.

Note that it is preferable that impurities such as water, hydrogen, and the like be not contained in the sputtering gas introduced when the silicon oxide layer or the silicon nitride layer are formed. It is for example preferable that the purity of the oxygen gas or the nitrogen gas be 6N (99.9999%) or higher, preferably, 7N (99.99999%) or higher (that is, the impurity concentrations is 1 ppm or lower, preferably, 0.1 ppm or lower).

In order that the impurity including a hydrogen atom such as hydrogen, hydroxyl, or moisture is diffused into the silicon oxide layer 116 and the concentration of the impurity in the island-shaped oxide semiconductor layer 121 is reduced, heat treatment may be performed after the film formation of the protective insulating layer 103.

For example, as illustrated in FIG. 4, the substrate 100 is transferred to the fourth treatment chamber 3240 and heat treatment after the film formation is performed. The substrate temperature in the heat treatment after the film formation is set at a temperature comprised between 100° C. and 400° C. inclusive. With the heat treatment, the impurity included in the oxide semiconductor layer can be diffused more easily into the silicon oxide layer 116 through the interface at which the island-shaped oxide semiconductor layer 121 and the silicon oxide layer 116 are in contact with each other. Specifically, a hydrogen atom or a compound including a hydrogen atom such as $H_2O$ included in the island-shaped oxide semiconductor layer 121 can more easily move to be diffused into the oxide insulating film. As a result, the impurity concentration in the oxide semiconductor layer is reduced.

After the heat treatment, the substrate 100 is transferred to the fifth treatment chamber 3250. The substrate is cooled from the substrate temperature T, which is the substrate temperature during the heat treatment after the film formation, to a temperature low enough not to cause reentry of an impurity such as water. Specifically, slow cooling is performed to a temperature that is lower than the heating temperature T by 100° C. or more. The cooling may be performed by introducing nitrogen, helium, neon, argon, or the like into the fifth treatment chamber 3250. Note that it is preferable that water, hydrogen, or the like be not included in nitrogen or a rare gas used for the cooling such as helium, neon, or argon. In addition, nitrogen or a rare gas such as helium, neon, or argon preferably has a purity of 6N (99.9999%) or higher, more preferably 7N (99.99999%) or higher (that is, the impurity concentration is 1 ppm or lower, preferably 0.1 ppm or lower).

With the film formation apparatus 3000 in which an exhaustion unit such as a cryopump is employed, levels of impurities in the treatment chamber can be reduced. Impurities attached to the inner wall of the treatment chamber are eliminated, and incorporation of impurities into a substrate during film formation and a film can be reduced. In addition, impurities which are eliminated from an atmosphere during preheating are exhausted, whereby the impurities can be prevented from being attached to the substrate again.

The silicon oxide layer 116 formed in this manner includes many dangling bonds. When the silicon oxide layer 116 is provided in contact with the island-shaped oxide semiconductor layer 121, the impurity included in the island-shaped oxide semiconductor layer 121, that is, a hydrogen atom or a compound including a hydrogen atom such as $H_2O$, moves to be diffused from the island-shaped oxide semiconductor layer 121 into the silicon oxide layer 116; accordingly, the concentration of impurity included in the island-shaped oxide semiconductor layer 121 can be reduced.

For example, in a thin film transistor in which an oxide semiconductor layer serving as a channel formation region is in contact with an oxide insulating layer formed with use of a film formation apparatus described in this embodiment, the carrier concentration in the channel formation region is reduced in the state where voltage is not applied to a gate electrode, i.e., in the off state; therefore, the thin film transistor has low off current and has favorable characteristics.

Note that although the structure in which three or more treatment chambers are connected through the transfer chamber is illustrated in FIG. 4, the present invention is not limited thereto. For example, a so-called in-line structure, in which a carry-in entrance and a carry-out exit for a substrate are provided for each treatment chamber and the treatment chambers are connected in series, may be employed.

The above-described process using the film formation apparatus can be used for manufacturing a backplane (a substrate over which a thin film transistor is formed) of a liquid crystal display panel, an electroluminescent display panel, a display device using electronic ink, or the like. Since the above-described process using the film formation apparatus is performed at a temperature lower than or equal to 400° C., the process can be applied to a manufacturing process using a glass substrate having a side more than or equal to 1 meter and a thickness less than or equal to 1 millimeter. Since the whole process can be performed at a treatment temperature of 400° C. or lower, a display panel can be manufactured without consuming too much energy.

In the above-described manner, a highly reliable semiconductor device with stable electric characteristics including a thin film transistor in which an oxide semiconductor layer is used can be provided.

Embodiment 2

In this embodiment, another example of a thin film transistor which can be applied to a semiconductor device disclosed in this specification will be described.

In this embodiment, an embodiment of a semiconductor device and a manufacturing method of the semiconductor device will be described with reference to FIGS. 5A to 5E.

FIGS. 5A to 5E illustrate an example of a cross-sectional structure of a semiconductor device. A thin film transistor 160 illustrated in FIGS. 5A to 5E has a bottom-gate structure called a channel-protective structure (also referred to as a channel-stop structure) and is also referred to as an inverted staggered thin film transistor.

Although the thin film transistor 160 is described using a single-gate thin film transistor; a multi-gate thin film transistor including a plurality of channel formation regions can be formed as necessary.

Hereinafter, a process for manufacturing the thin film transistor 160 over a substrate 150 is described with reference to FIGS. 5A to 5E.

First, a conductive film is formed over the substrate 150 having an insulating surface, and then, a gate electrode layer 151 is formed through a first photolithography step. Note that a resist mask may be formed by an ink-jet method. A photomask is not used when the resist mask is formed by an ink-jet method, which results in reduction of manufacturing costs.

The gate electrode layer 151 can be formed with a single-layer structure or a stacked structure using a metal material such as molybdenum, titanium, chromium, tantalum, tungsten, aluminum, copper, neodymium, or scandium, or an alloy material containing any of these materials as a main component.

Then, a gate insulating layer 152 is formed over the gate electrode layer 151.

In this embodiment, a silicon oxynitride layer having a thickness of 100 nm or less is formed by a plasma CVD method as the gate insulating layer 152.

Next, an oxide semiconductor film is formed over the gate insulating layer 152 and processed into an island-shaped oxide semiconductor layer 171 in a second photolithography step. In this embodiment, the oxide semiconductor film is formed by a sputtering method using an In—Ga—Zn—O-based metal oxide target.

The substrate is held inside a treatment chamber which is kept in a reduced pressure state, and the substrate is heated to a temperature higher than or equal to room temperature and lower than 400° C. Residual moisture in the treatment chamber is removed, and a sputtering gas from which hydrogen and moisture are removed is introduced. A metal oxide is used as a target. Thus, the oxide semiconductor film is formed over the substrate 150. In order to remove residual moisture from the treatment chamber, an adsorption-type vacuum pump is preferably used. For example, a cryopump, an ion pump, or a titanium sublimation pump is preferably used. As an exhaustion unit, a turbo molecular pump to which a cold trap is added may be used. In the chamber in which exhaustion is performed with the use of a cryopump, a hydrogen atom, a compound including a hydrogen atom such as $H_2O$, a compound including a carbon atom, or the like, for example, is exhausted. Accordingly, the concentration of an impurity included in the oxide semiconductor film formed in the film formation chamber can be reduced.

As an example of film formation conditions, the following condition is employed: the distance between the substrate and the target is 100 mm, the pressure is 0.6 Pa, the direct current (DC) power supply is 0.5 kW, and an oxygen atmosphere (the proportion of oxygen in the oxygen flow is 100%) is used. A pulse direct current (DC) power supply is preferable because powder substances (also referred to as particles or dust) generated in the film formation can be reduced and the film thickness can be made uniform. The oxide semiconductor film preferably has a thickness of 5 nm to 30 nm inclusive. Note that appropriate thickness of the oxide semiconductor film varies depending on the material; therefore, the thickness may be determined as appropriate depending on the material.

Note that it is preferable that impurities such as water, hydrogen, and the like be not contained in the sputtering gas such as oxygen, nitrogen, or a rare gas such as helium, neon and argon introduced when the oxide semiconductor layer is formed. It is for example preferable that the purity of oxygen, nitrogen or a rare gas such as helium, neon and argon used as the sputtering gas be 6N (99.9999%) or higher, preferably, 7N (99.99999%) or higher (that is, the impurity concentrations is 1 ppm or lower, preferably, 0.1 ppm or lower).

Next, a silicon oxide layer 173 is formed over the gate insulating layer 152 and the oxide semiconductor layer 171.

As the silicon oxide layer 173, a silicon oxide layer including defects is formed in the following manner: the substrate 150 over which the layers up to the island-shaped oxide semiconductor layer 171 are formed is heated to a temperature higher than or equal to room temperature and lower than 100° C.; a sputtering gas containing high-purity oxygen from which hydrogen and moisture are removed is introduced; and a silicon target is used for sputtering. Note that the silicon oxide layer 173 includes defects. The silicon oxide layer 173 is desirably a $SiO_x$ (x is preferably 2 or larger) film.

Note that it is preferable that impurities such as water, hydrogen, and the like be not contained in the sputtering gas introduced when the silicon oxide layer is formed. It is for example preferable that the purity of the oxygen gas be 6N (99.9999%) or higher, preferably, 7N (99.99999%) or higher (that is, the impurity concentrations is 1 ppm or lower, preferably, 0.1 ppm or lower).

If the silicon oxide layer 173 including defects includes many oxygen dangling bonds as defects, the binding energy with respect to the impurity such as hydrogen, hydroxyl, or moisture is high; accordingly, a larger amount of hydrogen or impurity including hydrogen can be diffused from the oxide semiconductor layer 171 to the silicon oxide layer including defects.

For example, the silicon oxide layer 173 is formed by a pulsed DC sputtering method, in which a silicon target doped with boron and having a purity of 6N (99.9999%) (resistivity: 0.01 Ωcm) is used, the distance between the target and the substrate (T-S distance) is 89 mm, the pressure is 0.4 Pa, the direct current (DC) power supply is 6 kW, and an oxygen atmosphere (the proportion of oxygen in the oxygen flow is 100%) is used. The thickness of the silicon oxide layer 173 is 300 nm. Instead of the silicon target, quartz (preferably, synthetic quartz) can be used as the target for forming the silicon oxide layer 173. The silicon oxide layer 173 may be formed while the substrate 150 is heated, but it is desirable that the silicon oxide layer 173 be formed at a temperature comprised between 0° C. and 50° C. inclusive, preferably at room temperature, so as to include defects.

In this case, it is preferable that residual moisture be removed from the treatment chamber in the formation of the silicon oxide layer 173, for the purpose of preventing hydrogen, hydroxyl, or moisture from being contained in the oxide semiconductor layer 171 and the silicon oxide layer 173.

Instead of the silicon oxide layer, a silicon oxynitride layer, an aluminum oxide layer, an aluminum oxynitride layer, or the like can be used.

Figure 5A:
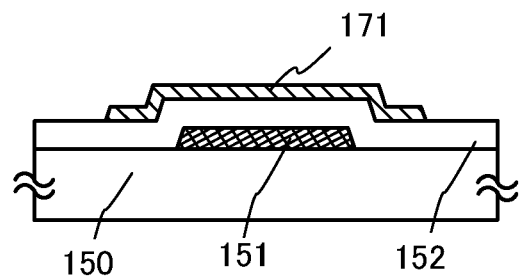
FIGS. 5A to 5E illustrate a manufacturing method of a semiconductor device.
Figure 5B:
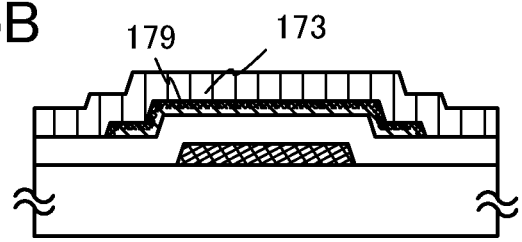
Figure 5C:
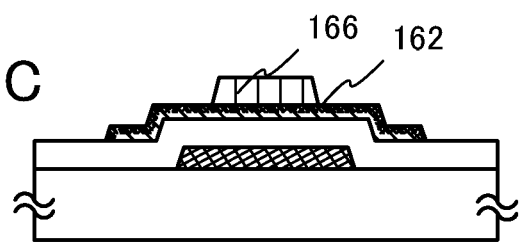

When the silicon oxide layer 173 is formed in contact with the oxide semiconductor layer 171, a mixed region 179 including an oxide semiconductor and silicon oxide is formed at an interface between the oxide semiconductor layer and the silicon oxide layer (see FIG. 5B).

The mixed region 179 includes oxygen, silicon, and at least one kind of metal element that is included in the oxide semiconductor.

The thickness of the mixed region is comprised between 1 nm and 10 nm, preferably between 2 nm and 5 nm. The thickness of the mixed region can be controlled by the film formation conditions of the sputtering method at the time of forming the silicon oxide layer. If the power supply is set higher and the distance between the substrate and the target is set shorter in the sputtering method, the mixed region can be formed thicker. When the sputtering method is conducted with higher power supply, water adsorbed on a surface of the oxide semiconductor layer or the like can be removed.

Provision of the mixed region 179 between the oxide semiconductor layer 171 and the silicon oxide layer 173 promotes diffusion of the hydrogen atom, the compound including a hydrogen atom such as $H_2O$, the compound including a carbon atom, or the like included in the oxide semiconductor layer 171 into the silicon oxide layer 173; accordingly, movement thereof becomes easier.

Next, heat treatment is performed at a temperature ranging from 100° C. to 400° C. under the state where the silicon oxide layer 173 including defects is in contact with the oxide semiconductor layer 171. This heat treatment can diffuse hydrogen or moisture included in the oxide semiconductor layer 171 into the silicon oxide layer 173 including defects. Since the silicon oxide layer 173 includes many defects (dangling bonds), an impurity such as hydrogen, hydroxyl, or moisture included in the island-shaped oxide semiconductor layer 171 is diffused into the silicon oxide layer 173 through the interface at which the oxide semiconductor layer 171 and the silicon oxide layer 173 are in contact with each other. Specifically, a hydrogen atom, a compound including a hydrogen atom such as $H_2O$, a compound including a carbon atom, or the like included in the oxide semiconductor layer 171 can more easily move to be diffused into the silicon oxide layer 173.

Through the above-described process, an oxide semiconductor layer 162 in which the concentration of hydrogen or hydride is reduced can be formed.

A resist mask is formed over the silicon oxide layer 173 in a third photolithography step, and selective etching is performed to form a silicon oxide layer 166. Then, the resist mask is removed (see FIG. 5C).

Next, a conductive film is formed over the gate insulating layer 152, the oxide semiconductor layer 162, and the silicon oxide layer 166. After that, in a fourth photolithography step, a resist mask is formed, and selective etching is performed to form a source electrode layer 165a and a drain electrode layer 165b. Then, the resist mask is removed (see FIG. 5D).

As a material of the source electrode layer 165a and the drain electrode layer 165b, an element selected from Al, Cr, Cu, Ta, Ti, Mo, or W; an alloy containing any of these elements as a component; an alloy film containing any of these elements in combination; and the like can be given. The metal conductive film may have a single-layer structure or a stacked-layer structure of two or more layers.

Figure 5D:
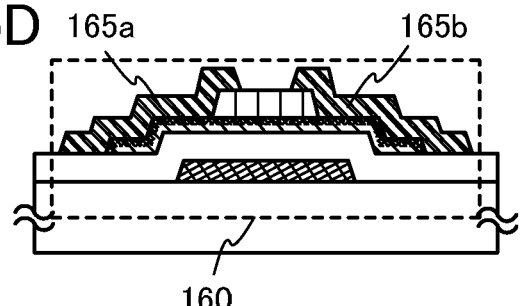
Figure 5E:
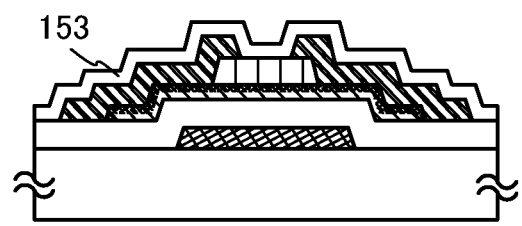

Through the above-described process, the thin film transistor 160 including the oxide semiconductor layer 162 in which the concentration of hydrogen or hydride is reduced can be formed (see FIG. 5D).

When residual moisture in the reaction atmosphere is removed at the time of the above-described formation of the oxide semiconductor film, the concentration of hydrogen or hydride in the oxide semiconductor film can be reduced. Accordingly, the oxide semiconductor film can be stabilized.

A protective insulating layer may be provided over the oxide insulating layer. In this embodiment, a protective insulating layer 153 is formed over the silicon oxide layer 166, the source electrode layer 165a, and the drain electrode layer 165b. As the protective insulating layer 153, a silicon nitride film, a silicon nitride oxide film, an aluminum nitride film, or the like can be used. In this embodiment, the protective insulating layer 153 is formed using a silicon nitride film (see FIG. 5E).

An oxide insulating layer may be further formed over the source electrode layer 165a, the drain electrode layer 165b, and the silicon oxide layer 166, and the protective insulating layer 153 may be stacked over the oxide insulating layer. Further, a planarization insulating layer may be formed over the protective insulating layer 153.

When the silicon nitride layer is formed over the silicon oxide layer including defects under the state of heating the substrate, hydrogen or moisture can be diffused from the oxide semiconductor film to the silicon oxide film, and at the same time, the barrier film which prevents entry of moisture from the outside air can be provided.

When residual moisture in the reaction atmosphere is removed at the time of the formation of the oxide semiconductor layer, in which a channel formation region is to be formed, over the gate insulating layer, the concentration of hydrogen or hydride in the oxide semiconductor layer can be reduced. Further, when the silicon oxide layer including defects is provided so as to be in contact with the oxide semiconductor layer, hydrogen or moisture in the oxide semiconductor layer can be diffused into the silicon oxide film and the concentration of hydrogen or a hydrogen compound in the oxide semiconductor layer can be reduced.

This embodiment can be implemented in appropriate combination with any of the other embodiments.

In the above-described manner, a highly reliable semiconductor device with stable electric characteristics including a thin film transistor in which an oxide semiconductor layer is used can be provided.

Embodiment 3

In this embodiment, another example of a thin film transistor which can be applied to a semiconductor device disclosed in this specification will be described.

In this embodiment, an embodiment of a semiconductor device and a manufacturing method of the semiconductor device will be described with reference to FIGS. 6A to 6C.

Although a thin film transistor 190 is described using a single-gate thin film transistor; a multi-gate thin film transistor including a plurality of channel formation regions can be formed as necessary.

Hereinafter, a process for manufacturing the thin film transistor 190 over a substrate 140 is described with reference to FIGS. 6A to 6C.

First, a conductive film is formed over the substrate 140 having an insulating surface, and then, a gate electrode layer 181 is formed through a first photolithography step. In this embodiment, a tungsten film with a thickness of 150 nm is formed using a sputtering method as the gate electrode layer 181.

Then, a gate insulating layer 142 is formed over the gate electrode layer 181. In this embodiment, a silicon oxynitride layer having a thickness of 100 nm or less is formed by a plasma CVD method as the gate insulating layer 142.

Next, a conductive film is formed over the gate insulating layer 142. After that, in a second photolithography step, a resist mask is formed over the conductive film, and selective etching is performed to form a source electrode layer 195a and a drain electrode layer 195b. Then, the resist mask is removed.

Figure 6A:
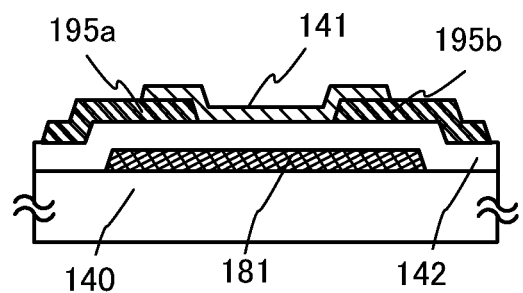
FIGS. 6A to 6C illustrate a manufacturing method of a semiconductor device.
Figure 6B:
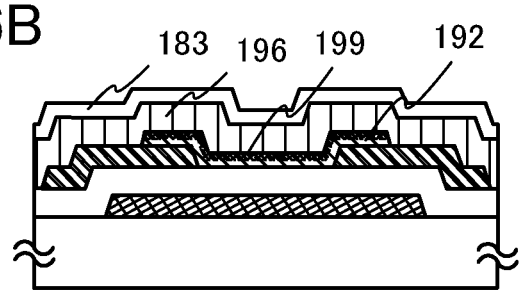

Next, an oxide semiconductor film is formed and processed into an island-shaped oxide semiconductor layer 141 in a third photolithography step (see FIG. 6A). In this embodiment, the oxide semiconductor film is formed by a sputtering method using an In—Ga—Zn—O-based metal oxide target.

The substrate is held inside a treatment chamber in which is kept a reduced pressure state, and the substrate is heated to a temperature higher than or equal to room temperature and lower than 400° C. Residual moisture in the treatment chamber is removed, and a sputtering gas from which hydrogen and moisture are removed is introduced. A metal oxide is used as a target. Thus, the oxide semiconductor film is formed over the substrate 140. In order to remove residual moisture from the treatment chamber, an adsorption-type vacuum pump is preferably used. For example, a cryopump, an ion pump, or a titanium sublimation pump is preferably used. As an exhaustion unit, a turbo molecular pump to which a cold trap is added may be used. In the chamber in which exhaustion is performed with the use of a cryopump, a hydrogen atom, a compound including a hydrogen atom such as $H_2O$, a compound including a carbon atom, or the like, for example, is exhausted. Accordingly, the concentration of an impurity included in the oxide semiconductor film formed in the film formation chamber can be reduced.

As an example of film formation conditions, the following conditions are employed: the distance between the substrate and the target is 100 mm, the pressure is 0.6 Pa, the direct current (DC) power supply is 0.5 kW, and an oxygen atmosphere (the proportion of the oxygen flow is 100%) is used. A pulse direct current (DC) power supply is preferable because powder substances (also referred to as particles or dust) generated in the film formation can be reduced and the film thickness can be made uniform. The oxide semiconductor film preferably has a thickness of 5 nm to 30 nm inclusive. Note that appropriate thickness of the oxide semiconductor film varies depending on the material; therefore, the thickness may be determined as appropriate depending on the material.

Note that it is preferable that impurities such as water, hydrogen, and the like be not contained in the sputtering gas such as oxygen, nitrogen, or a rare gas such as helium, neon and argon introduced when the oxide semiconductor film is formed. It is for example preferable that the purity of oxygen, nitrogen or a rare gas such as helium, neon and argon used as the sputtering gas be 6N (99.9999%) or higher, preferably, 7N (99.99999%) or higher (that is, the impurity concentrations is 1 ppm or lower, preferably, 0.1 ppm or lower).

Next, a silicon oxide layer 196 is formed over the gate insulating layer 142, the oxide semiconductor layer 141, the source electrode layer 195a, and the drain electrode layer 195b.

As the silicon oxide layer 196, a silicon oxide layer including defects is formed in the following manner: the substrate 140 over which the layers up to the island-shaped oxide semiconductor layer 141 are formed is heated to a temperature higher than or equal to room temperature and lower than 100° C.; a sputtering gas containing high-purity oxygen from which hydrogen and moisture are removed is introduced; and a silicon target is used. The silicon oxide layer 196 is desirably a $SiO_x$ (x is preferably 2 or larger) film.

If the silicon oxide layer 196 including defects includes many oxygen dangling bonds as defects, the bonding energy with respect to the impurity such as hydrogen, hydroxyl, or moisture is high; accordingly, a larger amount of hydrogen or impurity including hydrogen can be diffused from the oxide semiconductor layer 141 to the silicon oxide layer including defects.

For example, the silicon oxide layer 196 is formed by a pulsed DC sputtering method, in which a silicon target doped with boron and having a purity of 6N (99.9999%) (resistivity: 0.01 Ωcm) is used, the pressure is 0.4 Pa, the distance between the target and the substrate (T-S distance) is 89 mm, the direct current (DC) power supply is 6 kW, and an oxygen atmosphere (the proportion of the oxygen flow is 100%) is used. The thickness of the silicon oxide layer 196 is 300 nm. Instead of the silicon target, quartz (preferably, synthetic quartz) can be used as the target for forming the silicon oxide layer 196. The silicon oxide layer 196 may be formed while the substrate 140 is heated, but it is desirable that the silicon oxide layer 196 be formed at a temperature comprised between 0° C. and 50° C. inclusive, preferably at room temperature, so as to include defects.

Note that it is preferable that impurities such as water, hydrogen, and the like be not contained in the sputtering gas introduced when the silicon oxide layer is formed. It is for example preferable that the purity of the oxygen gas be 6N (99.9999%) or higher, preferably, 7N (99.99999%) or higher (that is, the impurity concentrations is 1 ppm or lower, preferably, 0.1 ppm or lower).

In this case, it is preferable that residual moisture be removed from the treatment chamber in the formation of the silicon oxide layer 196, for the purpose of preventing hydrogen, hydroxyl, or moisture from being contained in the oxide semiconductor layer 141 and the silicon oxide layer 196.

Instead of the silicon oxide layer, a silicon oxynitride layer, an aluminum oxide layer, an aluminum oxynitride layer, or the like can be used.

When the silicon oxide layer 196 is formed in contact with the oxide semiconductor layer 141, a mixed region 199 including an oxide semiconductor and silicon oxide is formed at an interface between the oxide semiconductor layer and the silicon oxide layer.

The mixed region 199 includes oxygen, silicon, and at least one kind of metal element that is included in the oxide semiconductor.

The thickness of the mixed region is comprised between 1 nm and 10 nm, preferably between 2 nm and 5 nm. The thickness of the mixed region can be controlled by the film formation conditions of the sputtering method at the time of forming the silicon oxide layer. If the power supply is set higher and the distance between the substrate and the target is set shorter in the sputtering method, the mixed region can be formed thicker. When the sputtering method is conducted with higher power supply, water adsorbed on a surface of the oxide semiconductor layer or the like can be removed.

Provision of the mixed region 199 between the oxide semiconductor layer 141 and the silicon oxide layer 196 promotes diffusion of the hydrogen atom, the compound including a hydrogen atom such as $H_2O$, the compound including a carbon atom, or the like included in the oxide semiconductor layer 141 into the silicon oxide layer 196; accordingly, movement thereof becomes easier.

Next, a protective insulating layer 183 is formed over the silicon oxide layer 196. As the protective insulating layer 183, a silicon nitride film, a silicon nitride oxide film, an aluminum nitride film, or the like can be used. As the protective insulating layer 183, a silicon nitride film is formed by heating the substrate 140 over which layers up to the silicon oxide layer 196 are formed, to a temperature comprised between 100° C. and 400° C., introducing a sputtering gas containing high-purity nitrogen from which hydrogen and moisture are removed, and using a target of silicon semiconductor.

Note that it is preferable that impurities such as water, hydrogen, and the like be not contained in the sputtering gas introduced when the silicon nitride film is formed.

It is for example preferable that the purity of the nitrogen gas be 6N (99.9999%) or higher, preferably, 7N (99.99999%) or higher (that is, the impurity concentrations is 1 ppm or lower, preferably, 0.1 ppm or lower).

While the protective insulating layer 183 is formed, the substrate 140 is heated to a temperature comprised between 100° C. and 400° C., whereby hydrogen or moisture included in the oxide semiconductor layer can be diffused into the oxide insulating layer (the silicon oxide film including defects). Since the silicon oxide layer 196 includes many defects (dangling bonds), an impurity such as hydrogen, hydroxyl, or moisture included in the island-shaped oxide semiconductor layer 141 is diffused into the silicon oxide layer 196 through the interface at which the oxide semiconductor layer 141 and the silicon oxide layer 196 are in contact with each other. Specifically, a hydrogen atom, a compound including a hydrogen atom such as $H_2O$, a compound including a carbon atom, or the like included in the oxide semiconductor layer 141 can more easily move to be diffused into the silicon oxide layer 196.

Figure 6C:
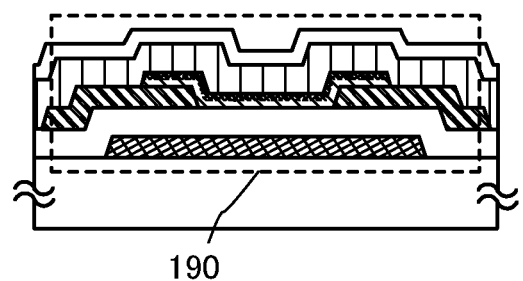

Through the above-described process, the thin film transistor 190 including the oxide semiconductor layer 192 in which the concentration of hydrogen or hydride is reduced can be formed (see FIG. 6C).

This embodiment can be implemented in appropriate combination with any of the other embodiments.

In the above-described manner, a highly reliable semiconductor device with stable electric characteristics including a thin film transistor in which an oxide semiconductor layer is used can be provided.

Embodiment 4

In this embodiment, an example of a thin film transistor which can be applied to a semiconductor device disclosed in this specification will be described.

In this embodiment, an example of using a conductive material having a light-transmitting property for a gate electrode layer, a source electrode layer, and a drain electrode layer will be described. Therefore, part of this embodiment can be performed in a manner similar to that of the above embodiments, and repetitive description of the same portions as or portions having functions similar to those in the above embodiments and steps for manufacturing such portions will be omitted. In addition, detailed description of the same portions is not repeated.

For example, materials of the gate electrode layer, the source electrode layer, and the drain electrode layer can be a conductive material that transmits visible light, and any of the following metal oxides can be applied for example: an In—Sn—O-based metal oxide, an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. The thickness thereof can be set in the range of 50 nm to 300 nm inclusive, as appropriate. As a deposition method of the metal oxide used for the gate electrode layer, the source electrode layer, and the drain electrode layer, a sputtering method, a vacuum evaporation method (an electron beam evaporation method or the like), an arc discharge ion plating method, or a spray method is used. When a sputtering method is employed, it is preferable that deposition be performed using a target including $SiO_2$ at a concentration greater than or equal to 2 wt % and less than or equal to 10 wt %, so that SiOx (x>0) which inhibits crystallization is contained in the light-transmitting conductive film; in this way, the oxide semiconductor can be prevented from being crystallized in heat treatment performed later.

Note that the unit of the percentage of components in the light-transmitting conductive film is atomic percent, and the percentage of components is evaluated by analysis using an electron probe X-ray microanalyzer (EPMA).

In a pixel provided with a thin film transistor, when a pixel electrode layer, another electrode layer (such as a capacitor electrode layer), or a wiring layer (such as a capacitor wiring layer) is formed using a conductive film that transmits visible light, a display device having high aperture ratio can be realized. Needless to say, it is preferable that a gate insulating layer, an oxide insulating layer, a protective insulating layer, and a planarization insulating layer in the pixel be also each formed using a film that transmits visible light.

In this specification, a film that transmits visible light means a film having such a thickness as to have transmittance of visible light between 75% and 100%. In the case where the film has conductivity, the film is also referred to as a transparent conductive film. Further, a conductive film which is semi-transmissive with respect to visible light may be used for metal oxide applied to the gate electrode layer, the source electrode layer, the drain electrode layer, the pixel electrode layer, another electrode layer, or another wiring layer. The conductive film which is semi-transmissive with respect to visible light indicates a film having transmittance of visible light between 50% and 75%.

When a thin film transistor has a light-transmitting property, the aperture ratio can be increased. For small liquid crystal display panels of 10 inches or smaller in particular, a high aperture ratio can be achieved even when the size of pixels is decreased in order to realize higher resolution of display images by increasing the number of gate wirings, for example. Further, by using a film having a light-transmitting property for components of a thin film transistor, a high aperture ratio can be achieved even when one pixel is divided into a plurality of sub-pixels in order to realize a wide viewing angle. That is, a high aperture ratio can be maintained even when a group of high-density thin film transistors is provided, so that a sufficient area of a display region can be secured. For example, in the case where one pixel includes two to four sub-pixels, an aperture ratio can be improved because the thin film transistor has a light-transmitting property. Further, a storage capacitor may be formed using the same material by the same step as the component in the thin film transistor so that the storage capacitor can have a light-transmitting property, whereby the aperture ratio can be further improved.

This embodiment can be implemented in appropriate combination with any of the other embodiments.

Embodiment 5

In this embodiment, an example of a thin film transistor which can be applied to a semiconductor device disclosed in this specification will be described.

In this embodiment, an example in which oxide conductive layers are provided as a source region and a drain region between the oxide semiconductor layer and the source and drain electrode layers in Embodiment 1 will be described with reference to FIG. 7. Therefore, part of this embodiment can be performed in a manner similar to that of Embodiment 1, and repetitive description of the same portions as or portions having functions similar to those in Embodiment 1 and steps for manufacturing such portions will be omitted. Further, since the process of FIG. 7 is the same as the process of FIGS. 1A to 1E except some points, the same portions are denoted by the same reference numerals and the detailed description of the same portions will be omitted.

Figure 7:
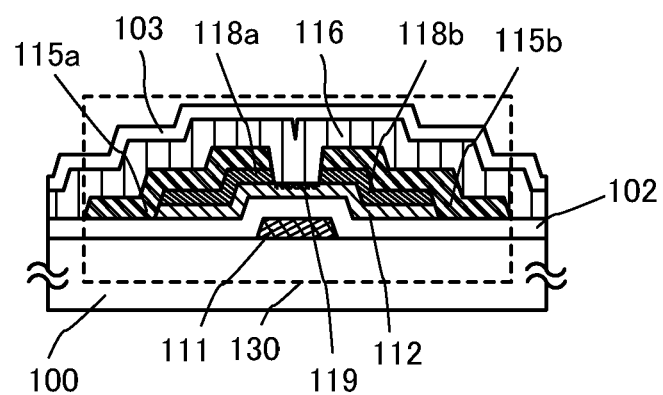
FIG. 7 illustrates a semiconductor device.

A thin film transistor 130 illustrated in FIG. 7 is a channel-etched thin film transistor and includes a gate electrode layer 111, a gate insulating layer 102, an oxide semiconductor layer 112, oxide conductive layers 118a and 118b, a source electrode layer 115a, and a drain electrode layer 115b, over a substrate 100 having an insulating surface. In addition, a silicon oxide layer 116 is provided to cover the thin film transistor 130 and to be in contact with the oxide semiconductor layer 112, and a protective insulating layer 103 is stacked thereover. The silicon oxide layer 116 includes defects, and a mixed region 119 is provided between the oxide semiconductor layer 112 and the silicon oxide layer 116.

In accordance with Embodiment 1, the gate electrode layer 111 is formed over the substrate 100, and the gate insulating layer 102 is stacked thereover. An oxide semiconductor film is formed over the gate insulating layer 102 and then processed into an oxide semiconductor layer.

The oxide conductive layers 118a and 118b are formed over the oxide semiconductor layer. In this embodiment, an example in which the oxide conductive layers 118a and 118b and the oxide semiconductor layer are formed in a same photolithography step is described; however, the oxide conductive layers 118a and 118b and the source and drain electrode layers may also be formed in a same photolithography step.

As the formation method of the oxide conductive layers 118a and 118b, a sputtering method, a vacuum evaporation method (an electron beam evaporation method or the like), an arc discharge ion plating method, or a spray method can be used. A material of the oxide conductive layers 118a and 118b preferably contains zinc oxide as a component and preferably does not contain indium oxide. For such oxide conductive layers 118a and 118b, zinc oxide, aluminum zinc oxide, aluminum zinc oxynitride, gallium zinc oxide, or the like can be used. The thickness of the oxide conductive layers 118a and 118b is set as appropriate in a range of 50 nm to 300 nm inclusive. In the case of using a sputtering method, it is preferable to use a target including $SiO_2$ at a concentration greater than or equal to 2 wt % and less than or equal to 10 wt % so that $SiO_x$ (x>0) which inhibits crystallization is contained in the oxide conductive film; in this way, the oxide semiconductor can be prevented from being crystallized in heat treatment performed later.

In this embodiment, after the oxide conductive layer and the oxide semiconductor layer are formed by a same photolithography step, the oxide conductive layer is further etched using the source electrode layer 115a and the drain electrode layer 115b as masks, so that the oxide conductive layers 118a and 118b are formed. The oxide conductive layers 118a and 118b containing zinc oxide as a component can be easily etched with an alkaline solution such as a resist stripping solution, for example.

Etching treatment for dividing the oxide conductive layer to form a channel formation region is performed by utilizing the difference in etching rate between the oxide semiconductor layer and the oxide conductive layer. The oxide conductive layer over the oxide semiconductor layer is selectively etched thanks to a higher etching rate of the oxide conductive layer as compared with that of the oxide semiconductor layer.

Therefore, it is preferable that a resist mask used for forming the source electrode layer 115a and the drain electrode layer 115b be removed by an ashing step. In the case of etching with a stripping solution, etching conditions (such as the kind of the etchant, the concentration, and the etching time) are adjusted as appropriate so that the oxide conductive layer and the oxide semiconductor layer are not etched excessively.

The oxide conductive layer 118b which is provided between the oxide semiconductor layer 112 and the drain electrode layer 115b which is formed using a metal material also functions as a low-resistance drain (LRD, also referred to as an LRN (low-resistance n-type conductivity)) region. Similarly, the oxide conductive layer 118a which is provided between the oxide semiconductor layer 112 and the source electrode layer 115a which is formed using a metal material also functions as a low-resistance source (LRS, also referred to as an LRN (low-resistance n-type conductivity)) region. With the structure of the oxide semiconductor layer, the low-resistance drain region, and the drain electrode layer formed using a metal material, withstand voltage of the transistor can be further increased. Specifically, the carrier concentration of the low-resistance drain region is higher than that of the high-resistance drain region (HRD region), and is preferably in the range of $1\times10^{20}/cm^3$ to $1\times10^{21}/cm^3$ inclusive.

When the oxide conductive layer is provided for the source region and the drain region between the oxide semiconductor layer and the source and drain electrode layers, the resistance of the source region and the drain region can be decreased and high-speed operation of the transistor can be realized. It is effective to use the oxide conductive layer for the source and drain regions in order to improve the frequency characteristics of a peripheral circuit (driver circuit). This is because the contact between a metal electrode (e.g., Ti) and an oxide conductive layer allows a low contact resistance when compared with the contact between a metal electrode (e.g., Ti) and an oxide semiconductor layer.

Further, there has been a problem in that molybdenum (Mo) which is used as a part of a wiring material (e.g., Mo/Al/Mo) in a semiconductor device has high contact resistance with an oxide semiconductor layer. This is because Mo is less likely to be oxidized and has a weaker effect of extracting oxygen from the oxide semiconductor layer as compared with Ti, and a contact interface between Mo and the oxide semiconductor layer is not changed to have n-type conductivity. However, even in such a case, the contact resistance can be reduced by interposing an oxide conductive layer between the oxide semiconductor layer and the source and drain electrode layers; accordingly, the frequency characteristics of a peripheral circuit (driver circuit) can be improved.

The channel length of the thin film transistor is determined at the time of etching of the oxide conductive layer; accordingly, the channel length can be further shortened. For example, the channel length (L) can be set as small as 0.1 μm to 2 μm inclusive; in this manner, operation speed can be increased.

Although Embodiment 1 is used as an example, this embodiment can be implemented in appropriate combination with any of the other embodiments.

In the above-described manner, a highly reliable semiconductor device with stable electric characteristics including a thin film transistor in which an oxide semiconductor layer is used can be provided.

Embodiment 6

In this embodiment, an example is described in which an active matrix light-emitting display device is manufactured using a thin film transistor and a light-emitting element utilizing electroluminescence in the semiconductor devices described in any of Embodiments 1 to 5.

Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. Then, the carriers (electrons and holes) recombine and light emission is caused. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission which utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made in this embodiment using an organic EL element as a light-emitting element.

Figure 8:
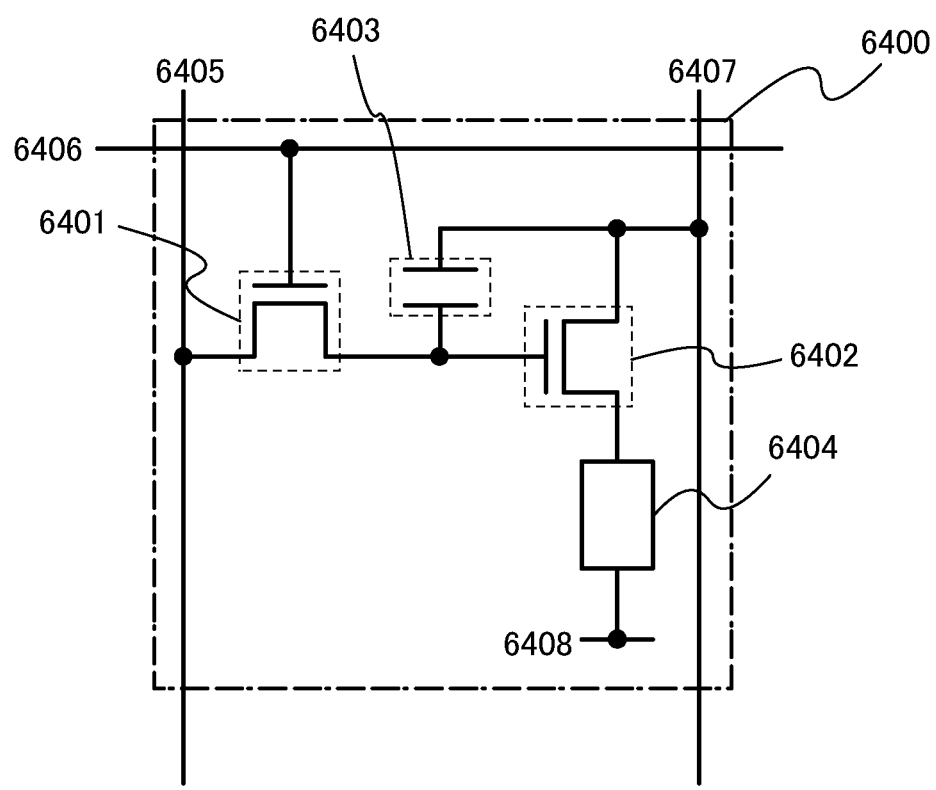
FIG. 8 is an equivalent circuit diagram of a pixel in a semiconductor device.

FIG. 8 illustrates an example of a pixel configuration to which digital time grayscale driving can be applied as an example of the semiconductor device.

The configuration and operation of a pixel to which digital time grayscale driving can be applied will be described. An example is described in this embodiment in which one pixel includes two n-channel transistors using an oxide semiconductor layer in a channel formation region.

A pixel 6400 includes a switching transistor 6401, a driving transistor 6402, a light-emitting element 6404, and a capacitor 6403. In the switching transistor 6401, a gate thereof is connected to a scan line 6406, a first electrode thereof (one of source and drain electrodes) is connected to a signal line 6405, and a second electrode thereof (the other of the source and drain electrodes) is connected to a gate of the driving transistor 6402. In the driving transistor 6402, the gate thereof is connected to a power supply line 6407 through the capacitor 6403, a first electrode thereof is connected to the power supply line 6407, and a second electrode thereof is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

Note that the second electrode (common electrode 6408) of the light-emitting element 6404 is set to a low power supply potential. Note that the low power supply potential is a potential satisfying the low power supply potential<a high power supply potential with reference to the high power supply potential that is set on the power supply line 6407. As the low power supply potential, GND, 0 V, or the like may be employed, for example. The difference between the high power supply potential and the low power supply potential is applied to the light-emitting element 6404 so that current flows through the light-emitting element 6404, whereby the light-emitting element 6404 emits light. Thus, each potential is set so that the difference between the high power supply potential and the low power supply potential is greater than or equal to a forward threshold voltage of the light-emitting element 6404.

When the gate capacitance of the driving transistor 6402 is used as a substitute for the capacitor 6403, the capacitor 6403 can be omitted. The gate capacitance of the driving transistor 6402 may be formed between the channel region and the gate electrode.

In the case of using a voltage-input voltage driving method, a video signal is inputted to the gate of the driving transistor 6402 so that the driving transistor 6402 is in either of two states of being sufficiently turned on and turned off. That is, the driving transistor 6402 operates in a linear region, and thus a voltage higher than the voltage of the power supply line 6407 is applied to the gate of the driving transistor 6402. Note that a voltage higher than or equal to the following is applied to the signal line 6405: power supply line voltage+$V_{th}$ of the driving transistor 6402.

In the case of performing analog grayscale driving instead of digital time grayscale driving, the same pixel configuration as FIG. 8 can be employed by changing signal input.

In the case of performing analog grayscale driving, voltage higher than or equal to the following is applied to the gate of the driving transistor 6402: forward voltage of the light-emitting element 6404+$V_{th}$ of the driving transistor 6402. The forward voltage of the light-emitting element 6404 refers to voltage to obtain a desired luminance, and includes at least forward threshold voltage. By input of a video signal which enables the driving transistor 6402 to operate in a saturation region, it is possible to feed current to the light-emitting element 6404. In order that the driving transistor 6402 can operate in the saturation region, the potential of the power supply line 6407 is set higher than a gate potential of the driving transistor 6402. When an analog video signal is used, it is possible to feed current to the light-emitting element 6404 in accordance with the video signal and perform analog grayscale driving.

Note that the pixel configuration is not limited to that illustrated in FIG. 8. For example, the pixel illustrated in FIG. 8 may further include a switch, a resistor, a capacitor, a transistor, a logic circuit, or the like.

Next, structures of the light-emitting element will be described with reference to FIGS. 9A to 9C. A cross-sectional structure of a pixel will be described by taking an n-channel driving TFT as an example. Driving TFTs 7011, 7021, and 7001 used for semiconductor devices illustrated in FIGS. 9A, 9B, and 9C, respectively, can be manufactured in a manner similar to that of the thin film transistor described in Embodiment 1, and examples of using a light-transmitting thin film transistor including an oxide semiconductor layer will be described.

In order to extract light emitted from the light-emitting element, at least one of the anode and the cathode is required to transmit light. A thin film transistor and a light-emitting element are formed over a substrate. A light-emitting element can have a top emission structure in which light is extracted through the surface opposite to the substrate, a bottom emission structure in which light is extracted through the surface on the substrate side, or a dual emission structure in which light is extracted through the surface opposite to the substrate and the surface on the substrate side. The pixel configuration can be applied to a light-emitting element having any of these emission structures.

A light-emitting element having a bottom emission structure will be described with reference to FIG. 9A.

Figure 9A:
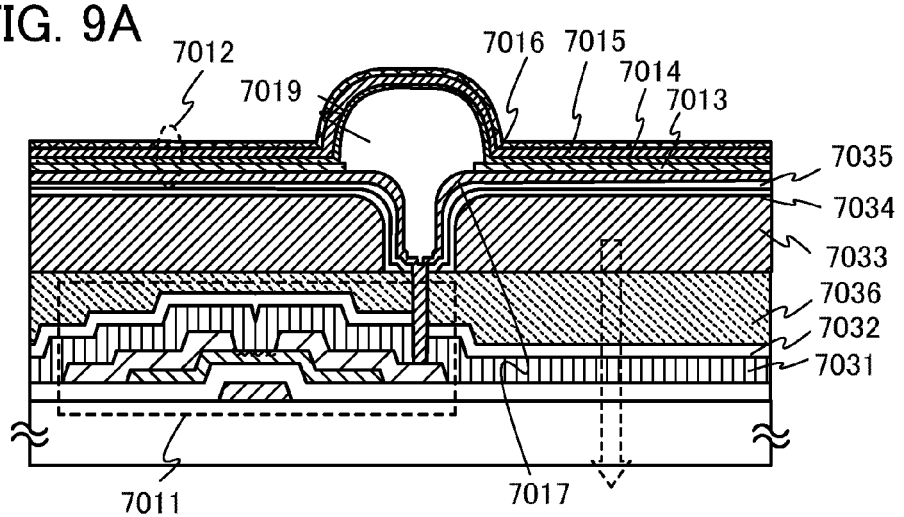
FIGS. 9A to 9C each illustrate a semiconductor device.

FIG. 9A is a cross-sectional view of a pixel in the case where the driving TFT 7011 is of an n-type and light is emitted from a light-emitting element 7012 to a first electrode 7013 side. In FIG. 9A, the first electrode 7013 of the light-emitting element 7012 is formed over a light-transmitting conductive film 7017 which is electrically connected to a drain electrode layer of the driving TFT 7011, and an EL layer 7014 and a second electrode 7015 are stacked in that order over the first electrode 7013.

As the light-transmitting conductive film 7017, a light-transmitting conductive film such as a film of indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added can be used.

The first electrode 7013 of the light-emitting element can be formed using various materials. For example, in the case where the first electrode 7013 is used as a cathode, a material having a low work function, for example, an alkali metal such as Li or Cs, an alkaline-earth metal such as Mg, Ca, or Sr, an alloy containing any of these (Mg:Ag, Al:Li, or the like), a rare-earth metal such as Yb or Er, or the like, is preferably used. In FIG. 9A, the thickness of the first electrode 7013 is such that the first electrode transmits light (preferably, approximately 5 nm to 30 nm). For example, an aluminum film having a thickness of 20 nm is used for the first electrode 7013.

The peripheral portion of the first electrode 7013 is covered with a partition 7019. The partition 7019 is formed using an organic resin film such as polyimide, acrylic, polyamide, or epoxy, an inorganic insulating film, or organic polysiloxane. It is particularly preferable that the partition 7019 be formed using a photosensitive resin material to have an opening over the first electrode 7013 so that a sidewall of the opening is formed as an inclined surface with continuous curvature. In the case where a photosensitive resin material is used for the partition 7019, a step of forming a resist mask can be omitted.

The EL layer 7014 formed over the first electrode 7013 and the partition 7019 may be formed using a single layer or a plurality of layers stacked as long as it includes at least a light-emitting layer. When the EL layer 7014 is formed using a plurality of layers, the EL layer 7014 is formed by stacking an electron-injection layer, an electron-transport layer, a light-emitting layer, a hole-transport layer, and a hole-injection layer in that order over the first electrode 7013 functioning as a cathode. Note that not all of these layers need to be provided.

The stacking order is not limited to the above stacking order. The first electrode 7013 may function as an anode, and a hole-injection layer, a hole-transport layer, a light-emitting layer, an electron-transport layer, and an electron-injection layer may be stacked in that order over the first electrode 7013. However, when power consumption is compared, it is preferable that the first electrode 7013 function as a cathode and an electron-injection layer, an electron-transport layer, a light-emitting layer, a hole-transport layer, and a hole-injection layer be stacked in that order over the first electrode 7013, because an increase in voltage in the driver circuit portion can be suppressed and power consumption can be reduced.

As the second electrode 7015 formed over the EL layer 7014, various materials can be employed. For example, in the case where the second electrode 7015 is used as an anode, a material having a high work function such as ZrN, Ti, W, Ni, Pt, or Cr; or a light-transmitting conductive material such as ITO, IZO, or ZnO is preferably used. As a light-blocking film 7016 over the second electrode 7015, a metal which blocks light, a metal which reflects light, or the like is used. In this embodiment, an ITO film is used for the second electrode 7015, and a Ti film is used for the light-blocking film 7016.

The light-emitting element 7012 corresponds to a region where the EL layer 7014 including a light-transmitting layer is sandwiched between the first electrode 7013 and the second electrode 7015. In the case of the element structure illustrated in FIG. 9A, light is emitted from the light-emitting element 7012 to the first electrode 7013 side as indicated by an arrow.

Note that an example in which a light-transmitting conductive film is used as a gate electrode layer and a light-transmitting thin film is used as source and drain electrode layers is illustrated in FIG. 9A. Light emitted from the light-emitting element 7012 passes through a color filter layer 7033, and can be emitted through the substrate.

The color filter layer 7033 is formed by a droplet discharge method such as an ink-jet method, a printing method, an etching method with the use of a photolithography technique, or the like.

The color filter layer 7033 is covered with an overcoat layer 7034, and also covered with a protective insulating layer 7035. Note that the overcoat layer 7034 with a thin thickness is illustrated in FIG. 9A; however, the overcoat layer 7034 has a function to planarize a surface with unevenness due to the color filter layer 7033.

A contact hole which is formed in the protective insulating layer 7035, a planarizing insulating film 7036, an insulating layer 7032, and an insulating layer 7031 and which reaches the drain electrode layer is provided in a portion which overlaps with the partition 7019.

Next, a light-emitting element having a dual emission structure will be described with reference to FIG. 9B.

Figure 9B:
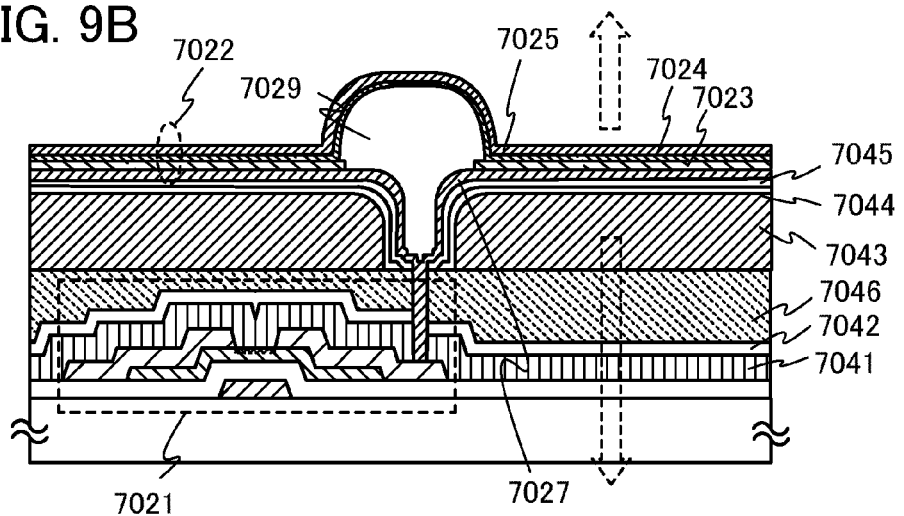

In FIG. 9B, a first electrode 7023 of a light-emitting element 7022 is formed over a light-transmitting conductive film 7027 which is electrically connected to a drain electrode layer of the driving TFT 7021, and an EL layer 7024 and a second electrode 7025 are stacked in that order over the first electrode 7023.

For the light-transmitting conductive film 7027, a light-transmitting conductive film of indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like can be used.

The first electrode 7023 can be formed using various materials. For example, in the case where the first electrode 7023 is used as a cathode, a material having a low work function, specifically, an alkali metal such as Li or Cs; an alkaline-earth metal such as Mg, Ca, or Sr; an alloy containing any of these (Mg:Ag, Al:Li, or the like); a rare-earth metal such as Yb or Er; or the like is preferable. In this embodiment, the first electrode 7023 is used as a cathode and the first electrode 7023 is formed to a thickness such that the first electrode 7023 can transmit light (preferably, approximately 5 nm to 30 nm). For example, a 20-nm-thick aluminum film is used as the cathode.

The periphery of the first electrode 7023 is covered with a partition 7029. The partition 7029 is formed using an organic resin film such as polyimide, acrylic, polyamide, or epoxy; an inorganic insulating film; or organic polysiloxane. It is particularly preferable that the partition 7029 be formed using a photosensitive resin material to have an opening over the first electrode 7023 so that a sidewall of the opening is formed as an inclined surface with continuous curvature. In the case where a photosensitive resin material is used for the partition 7029, a step of forming a resist mask can be omitted.

The EL layer 7024 formed over the first electrode 7023 and the partition 7029 may be formed using either a single layer or a plurality of layers stacked as long as it includes at least a light-emitting layer. When the EL layer 7024 is formed using a plurality of layers, the EL layer 7024 is formed by stacking an electron-injection layer, an electron-transport layer, a light-emitting layer, a hole-transport layer, and a hole-injection layer in that order over the first electrode 7023 functioning as a cathode. Note that not all of these layers need to be provided.

The stacking order is not limited to the above stacking order. The first electrode 7023 may function as an anode, and a hole-injection layer, a hole-transport layer, a light-emitting layer, an electron-transport layer, and an electron-injection layer may be stacked in that order over the anode. However, when power consumption is compared, it is preferable that the first electrode 7023 function as a cathode and an electron-injection layer, an electron-transport layer, a light-emitting layer, a hole-transport layer, and a hole-injection layer be stacked in that order over the cathode for lower power consumption.

As the second electrode 7025 formed over the EL layer 7024, various materials can be employed. For example, in the case where the second electrode 7025 is used as an anode, a material having a high work function, for example, a light-transmitting conductive material of ITO, IZO, ZnO, or the like can be preferably used. In this embodiment, the second electrode 7025 is used as an anode, and an ITO film containing silicon oxide is formed as the second electrode 7025.

The light-emitting element 7022 corresponds to a region where the EL layer 7024 including a light-emitting layer is sandwiched between the first electrode 7023 and the second electrode 7025. In the case of the element structure illustrated in FIG. 9B, light is emitted from the light-emitting element 7022 to both the second electrode 7025 side and the first electrode 7023 side as indicated by arrows.

Note that an example in which a light-transmitting conductive film is used as a gate electrode layer and a light-transmitting thin film is used as source and drain electrode layers is illustrated in FIG. 9B. Light emitted from the light-emitting element 7022 to the first electrode 7023 side passes through a color filter layer 7043, and can be extracted through the substrate.

The color filter layer 7043 is formed by a droplet discharge method such as an ink-jet method, a printing method, an etching method with the use of a photolithography technique, or the like.

The color filter layer 7043 is covered with an overcoat layer 7044, and also covered with a protective insulating layer 7045.

A contact hole which is formed in the protective insulating layer 7045, a planarizing insulating film 7046, an insulating layer 7042, and an insulating layer 7041 and which reaches the drain electrode layer is provided in a portion which overlaps with the partition 7029.

Note that when a light-emitting element having a dual emission structure is used and full color display is performed on both display surfaces, light from the second electrode 7025 side does not pass through the color filter layer 7043; therefore, a sealing substrate provided with another color filter layer is preferably provided on the second electrode 7025.

Next, a light-emitting element having a top emission structure is described with reference to FIG. 9C.

Figure 9C:
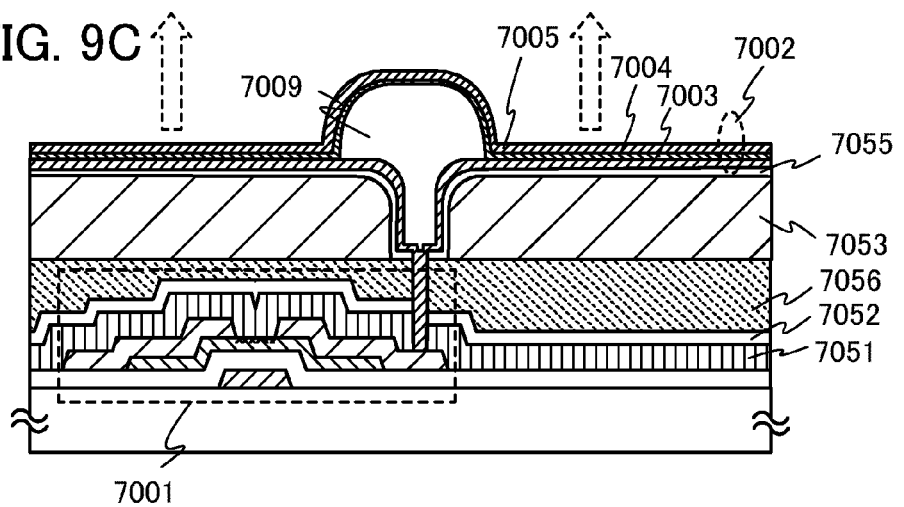

FIG. 9C is a cross-sectional view of a pixel in the case where the driving TFT 7001 is of n-type and light is emitted from a light-emitting element 7002 to a second electrode 7005 side. In FIG. 9C, a drain electrode layer of the driving TFT 7001 and a first electrode 7003 are in contact with each other, and the driving TFT 7001 and the first electrode 7003 of the light-emitting element 7002 are electrically connected to each other. An EL layer 7004 and the second electrode 7005 are stacked in that order over the first electrode 7003.

The first electrode 7003 can be formed using a variety of materials. For example, in the case where the first electrode 7003 is used as a cathode, a material having a low work function, specifically, an alkali metal such as Li or Cs; an alkaline-earth metal such as Mg, Ca, or Sr; an alloy containing any of these (Mg:Ag, Al:Li, or the like); a rare-earth metal such as Yb or Er; or the like, is preferable.

The periphery of the first electrode 7003 is covered with a partition 7009. The partition 7009 is formed using an organic resin film such as polyimide, acrylic, polyamide, or epoxy; an inorganic insulating film; or organic polysiloxane. It is particularly preferable that the partition 7009 be formed using a photosensitive resin material to have an opening over the first electrode 7003 so that a sidewall of the opening is inclined with continuous curvature. In the case where a photosensitive resin material is used for the partition 7009, a step of forming a resist mask can be omitted.

The EL layer 7004 formed over the first electrode 7003 and the partition 7009 may be formed using either a single layer or a plurality of layers stacked as long as it includes at least a light-emitting layer. When the EL layer 7004 is formed using a plurality of layers, the EL layer 7004 is formed by stacking an electron-injection layer, an electron-transport layer, a light-emitting layer, a hole-transport layer, and a hole-injection layer in that order over the first electrode 7003 used as a cathode. Note that not all of these layers need to be provided.

The stacking order is not limited to the above stacking order, and a hole-injection layer, a hole-transport layer, a light-emitting layer, an electron-transport layer, and an electron-injection layer may be stacked in that order over the first electrode 7003 used as an anode.

In FIG. 9C, a hole-injection layer, a hole-transport layer, a light-emitting layer, an electron-transport layer, and an electron-injection layer are stacked in that order over a stacked film in which a Ti film, an aluminum film, and a Ti film are stacked in that order, and thereover, a stacked layer of a Mg:Ag alloy thin film and ITO is formed.

However, in the case where the driving TFT 7001 is of an n-type, it is preferable that an electron-injection layer, an electron-transport layer, a light-emitting layer, a hole-transport layer, and a hole-injection layer be stacked in that order over the first electrode 7003, because an increase in voltage in the driver circuit can be suppressed and power consumption can be reduced.

The second electrode 7005 is formed using a light-transmitting conductive material through which light can pass, and for example, a light-transmitting conductive film of indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like can be used.

The light-emitting element 7002 corresponds to a region where the EL layer 7004 is sandwiched between the first electrode 7003 and the second electrode 7005. In the case of the pixel illustrated in FIG. 9C, light is emitted from the light-emitting element 7002 to the second electrode 7005 side as indicated by an arrow.

In FIG. 9C, the drain electrode layer of the driving TFT 7001 is electrically connected to the first electrode 7003 through a contact hole provided in a silicon oxide layer 7051, a protective insulating layer 7052, a planarization insulating layer 7056, a planarization insulating layer 7053, and an insulating layer 7055. The planarization insulating layers 7053 and 7056 can be formed using a resin material such as polyimide, acrylic, benzocyclobutene, polyamide, or epoxy. In addition to such resin materials, it is also possible to use a low-dielectric constant material (low-k material), a siloxane-based resin, phosphosilicate glass (PSG), borophosphosilicate glass (BPSG), or the like. Note that the planarization insulating layers 7053 and 7056 may be formed by stacking a plurality of insulating films formed of these materials. There is no particular limitation on the method for forming the planarization insulating layers 7053 and 7056, and the planarization insulating layers 7053 and 7056 can be formed, depending on the material, by a method such as a sputtering method, an SOG method, spin coating, dip coating, spray coating, or a droplet discharge method (such as an ink-jet method, screen printing, offset printing, or the like), or a tool (equipment) such as a doctor knife, a roll coater, a curtain coater, or a knife coater.

The partition 7009 is provided in order to insulate the first electrode 7003 from a first electrode of an adjacent pixel. The partition 7009 is formed using an organic resin film of polyimide, acrylic, polyamide, epoxy, or the like, an inorganic insulating film, or organic polysiloxane. It is particularly preferable that the partition 7009 be formed using a photosensitive resin material to have the opening over the first electrode 7003 so that the sidewall of the opening is formed as a tilted surface with continuous curvature. When the partition 7009 is formed using a photosensitive resin material, a step of forming a resist mask can be omitted.

In the structure of FIG. 9C, when full color display is performed, for example, the light-emitting element 7002 is used as a green light-emitting element, one of adjacent light-emitting elements is used as a red light-emitting element, and the other is used as a blue light-emitting element. Alternatively, a light-emitting display device capable of full color display may be manufactured using four kinds of light-emitting elements, which include white light-emitting elements as well as three kinds of light-emitting elements.

In the structure of FIG. 9C, a light-emitting display device capable of full color display may be manufactured in such a way that all of a plurality of light-emitting elements which is arranged is white light-emitting elements and a sealing substrate having a color filter or the like is arranged on the light-emitting element 7002. A material which exhibits light of a single color such as white can be formed and combined with a color filter or a color conversion layer, whereby full color display can be performed.

Any of the thin film transistors of Embodiments 1 to 5 can be used as appropriate as the thin film transistors 7001, 7011, and 7021 used for semiconductor devices, and they can be formed using steps and materials similar to those for the thin film transistors of Embodiments 1 to 5. The thin film transistors 7001, 7011, and 7021 each include a mixed region between the oxide semiconductor layer and the silicon oxide layer. In addition, since the silicon oxide ($SiO_x$, x is preferably 2 or larger) layer including defects (preferably, many oxygen dangling bonds) is stacked and heat treatment is performed, hydrogen or water included in the oxide semiconductor layer is diffused into the silicon oxide layer and hydrogen or water is reduced in the oxide semiconductor layer. Therefore, the thin film transistors 7001, 7011, and 7021 are highly reliable thin film transistors.

Needless to say, display of monochromatic light can also be performed. For example, a lighting device may be formed with the use of white light emission, or an area-color light-emitting device may be formed with the use of a single color light emission.

If necessary, an optical film such as a polarizing film including a circularly polarizing plate may be provided.

Although an organic EL element is described here as a light-emitting element, an inorganic EL element can also be provided as a light-emitting element.

Note that the example is described in which a thin film transistor (driving TFT) which controls the driving of a light-emitting element is electrically connected to the light-emitting element; however, a structure may be employed in which a TFT for current control is connected between the driving TFT and the light-emitting element.

This embodiment can be implemented in appropriate combination with any of the other embodiments.

Embodiment 7

Figure 10A:
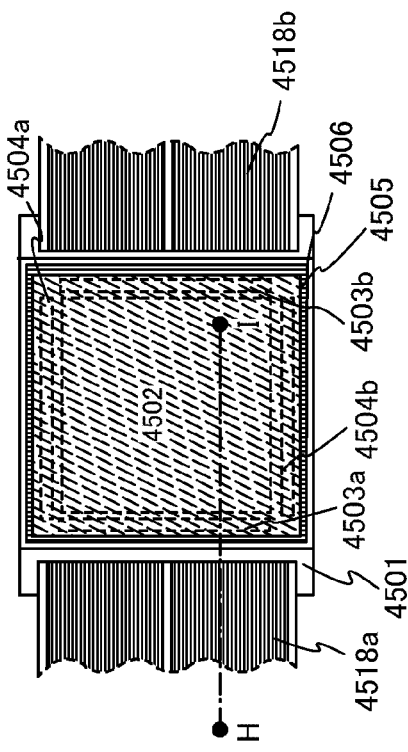
FIGS. 10A and 10B illustrate a semiconductor device.
Figure 10B:
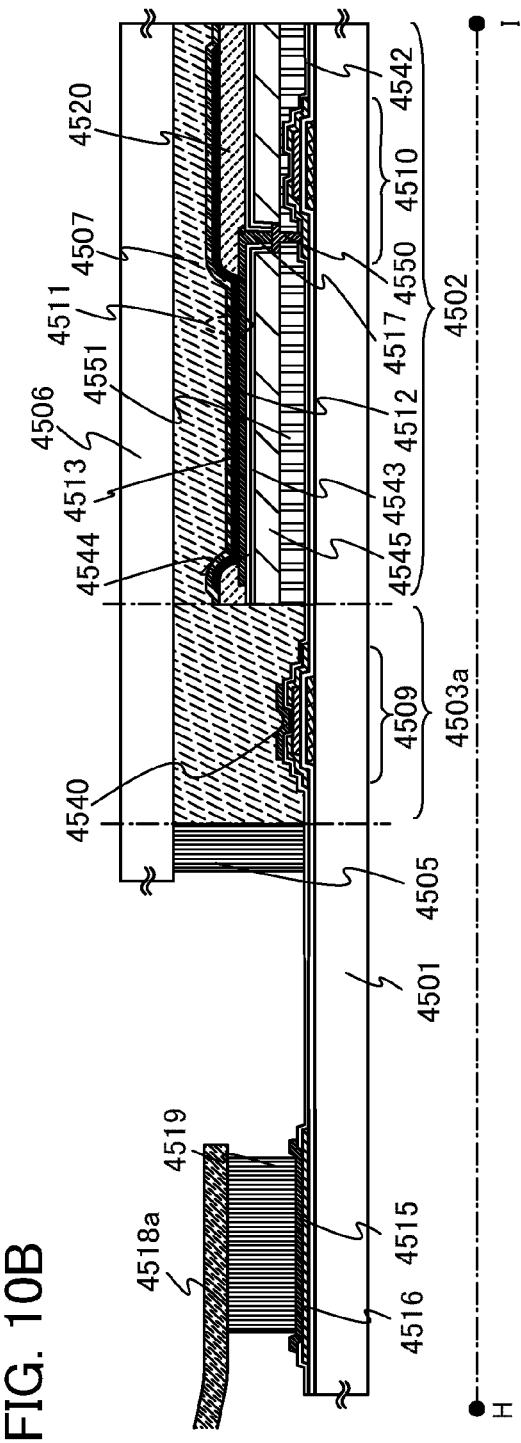

In this embodiment, the appearance and a cross section of a light-emitting display panel (also referred to as a light-emitting panel) will be described with reference to FIGS. 10A and 10B. FIG. 10A is a plan view of a panel in which a thin film transistor and a light-emitting element are sealed between a first substrate and a second substrate with a sealant. FIG. 10B is a cross-sectional view taken along line H-I of FIG. 10A.

A sealant 4505 is provided to surround a pixel portion 4502, a signal line driver circuit 4503*a*, a signal line driver circuit 4503*b*, a scan line driver circuit 4504*a*, and a scan line driver circuit 4504*b*, which are provided over a first substrate 4501. In addition, a second substrate 4506 is provided over the pixel portion 4502, the signal line driver circuits 4503*a* and 4503*b*, and the scan line driver circuits 4504*a* and 4504*b*. Accordingly, the pixel portion 4502, the signal line driver circuits 4503*a* and 4503*b*, and the scan line driver circuits 4504*a* and 4504*b* are sealed together with a filler 4507, by the first substrate 4501, the sealant 4505, and the second substrate 4506. It is preferable that a display device be thus packaged (sealed) with a protective film (such as a bonding film or an ultraviolet curable resin film) or a cover material with high air-tightness and little degasification so that the display device is not exposed to the outside air.

The pixel portion 4502, the signal line driver circuits 4503*a* and 4503*b*, and the scan line driver circuits 4504*a* and 4504*b* formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 10B.

Any of the thin film transistors of Embodiments 1 to 5 can be used as appropriate as the thin film transistors 4509 and 4510, and they can be formed using steps and materials similar to those for the thin film transistors of Embodiments 1 to 5. The thin film transistors 4509 and 4510 each include a mixed region between the oxide semiconductor layer and the silicon oxide layer. In addition, since the silicon oxide ($SiO_x$, x is preferably 2 or larger) layer including defects (preferably, many oxygen dangling bonds) is stacked and heat treatment is performed, hydrogen or water included in the oxide semiconductor layer is diffused into the silicon oxide layer and hydrogen or water is reduced in the oxide semiconductor layer. Therefore, the thin film transistors 4509 and 4510 are highly reliable thin film transistors.

Note that the thin film transistor 4509 for a driver circuit has a conductive layer in a position which overlaps with the channel formation region of the oxide semiconductor layer in the thin film transistor. In this embodiment, the thin film transistors 4509 and 4510 are n-channel thin film transistors.

A conductive layer 4540 is provided over a silicon oxide layer 4542 in a portion which overlaps with the channel formation region of the oxide semiconductor layer of the thin film transistor 4509 for a driver circuit. When the conductive layer 4540 is provided in a portion which overlaps with the channel formation region of the oxide semiconductor layer, the amount of shift in the threshold voltage of the thin film transistor 4509 between before and after a BT (Bias Temperature) test can be reduced. The conductive layer 4540 may have a potential which is the same as or different from that of the gate electrode layer of the thin film transistor 4509, and can function as a second gate electrode layer. The potential of the conductive layer 4540 may be GND, 0 V or in a floating state.

Further, the silicon oxide layer 4542 is formed to cover the oxide semiconductor layer of the thin film transistor 4510. The source or drain electrode layer of the thin film transistor 4510 is electrically connected to a wiring layer 4550 in an opening formed in the silicon oxide layer 4542 and an insulating layer 4551 which are formed over the thin film transistor. The wiring layer 4550 is formed in contact with a first electrode 4517, and the thin film transistor 4510 and the first electrode 4517 are electrically connected to each other through the wiring layer 4550.

The silicon oxide layer 4542 may be formed using a material and a method similar to those of the silicon oxide layer 116 described in Embodiment 1.

A color filter layer 4545 is formed over the insulating layer 4551 so as to overlap with a light-emitting region of a light-emitting element 4511.

Further, in order to reduce the surface roughness of the color filter layer 4545, the color filter layer 4545 is covered with an overcoat layer 4543 functioning as a planarization insulating film.

Further, an insulating layer 4544 is formed over the overcoat layer 4543. The insulating layer 4544 may be formed in a manner similar to that of the protective insulating layer 103 described in Embodiment 1, and a silicon nitride film may be formed by a sputtering method, for example.

Reference numeral 4511 denotes a light-emitting element, and the first electrode 4517 that is a pixel electrode included in the light-emitting element 4511 is electrically connected to a source electrode layer or a drain electrode layer of the thin film transistor 4510 through the wiring layer 4550. Note that a structure of the light-emitting element 4511 is not limited to the illustrated structure, which includes the first electrode 4517, an electroluminescent layer 4512, and a second electrode 4513. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. It is particularly preferable that the partition 4520 be formed of a photosensitive material to have an opening over the first electrode 4517 so that a sidewall of the opening is formed as an inclined surface with continuous curvature.

The electroluminescent layer 4512 may be formed using a single layer or a plurality of layers stacked.

A protective film may be formed over the second electrode 4513 and the partition 4520 in order to prevent oxygen, hydrogen, moisture, carbon dioxide, or the like from entering the light-emitting element 4511. As the protective film, a silicon nitride film, a silicon nitride oxide film, a DLC (Diamond-Like Carbon) film, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

A connection terminal electrode 4515 is formed from the same conductive film as the first electrode 4517 included in the light-emitting element 4511, and a terminal electrode 4516 is formed from the same conductive film as the source and drain electrode layers included in the thin film transistor 4509.

The connection terminal electrode 4515 is electrically connected to a terminal included in the FPC (Flexible Printed Circuit) 4518a through an anisotropic conductive film 4519.

The substrate located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. For example, nitrogen is used as the filler.

In addition, if needed, an optical film such as a polarizing plate, a circularly polarizing plate (including an elliptically polarizing plate), or a retardation plate (a quarter-wave plate or a half-wave plate) may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The sealant can be deposited using a screen printing method, an ink-jet apparatus, or a dispensing apparatus. As the sealant, typically, a material containing a visible light curable resin, an ultraviolet curable resin, or a thermosetting resin can be used. Further, a filler may be contained.

The signal line driver circuits 4503a and 4503b and the scan line driver circuits 4504a and 4504b may be mounted as driver circuits formed using a single crystal semiconductor film or a polycrystalline semiconductor film over a substrate separately prepared. Alternatively, only the signal line driver circuits or part thereof, or only the scan line driver circuits or part thereof may be separately formed and mounted. This embodiment is not limited to the structure illustrated in FIGS. 10A and 10B.

Through the above process, a highly reliable light-emitting display device (display panel) as a semiconductor device can be manufactured.

This embodiment can be implemented in appropriate combination with any of the other embodiments.

Embodiment 8

The appearance and a cross section of a liquid crystal display panel, which is one embodiment of a semiconductor device, will be described with reference to FIGS. 16A to 16C. FIGS. 16A and 16C are plan views of panels in which thin film transistors 4010 and 4011 and a liquid crystal element 4013 are sealed between a first substrate 4001 and a second substrate 4006 with a sealant 4005. FIG. 16B is a cross-sectional view taken along M-N in FIG. 16A or FIG. 16C.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that there is no particular limitation on the connection method of the driver circuit which is separately formed, and a COG (Chip On Glass) method, a wire bonding method, a TAB (Tape Automated Bonding) method, or the like can be used. FIG. 16A illustrates an example in which the signal line driver circuit 4003 is mounted by a COG method. FIG. 16C illustrates an example in which the signal line driver circuit 4003 is mounted by a TAB method.

The pixel portion 4002 and the scan line driver circuit 4004 provided over the first substrate 4001 include a plurality of thin film transistors. FIG. 16B illustrates the thin film transistor 4010 included in the pixel portion 4002 and the thin film transistor 4011 included in the scan line driver circuit 4004, as an example. Insulating layers 4041, 4042, 4020, and 4021 are provided over the thin film transistors 4010 and 4011.

Any of the thin film transistors of Embodiments 1 to 5 can be used as appropriate as the thin film transistors 4010 and 4011, and they can be formed using steps and materials similar to those for the thin film transistors of Embodiments 1 to 5.

The thin film transistors 4010 and 4011 each include a mixed region between the oxide semiconductor layer and the silicon oxide layer. In addition, since the silicon oxide ($SiO_x$, x is preferably 2 or larger) layer including defects (preferably, many oxygen dangling bonds) is stacked and heat treatment is performed, hydrogen or water included in the oxide semiconductor layer is diffused into the silicon oxide layer and hydrogen or water is reduced in the oxide semiconductor layer. Therefore, the thin film transistors 4010 and 4011 are highly reliable thin film transistors. In this embodiment, the thin film transistors 4010 and 4011 are n-channel thin film transistors.

A conductive layer 4040 is provided over part of the insulating layer 4021, which overlaps with a channel formation region of an oxide semiconductor layer in the thin film transistor 4011 for the driver circuit. The conductive layer 4040 is provided in the position overlapping with the channel formation region of the oxide semiconductor layer, whereby the amount of change in threshold voltage of the thin film transistor 4011 before and after the BT test can be reduced. A potential of the conductive layer 4040 may be the same or different from that of a gate electrode layer of the thin film transistor 4011. The conductive layer 4040 can also function as a second gate electrode layer. Further, the potential of the conductive layer 4040 may be GND or 0 V, or the conductive layer 4040 may be in a floating state.

A pixel electrode layer 4030 included in the liquid crystal element 4013 is electrically connected to a source or drain electrode layer of the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 functioning as alignment films, respectively, and the liquid crystal layer 4008 is sandwiched between the electrode layers with the insulating layers 4032 and 4033 therebetween.

Note that a light-transmitting substrate can be used as the first substrate 4001 and the second substrate 4006; glass, ceramics, or plastics can be used. The plastic may be a fiberglass-reinforced plastics (FRP) plate, a polyvinyl fluoride (PVF) film, a polyester film, or an acrylic resin film.

Reference numeral 4035 denotes a columnar spacer obtained by selective etching of an insulating film, and the columnar spacer is provided in order to control the distance (a cell gap) between the pixel electrode layer 4030 and the counter electrode layer 4031. Alternatively, a spherical spacer may be used as the spacer 4035. The counter electrode layer 4031 is electrically connected to a common potential line formed over the substrate where the thin film transistor 4010 is formed. The counter electrode layer 4031 and the common potential line can be electrically connected to each other through conductive particles provided between the pair of substrates using the common connection portion. Note that the conductive particles are included in the sealant 4005.

Alternatively, a liquid crystal exhibiting a blue phase for which an alignment film is unnecessary may be used. A blue phase is one of liquid crystal phases, and is generated just before a cholesteric phase changes into an isotropic phase while the temperature of cholesteric liquid crystal is increased. Since the blue phase is only generated within a narrow range of temperature, a liquid crystal composition containing a chiral agent at 5 wt % or more is used for the liquid crystal layer 4008 in order to improve the temperature range. The liquid crystal composition including liquid crystal exhibiting a blue phase and a chiral agent has a short response time of 1 msec or less and is optically isotropic; therefore, alignment treatment is not necessary and viewing angle dependence is small. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased. A thin film transistor that uses an oxide semiconductor layer particularly has a possibility that electric characteristics of the thin film transistor may fluctuate significantly by the influence of static electricity and deviate from the designed range. Therefore, it is more effective to use a blue phase liquid crystal material for a liquid crystal display device including a thin film transistor that uses an oxide semiconductor layer.

Note that this embodiment can also be applied to a transflective liquid crystal display device in addition to a transmissive liquid crystal display device.

Although a polarizing plate is provided on the outer surface of the substrate (on the viewer side) and a coloring layer and an electrode layer used for a display element are sequentially provided on the inner surface of the substrate in the example of the liquid crystal display device, the polarizing plate may be provided on the inner surface of the substrate. The stacked structure of the polarizing plate and the coloring layer is not limited to that in this embodiment and may be set as appropriate depending on materials of the polarizing plate and the coloring layer or conditions of the manufacturing process. Further, a light-blocking film serving as a black matrix may be provided in a portion other than the display portion.

Over the thin film transistors 4011 and 4010, the insulating layer 4041 is formed in contact with the oxide semiconductor layers. The insulating layer 4041 can be formed using a material and a method similar to those of the silicon oxide layer 116 described in Embodiment 1. Here, as the insulating layer 4041, a silicon oxide layer containing defects is formed by a sputtering method as in Embodiment 1. Further, the protective insulating layer 4042 is formed on and in contact with the insulating layer 4041. The protective insulating layer 4042 can be formed in a manner similar to that of the protective insulating layer 103 described in Embodiment 1, and a silicon nitride film can be used, for example. In order to reduce the surface roughness caused by the thin film transistors, the insulating layer 4021 serving as a planarization insulating film is formed to cover the protective insulating layer 4042.

The insulating layer 4021 is formed as a planarization insulating film. As the insulating layer 4021, an organic material having heat resistance such as polyimide, acrylic, benzocyclobutene, polyamide, or epoxy can be used. Other than such organic materials, it is possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed of these materials.

There is no particular limitation on the method for forming the insulating layer 4021. The insulating layer 4021 can be formed, depending on the material, by a method such as a sputtering method, an SOG method, a spin coating method, a dipping method, a spray coating method, or a droplet discharge method (e.g., an ink-jet method, screen printing, or offset printing), or a tool (equipment) such as a doctor knife, a roll coater, a curtain coater, or a knife coater. A baking step of the insulating layer 4021 also serves as annealing of the semiconductor layer, whereby a semiconductor device can be manufactured efficiently.

The pixel electrode layer 4030 and the counter electrode layer 4031 can be formed from a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added.

A conductive composition containing a conductive molecule of high molecular weight (also referred to as a conductive polymer) can be used for the pixel electrode layer 4030 and the counter electrode layer 4031. The pixel electrode formed using the conductive composition preferably has a sheet resistance of less than or equal to 10000 ohms per square and a transmittance of greater than or equal to 70% at a wavelength of 550 nm Further, the resistivity of the conductive polymer contained in the conductive composition is preferably less than or equal to 0.1 Ω·cm.

As the conductive polymer, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Further, a variety of signals and potentials are supplied to the signal line driver circuit 4003 which is formed separately, the scan line driver circuit 4004, or the pixel portion 4002 from an FPC 4018.

A connection terminal electrode 4015 is formed from the same conductive film as the pixel electrode layer 4030 included in the liquid crystal element 4013, and a terminal electrode 4016 is formed from the same conductive film as source and drain electrode layers of the thin film transistors 4010 and 4011.

The connection terminal electrode 4015 is electrically connected to a terminal included in the FPC 4018 through an anisotropic conductive film 4019.

Note that FIGS. 16A to 16C illustrate an example in which the signal line driver circuit 4003 is formed separately and mounted on the first substrate 4001; however, the present invention is not limited to this structure. The scan line driver circuit may be separately formed and then mounted, or only part of the signal line driver circuit or part of the scan line driver circuit may be separately formed and then mounted.

A black matrix (a light-blocking layer), an optical element (an optical substrate) such as a polarizing member, a retardation member, or an anti-reflection member, and the like are provided as appropriate. For example, circular polarization may be employed by using a polarizing substrate and a retardation substrate. In addition, a backlight, a sidelight, or the like may be used as a light source.

In an active matrix liquid crystal display device, display patterns are formed on a screen by driving of pixel electrodes that are arranged in matrix. Specifically, voltage is applied between a selected pixel electrode and a counter electrode corresponding to the pixel electrode, and thus, a liquid crystal layer disposed between the pixel electrode and the counter electrode is optically modulated. This optical modulation is recognized as a display pattern by a viewer.

A liquid crystal display device has a problem in that, when displaying a moving image, image sticking occurs or the moving image is blurred because the response speed of liquid crystal molecules themselves is low. As a technique for improving moving image characteristics of a liquid crystal display device, there is a driving technique so-called black insertion by which an entirely black image is displayed every other frame.

Alternatively, a driving method called double-frame rate driving may be employed in which a vertical synchronizing frequency is 1.5 times or more, preferably 2 times or more as high as a normal vertical synchronizing frequency, whereby moving image characteristics are improved.

Furthermore, as a technique for improving moving image characteristics of a liquid crystal display device, there is another driving technique in which, as a backlight, a surface light source including a plurality of LED (light-emitting diode) light sources or a plurality of EL light sources is used, and each light source included in the surface light source is independently driven so as to perform intermittent lighting in one frame period. As the surface light source, three or more kinds of LEDs may be used, or a white-light-emitting LED may be used. Since a plurality of LEDs can be controlled independently, the timing at which the LEDs emit light can be synchronized with the timing at which optical modulation of a liquid crystal layer is switched. In this driving technique, part of LEDs can be turned off. Therefore, especially in the case of displaying an image in which the proportion of a black image area in one screen is high, a liquid crystal display device can be driven with low power consumption.

When combined with any of these driving techniques, a liquid crystal display device can have better display characteristics such as moving image characteristics than conventional liquid crystal display devices.

Since the thin film transistor is easily broken due to static electricity or the like, the protective circuit is preferably provided over the same substrate as the pixel portion and the driver circuit portion. The protective circuit is preferably formed using a non-linear element including an oxide semiconductor layer. For example, a protective circuit is provided between the pixel portion, and a scan line input terminal and a signal line input terminal In this embodiment, a plurality of protective circuits are provided so that the pixel transistor and the like are not broken when surge voltage due to static electricity or the like is applied to the scan line, the signal line, or a capacitor bus line. Accordingly, the protective circuit has a structure for releasing charge to a common wiring when surge voltage is applied to the protective circuit. The protective circuit includes non-linear elements which are arranged in parallel between the scan line and the common wiring. Each of the non-linear elements includes a two-terminal element such as a diode or a three-terminal element such as a transistor. For example, the non-linear element can be formed through the same steps as the thin film transistor of the pixel portion. For example, characteristics similar to those of a diode can be achieved by connecting a gate terminal to a drain terminal.

Further, for the liquid crystal display module, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

There is no particular limitation in the semiconductor device disclosed in this specification, and a liquid crystal display device including a TN liquid crystal, an OCB liquid crystal, an STN liquid crystal, a VA liquid crystal, an ECB liquid crystal, a GH liquid crystal, a polymer dispersed liquid crystal, a discotic liquid crystal, or the like can be used. In particular, a normally black liquid crystal panel such as a transmissive liquid crystal display device utilizing a vertical alignment (VA) mode is preferable. Some examples are given as a vertical alignment mode. For example, an MVA (multi-domain vertical alignment) mode, a PVA (patterned vertical alignment) mode, an ASV mode, or the like can be employed.

An example of a VA liquid crystal display device is described below.

The VA liquid crystal display device has a kind of form in which alignment of liquid crystal molecules in a liquid crystal display panel is controlled. In the VA liquid crystal display device, liquid crystal molecules are aligned in a vertical direction with respect to a panel surface when no voltage is applied. In this embodiment, in particular, a pixel is divided into some regions (subpixels), and molecules are aligned in different directions in their respective regions. This is referred to as multi-domain or multi-domain design. Hereinafter, a liquid crystal display device of multi-domain design is described.

Figure 12:
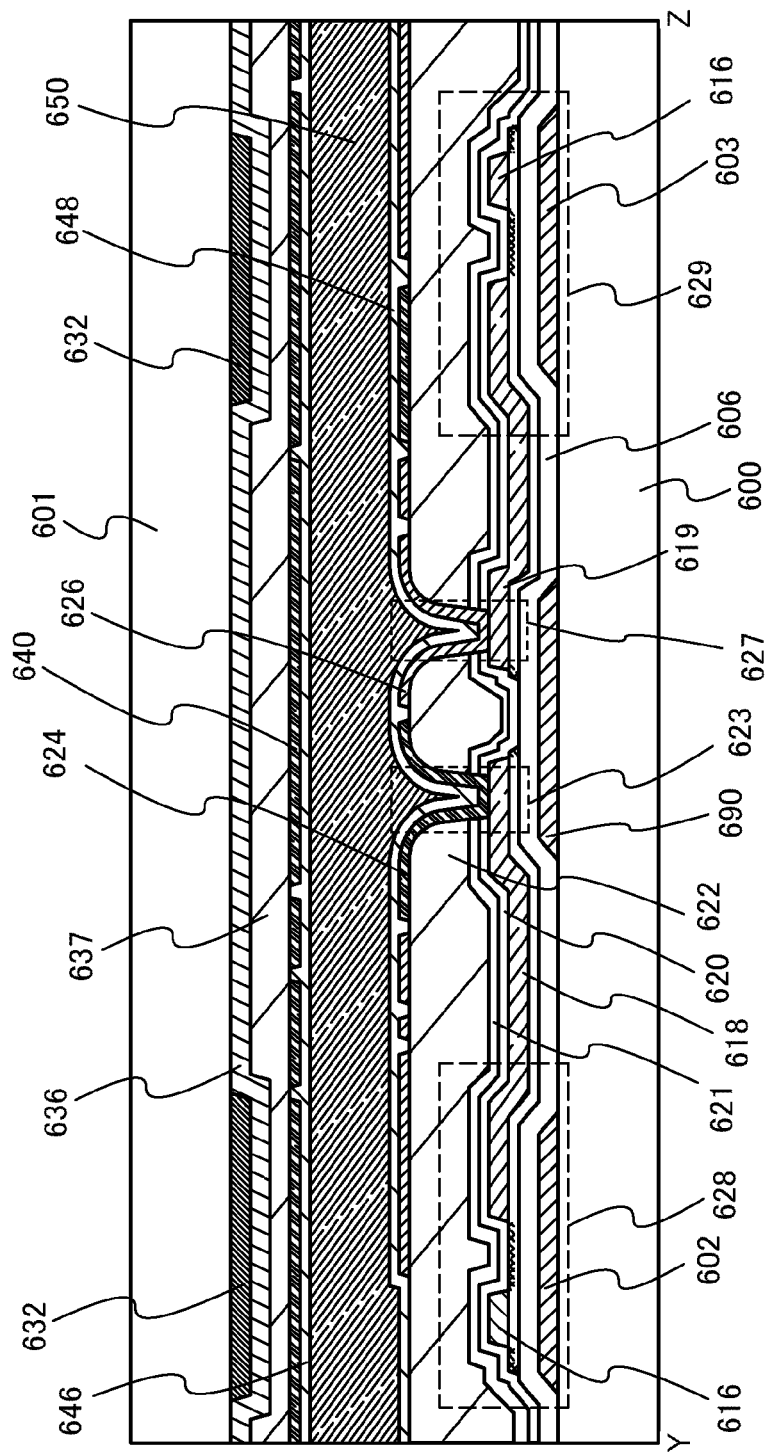
FIG. 12 illustrates a semiconductor device.
Figure 13:
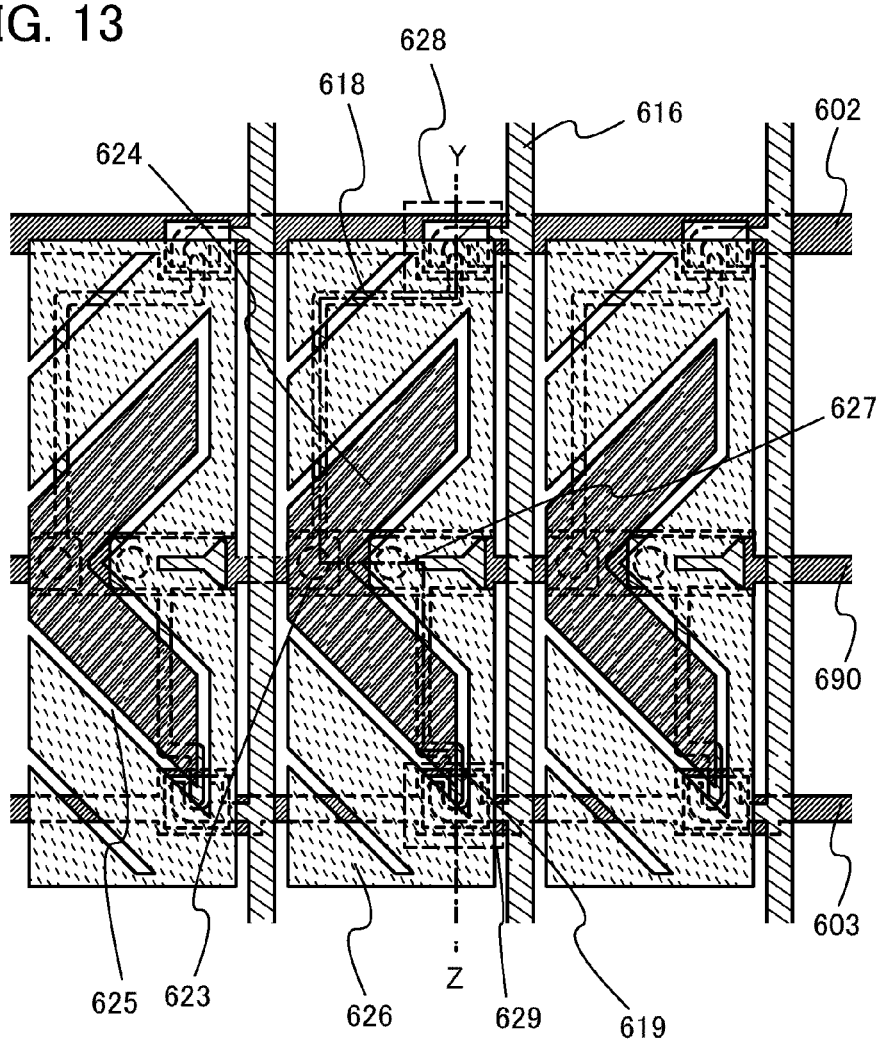
FIG. 13 illustrates a semiconductor device.

FIG. 12 and FIG. 13 illustrate a pixel structure of a VA liquid crystal display panel. FIG. 13 is a plan view of a substrate 600, and FIG. 12 illustrates a cross-sectional structure along line Y-Z in FIG. 13. Description below will be given with reference to both the drawings.

In this pixel structure, a plurality of pixel electrode layers are provided in one pixel, and a TFT is connected to each pixel electrode layer. The plurality of TFTs are constructed so as to be driven by different gate signals. That is, signals that are applied to individual pixel electrode layers in a multi-domain pixel are controlled independently of each other.

Via a contact hole 623 which penetrates an insulating film 620, an insulating film 621 and an insulating film 622, a pixel electrode layer 624 is connected to a TFT 628 through a wiring 618. Further, via a contact hole 627 which penetrates the insulating film 620 and the insulating film 622, a pixel electrode 626 is connected to a TFT 629 through a wiring 619. A gate wiring 602 of the TFT 628 is separated from a gate wiring 603 of the TFT 629 so that different gate signals can be supplied to these gate wirings. On the other hand, a wiring 616 serving as a data line is shared by the TFTs 628 and 629. The thin film transistor described in any of Embodiments 1 to 5 can be used as the TFTs 628 and 629 as appropriate. Note that a gate insulating layer 606 is formed over the gate wiring 602 and the gate wiring 603.

Further, a storage capacitor is formed using a capacitor wiring 690, the gate insulating layer 606 as a dielectric, and the pixel electrode or a capacitor electrode electrically connected to the pixel electrode.

Figure 15:
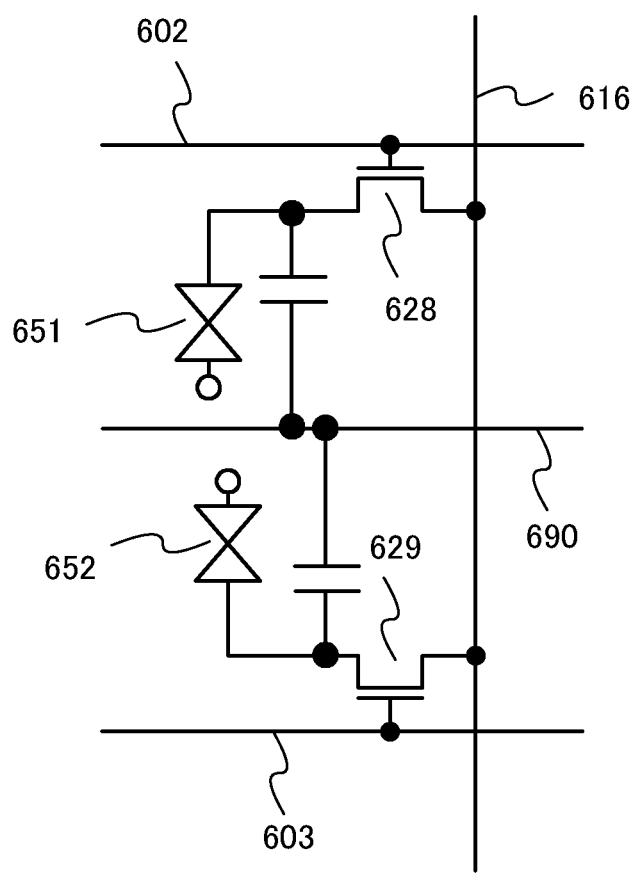
FIG. 15 is an equivalent circuit diagram of a pixel in a semiconductor device.

The shape of the pixel electrode layer 624 is different from that of the pixel electrode layer 626, and the pixel electrode layers are separated by slits 625. The pixel electrode layer 626 is formed so as to surround the external side of the pixel electrode layer 624 which has a V-shape. The TFTs 628 and 629 make the timing of applying voltages to the pixel electrode layers 624 and 626 different from each other, thereby controlling alignment of liquid crystals. FIG. 15 shows an equivalent circuit of this pixel structure. The TFT 628 and the TFT 629 are each connected to the wiring 616. When different gate signals are supplied to the gate wirings 602 and 603, operations of liquid crystal elements 651 and 652 can be made different. In other words, when operations of the TFTs 628 and 629 are individually controlled, alignment of liquid crystals can be precisely controlled; accordingly, viewing angle can be increased.

Figure 14:
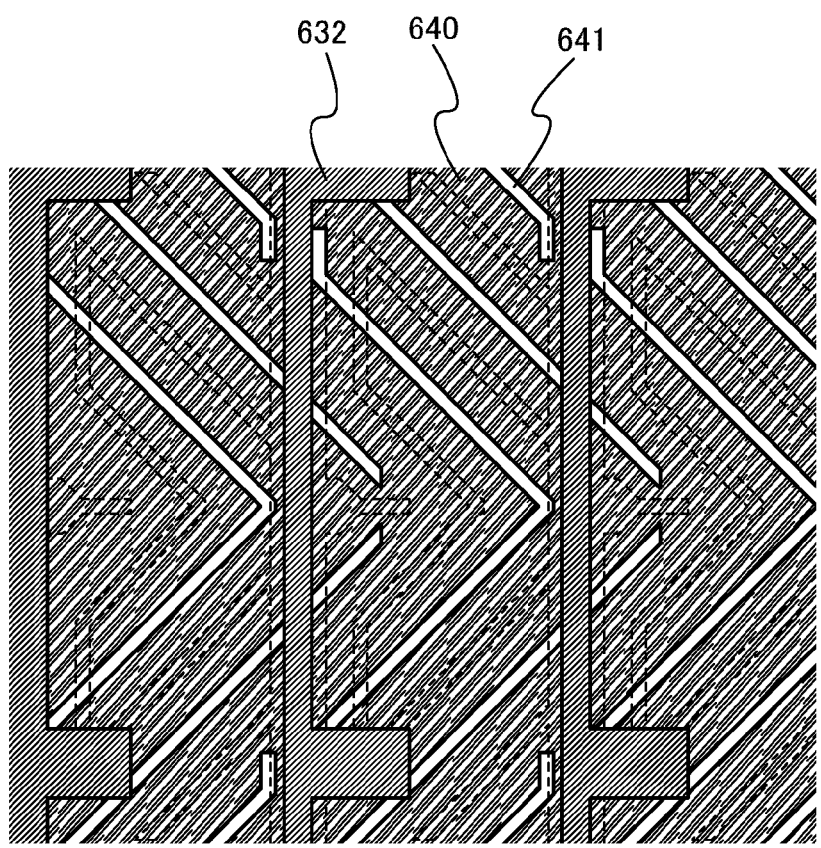
FIG. 14 illustrates a semiconductor device.

A counter substrate 601 is provided with a light blocking film 632, a coloring film 636, and a counter electrode layer 640. In addition, a planarization film 637 which is also referred to as an overcoat film is formed between the coloring film 636 and the counter electrode layer 640 to prevent alignment disorder of liquid crystals. FIG. 14 illustrates a structure of the counter substrate side. The counter electrode layer 640 is shared by plural pixels, and slits 641 are formed in the counter electrode layer 640. The slits 641 and the slits on the pixel electrode layers 624 and 626 side are alternately arranged so that an oblique electric field is effectively generated, whereby the alignment of the liquid crystals can be controlled. Accordingly, the alignment of the liquid crystals can be varied in different places, so that the viewing angle is widened.

The counter electrode layer 640 is a first counter electrode layer provided in a pixel portion and has the same potential as the second counter electrode layer which has an opening pattern and is provided in a driver circuit portion. When the second counter electrode layer having an opening pattern is provided in the driver circuit portion, a highly reliable semiconductor device with low power consumption can be manufactured.

The pixel electrode layer 624, a liquid crystal layer 650, and the counter electrode layer 640 overlap with each other, so that a first liquid crystal element is formed. Further, the pixel electrode layer 626, the liquid crystal layer 650, and the counter electrode 640 overlap with each other, so that a second liquid crystal element is formed. The multi-domain structure is employed in which the first liquid crystal element and the second liquid crystal element are provided for one pixel.

This embodiment can be implemented in appropriate combination with any of the other embodiments.

Embodiment 9

In this embodiment, an example of electronic paper will be described as a semiconductor device which is an embodiment of the present invention.

Figure 11:
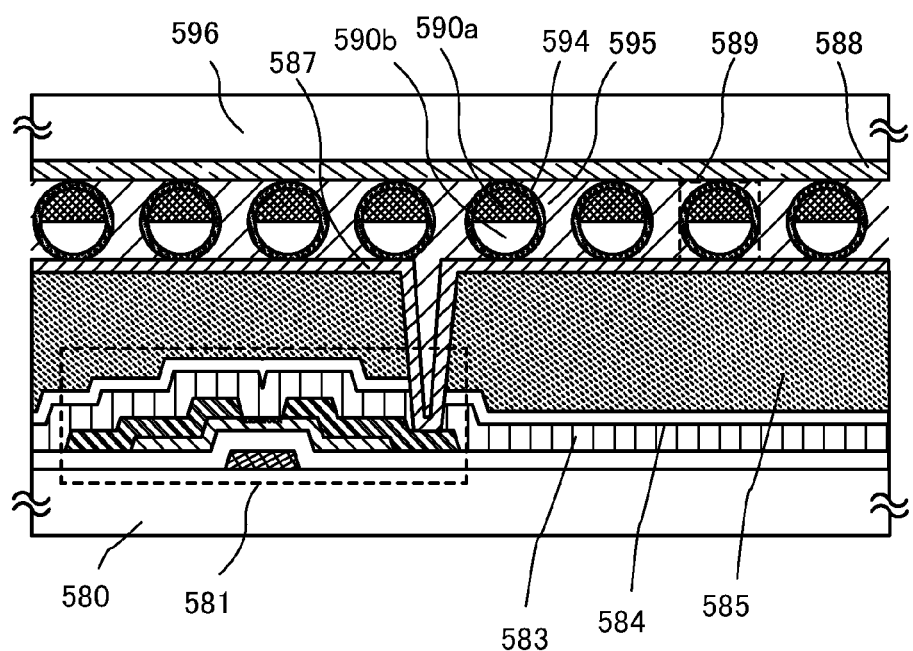
FIG. 11 illustrates a semiconductor device.

FIG. 11 illustrates active matrix electronic paper as an example of the semiconductor device to which an embodiment of the present invention is applied. A thin film transistor 581 used for the semiconductor device can be any of the thin film transistors described in Embodiments 1 to 5 and can be manufactured using steps and materials similar to those of any of the thin film transistors described in Embodiments 1 to 5. The thin film transistor 581 includes a mixed region between the oxide semiconductor layer and the silicon oxide layer. In addition, since the silicon oxide ($SiO_x$, x is preferably 2 or larger) layer including defects (preferably, many oxygen dangling bonds) is stacked and heat treatment is performed, hydrogen or water included in the oxide semiconductor layer is diffused into the silicon oxide layer and hydrogen or water is reduced in the oxide semiconductor layer. Therefore, the thin film transistor 581 is a highly reliable thin film transistor.

The electronic paper in FIG. 11 is an example of a display device using a twisting ball display system. The twisting ball display system refers to a method in which spherical particles each colored in black and white are used for a display element and arranged between a first electrode layer and a second electrode layer which are electrode layers, and a potential difference is generated between the first electrode layer and the second electrode layer to control orientation of the spherical particles, so that display is performed.

The thin film transistor 581 provided over a substrate 580 is a thin film transistor having a bottom-gate structure. A source or drain electrode layer of the thin film transistor 581 is in contact with and electrically connected to a first electrode layer 587 in an opening formed in the silicon oxide layer 583, a protective insulating layer 584, and an insulating layer 585.

Between the first electrode layer 587 and a second electrode layer 588, spherical particles 589 each having a black region 590a, a white region 590b, and a cavity 594 which is filled with liquid around the black region 590a and the white region 590b are provided. A space around the spherical particles 589 is filled with a filler 595 such as a resin (see FIG. 11). In this embodiment, the first electrode layer 587 corresponds to a pixel electrode, and the second electrode layer 588 provided on a counter substrate 596 corresponds to a common electrode.

Instead of the twisting ball, an electrophoretic element can also be used. A microcapsule having a diameter of approximately 10 μm to 200 μm in which transparent liquid, positively-charged white microparticles, and negatively-charged black microparticles are encapsulated is used. In the microcapsule which is provided between the first electrode layer and the second electrode layer, when an electric field is applied by the first electrode layer and the second electrode layer, the white microparticles and the black microparticles move to opposite sides from each other, so that white or black can be displayed. A display element using this principle is an electrophoretic display element and is generally called electronic paper. The electrophoretic display element has higher reflectance than a liquid crystal display element, and thus an auxiliary light is unnecessary, power consumption is low, and a display portion can be recognized even in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through the above-described process, highly reliable electronic paper as a semiconductor device can be manufactured.

This embodiment can be implemented in appropriate combination with any of the other embodiments.

Embodiment 10

A semiconductor device disclosed in this specification can be applied to a variety of electronic appliances (including amusement machines). Examples of electronic appliances include television sets (also referred to as televisions or television receivers), monitors of computers or the like, cameras such as digital cameras or digital video cameras, digital photo frames, cellular phones (also referred to as mobile phones or mobile phone sets), portable game consoles, portable information terminals, audio reproducing devices, large-sized game machines such as pachinko machines, and the like.

Figure 17A:
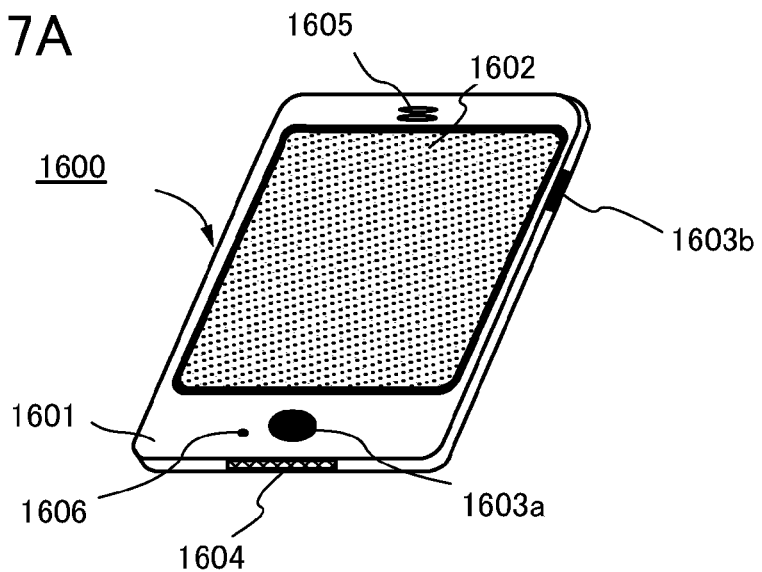
FIGS. 17A and 17B each illustrate an electronic appliance.

FIG. 17A illustrates an example of a cellular phone. A cellular phone 1600 is provided with a display portion 1602 incorporated in a housing 1601, operation buttons 1603a and 1603b, an external connection port 1604, a speaker 1605, a microphone 1606, and the like.

When the display portion 1602 of the cellular phone 1600 illustrated in FIG. 17A is touched with a finger or the like, data can be input into the cellular phone 1600. Further, operations such as making calls and composing mails can be performed by touching the display portion 1602 with a finger or the like.

There are mainly three screen modes of the display portion 1602. The first mode is a display mode mainly for displaying an image. The second mode is an input mode mainly for inputting data such as text. The third mode is a display-and-input mode in which two modes of the display mode and the input mode are combined.

For example, in the case of making a call or composing a mail, a text input mode mainly for inputting text is selected in the display portion 1602 so that text displayed on a screen can be input. In this case, it is preferable to display a keyboard or number buttons on almost all area of the screen of the display portion 1602.

When a detection device including a sensor for detecting inclination, such as a gyroscope or an acceleration sensor, is provided inside the cellular phone 1600, display of the screen on the display portion 1602 can be automatically switched by determining the direction of the cellular phone 1600 (whether the cellular phone 1600 is placed horizontally or vertically for a landscape mode or a portrait mode).

The screen modes are switched by touching the display portion 1602 or operating the operation buttons 1603*a* and 1603*b* of the housing 1601. Alternatively, the screen modes may be switched depending on the kind of the image displayed on the display portion 1602. For example, when a signal of an image displayed on the display portion is a signal of moving image data, the screen mode is switched to the display mode. When the signal is a signal of text data, the screen mode is switched to the input mode.

Further, in the input mode, when input by touching the display portion 1602 is not performed for a certain period while a signal detected by the optical sensor in the display portion 1602 is detected, the screen mode may be controlled so as to be switched from the input mode to the display mode.

The display portion 1602 may function as an image sensor. For example, an image of the palm print, the fingerprint, or the like is taken by touching the display portion 1602 with the palm or the finger, whereby personal authentication can be performed. Further, by providing a backlight or sensing light source emitting a near-infrared light for the display portion, an image of a finger vein, a palm vein, or the like can be taken.

Any of the semiconductor devices described in the above embodiments can be applied to the display portion 1602. For example, a plurality of thin film transistors described in the above embodiments can be disposed as switching elements in pixels.

Figure 17B:
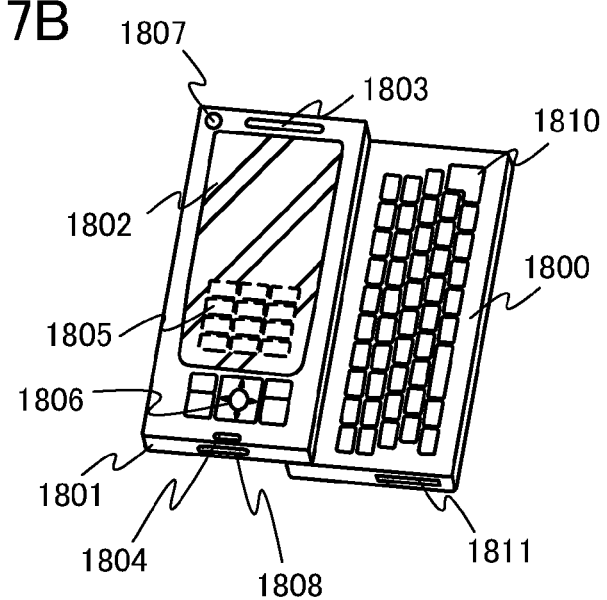

FIG. 17B also illustrates an example of a mobile phone. A portable information terminal such as the one illustrated in FIG. 17B can have a plurality of functions. For example, in addition to a telephone function, such a portable information terminal can have a function of processing a variety of pieces of data by incorporating a computer.

The portable information terminal illustrated in FIG. 17B has a housing 1800 and a housing 1801. The housing 1801 includes a display panel 1802, a speaker 1803, a microphone 1804, a pointing device 1806, a camera lens 1807, an external connection terminal 1808, and the like. The housing 1800 includes a keyboard 1810, an external memory slot 1811, and the like. In addition, an antenna is incorporated in the housing 1800.

The display panel 1802 is provided with a touch panel. A plurality of operation keys 1805 which is displayed as images is illustrated by dashed lines in FIG. 17B.

Further, in addition to the above structure, a contactless IC chip, a small memory device, or the like may be incorporated.

Any of the semiconductor devices described in the above embodiments can be used for the display panel 1802 and the direction of display is changed appropriately depending on an application mode. Further, the camera lens 1807 is provided on the same surface as the display panel 1802, and thus a videophone is realized. The speaker 1803 and the microphone 1804 can be used for videophone calls, recording, and playing sound, etc. as well as voice calls. Moreover, the housings 1800 and 1801 in a state where they are developed as illustrated in FIG. 17B can shift so that one is lapped over the other by sliding; therefore, the size of the portable information terminal can be reduced, which makes the portable information terminal suitable for being carried.

The external connection terminal 1808 can be connected to an AC adapter and various types of cables such as a USB cable, and charging and data communication with a personal computer are possible. Moreover, a storage medium can be inserted into the external memory slot 1811 so that a large amount of data can be stored and can be moved.

Further, in addition to the above functions, an infrared communication function, a television reception function, or the like may be provided.

Figure 18A:
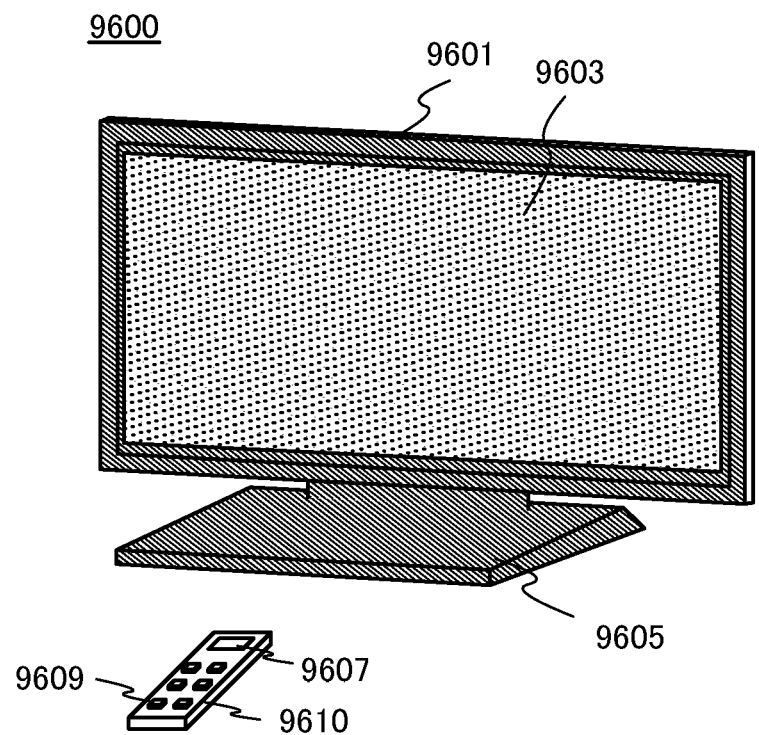
FIGS. 18A and 18B each illustrate an electronic appliance.

FIG. 18A illustrates an example of a television set. In a television set 9600, a display portion 9603 is incorporated in a housing 9601. Images can be displayed on the display portion 9603. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

Any of the semiconductor devices described in the above embodiments can be applied to the display portion 9603. For example, a plurality of thin film transistors described in the above embodiments can be disposed as switching elements in pixels.

Figure 18B:
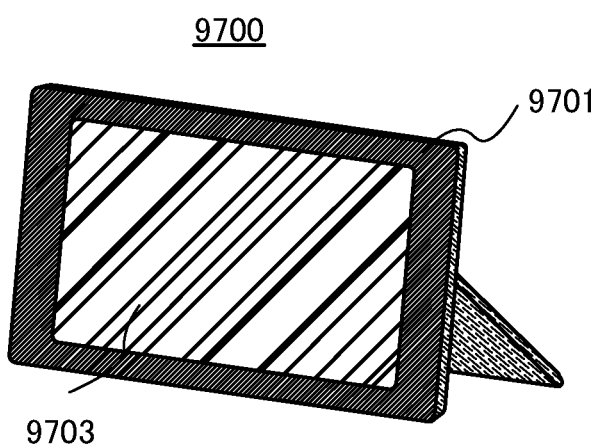

FIG. 18B illustrates an example of a digital photo frame. For example, in a digital photo frame 9700, a display portion 9703 is incorporated in a housing 9701. Various images can be displayed on the display portion 9703. For example, the display portion 9703 can display data of an image shot by a digital camera or the like to function as a normal photo frame.

Any of the semiconductor devices described in the above embodiments can be applied to the display portion 9703. For example, a plurality of thin film transistors described in the above embodiments can be disposed as switching elements in pixels.

Note that the digital photo frame 9700 is provided with an operation portion, an external connection terminal (a USB terminal, a terminal that can be connected to various cables such as a USB cable, or the like), a recording medium insertion portion, and the like. Although they may be provided on the same surface as the display portion, they are preferably provided on the side surface or the back surface for the design of the digital photo frame 9700. For example, a memory that stores data of an image shot by a digital camera is inserted into the recording medium insertion portion of the digital photo frame, whereby the image data can be transferred and displayed on the display portion 9703.

The digital photo frame 9700 may have a configuration capable of wirelessly transmitting and receiving data. Through wireless communication, desired image data can be transferred to be displayed.

Figure 19:
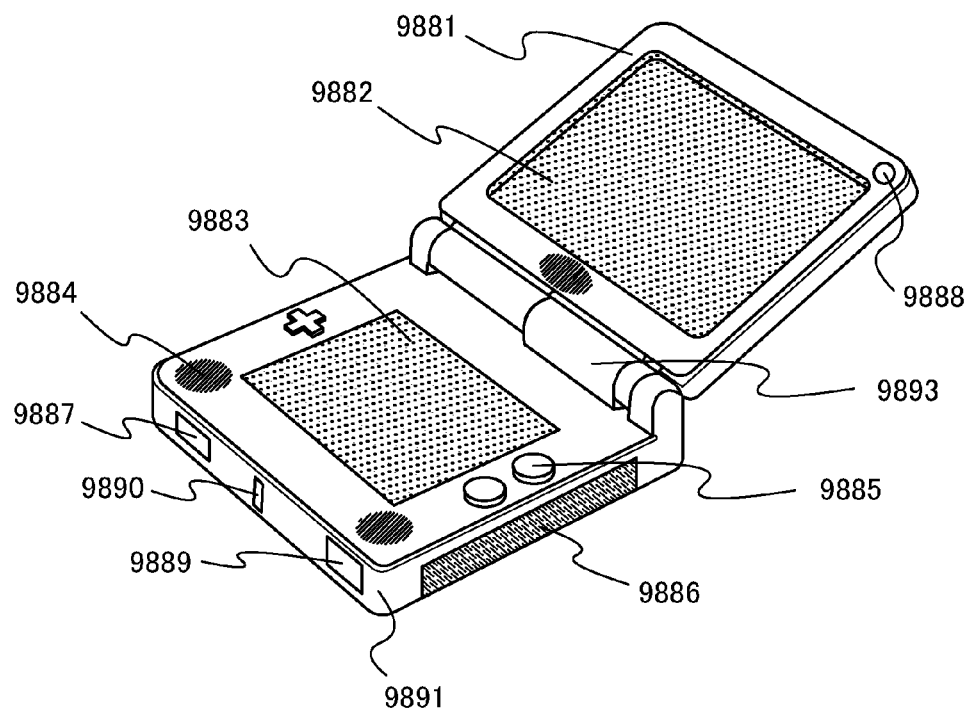
FIG. 19 illustrates an electronic appliance.

FIG. 19 illustrates a portable amusement machine including two housings: a housing 9881 and a housing 9891. The housings 9881 and 9891 are connected with a connection portion 9893 so as to be opened and closed. A display portion 9882 and a display portion 9883 are incorporated in the housing 9881 and the housing 9891, respectively.

Any of the semiconductor devices described in the above embodiments can be applied to the display portion 9883. For example, a plurality of thin film transistors described in the above embodiments can be disposed as switching elements in pixels.

In addition, the portable amusement machine illustrated in FIG. 19 includes a speaker portion 9884, a recording medium insertion portion 9886, an LED lamp 9890, an input unit (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9889), and the like. It is needless to say that the structure of the portable amusement machine is not limited to the above and other structures provided with at least a thin film transistor disclosed in this specification can be employed. The portable amusement machine may include other accessory equipment as appropriate. The portable amusement machine illustrated in FIG. 19 has a function of reading a program or data stored in a recording medium to display it on the display portion, and a function of sharing information with another portable amusement machine by wireless communication. The portable amusement machine illustrated in FIG. 19 can have various functions without limitation to the above.

Figure 21:
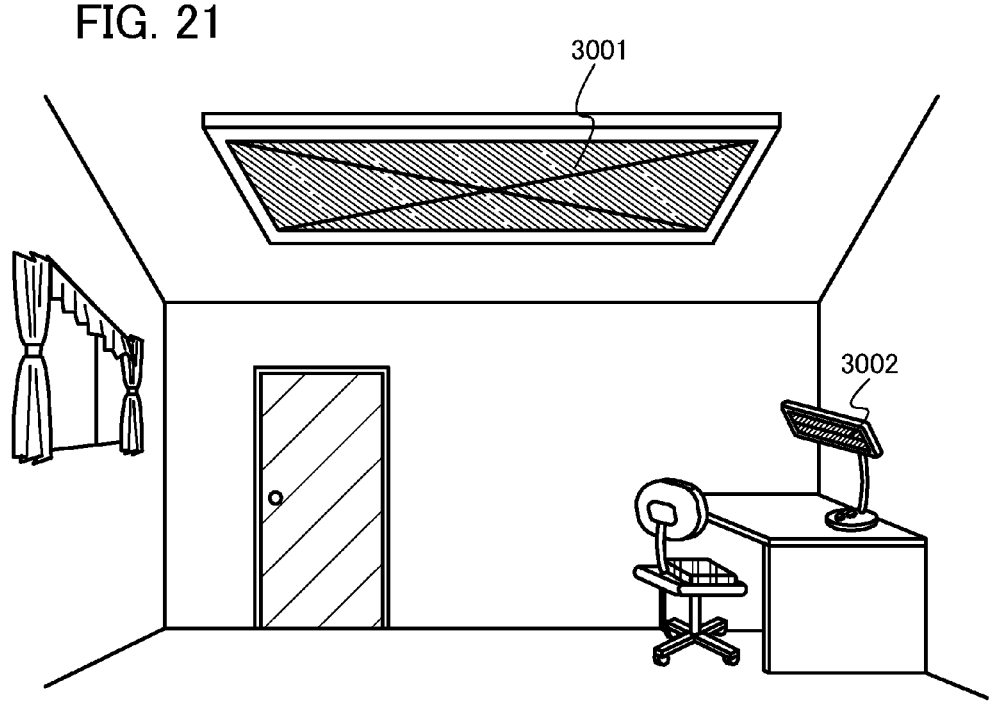
FIG. 21 illustrates electronic appliances.

FIG. 21 illustrates an example in which the light-emitting device which is an example of the semiconductor device formed using any of the above embodiments is used as an indoor lighting device 3001. Since the light-emitting device described in this specification can be increased in area, the light-emitting device can be used as a lighting device having a large area. In addition, any of the light-emitting devices described in the above embodiments can be also used as a desk lamp 3002. Note that lighting equipment includes, in its category, a wall light, a lighting device in a car, a guide light and the like, as well as a ceiling light and a desk lamp.

In the above-described manner, the semiconductor device described in any of Embodiments 1 to 9 can be applied to a display panel of a variety of electronic appliances such as the ones described above, whereby highly reliable electronic appliances can be provided.

Embodiment 11

A semiconductor device disclosed in this specification can be applied to electronic paper. Electronic paper can be used for electronic appliances of a variety of fields as long as they can display data. For example, electronic paper can be applied to display portions of an e-book (electronic book) reader, a poster, an advertisement in a vehicle such as a train, various cards such as a credit card, and the like. An example of the electronic appliances is illustrated in FIG. 20.

Figure 20:
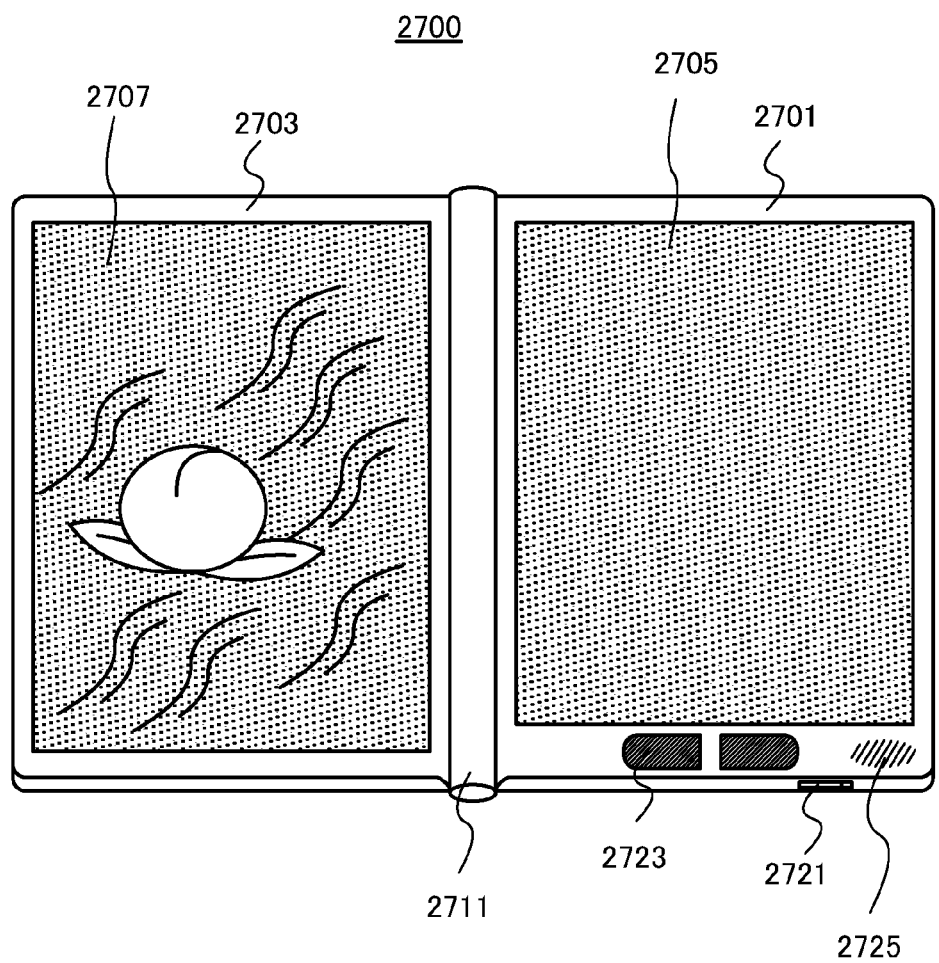
FIG. 20 illustrates an electronic appliance.

FIG. 20 illustrates an example of an electronic book reader. For example, an electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 20) and images can be displayed on a display portion on the left side (the display portion 2707 in FIG. 20).

FIG. 20 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to an AC adapter or various cables such as a USB cable, or the like), a recording medium insertion portion, or the like may be provided on the back surface or the side surface of the housing. Moreover, the electronic book reader 2700 may have a function of an electronic dictionary.

Further, the electronic book reader 2700 may send and receive information wirelessly. Through wireless communication, desired book data or the like can be purchased and downloaded from an electronic book server.

This embodiment can be implemented in appropriate combination with any of the other embodiments.

This application is based on Japanese Patent Application serial no. 2009-231966 filed with Japan Patent Office on Oct. 5, 2009, the entire contents of which are hereby incorporated by reference.

EXPLANATION OF REFERENCE

100: substrate, 101: gate electrode layer, 102: gate insulating layer, 103: protective insulating layer, 110: thin film transistor, 111: gate electrode layer, 112: oxide semiconductor layer, 115*a*: source electrode layer, 115*b*: drain electrode layer, 116: silicon oxide layer, 118*a*: oxide conductive layer, 118*b*: oxide conductive layer, 119: mixed region, 120: oxide semiconductor film, 121: oxide semiconductor layer, 130: thin film transistor, 140: substrate, 141: oxide semiconductor layer, 142: gate insulating layer, 150: substrate, 151: gate electrode layer, 152: gate insulating layer, 153: protective insulating layer, 160: thin film transistor, 162: oxide semiconductor layer, 165*a*: source electrode layer, 165*b*: drain electrode layer, 166: silicon oxide layer, 171: oxide semiconductor layer, 173: silicon oxide layer, 179: mixed region, 181: gate electrode layer, 183: protective insulating layer, 190: thin film transistor, 192: oxide semiconductor layer, 195*a*: source electrode layer, 195*b*: drain electrode layer, 196: silicon oxide layer, 199: mixed region, 580: substrate, 581: thin film transistor, 583: silicon oxide layer, 584: protective insulating layer, 585: insulating layer, 587: electrode layer, 588: electrode layer, 589: spherical particle, 590*a*: black region, 590*b*: white region, 594: cavity, 595: filler, 596: counter substrate, 600: substrate, 601: counter substrate, 602: gate wiring, 603: gate wiring, 606: gate insulating layer, 616: wiring, 618: wiring, 619: wiring, 620: insulating film, 621: insulating film, 622: insulating film, 623: contact hole, 624: pixel electrode layer, 625: slit, 626: pixel electrode layer, 627: contact hole, 628: TFT, 629: TFT, 632: light-blocking film, 636: coloring film, 637: planarization film, 640: counter electrode layer, 641: slit, 650: liquid crystal layer, 651: liquid crystal element, 652: liquid crystal element, 690: capacitor wiring, 1000: film formation apparatus, 1100: transfer chamber, 1101: transfer unit, 1110: loading chamber, 1111: cassette, 1120: unloading chamber, 1121: cassette, 1200: transfer chamber, 1201: transfer unit, 1205: exhaustion unit, 1210: treatment chamber, 1211: substrate heating unit, 1215: exhaustion unit, 1220: treatment chamber, 1225: exhaustion unit, 1230: treatment chamber, 1235: exhaustion unit, 1240: treatment chamber, 1245: exhaustion unit, 1600: cellular phone, 1601: housing, 1602: display portion, 1603*a*: operation button, 1603*b*: operation button, 1604: external connection port, 1605: speaker, 1606: microphone, 1800: housing, 1801: housing, 1802: display panel, 1803: speaker, 1804: microphone, 1805: operation keys, 1806: pointing device, 1807: camera lens, 1808: external connection terminal, 1810: keyboard, 1811: external memory slot, 2700: electronic book reader, 2701: housing, 2703: housing, 2705: display portion, 2707: display portion, 2711: hinge, 2721: power switch, 2723: operation key, 2725: speaker, 3000: film formation apparatus, 3001: lighting device, 3002: desk lamp, 3100: transfer chamber, 3101: transfer unit, 3105: exhaustion unit, 3110: loading chamber, 3111: cassette, 3115: exhaustion unit, 3120: unloading chamber, 3121: cassette, 3125: exhaustion unit, 3210: treatment chamber, 3211: substrate heating unit, 3215: exhaustion unit, 3220: treatment chamber, 3225: exhaustion unit, 3230: treatment chamber, 3235: exhaustion unit, 3240: treatment chamber, 3241: substrate heating unit, 3245: exhaustion unit, 3250: treatment chamber, 3251: cooling unit, 3255: exhaustion unit, 4001: substrate, 4002: pixel portion, 4003: signal line driver circuit, 4004: scan line driver circuit, 4005: sealant, 4006: substrate, 4008: liquid crystal layer, 4010: thin film transistor, 4013: liquid crystal element, 4015: connection terminal electrode, 4016: terminal electrode, 4018: FPC, 4019: anisotropic conductive film, 4021: insulating layer, 4030: pixel electrode layer, 4031: counter electrode layer, 4032: insulating layer, 4040: conductive layer, 4041: insulating layer, 4042: protective insulating layer, 4501: substrate, 4502: pixel portion, 4503*a*: signal line driver circuit, 4504*a*: scan line driver circuit, 4505: sealant, 4506: substrate, 4507: filler, 4509: thin film transistor, 4510: thin film transistor, 4511: light-emitting element, 4512: electroluminescent layer, 4513: electrode, 4515: connection terminal electrode, 4516: terminal electrode, 4517: electrode, 4518*a*: FPC, 4519: anisotropic conductive film, 4520: partition, 4540: conductive layer, 4542: silicon oxide layer, 4543: overcoat layer, 4544: insulating layer, 4545: color filter layer, 4550: wiring layer, 4551: insulating layer, 5001: dry pump, 5002: exhaustion chamber, 5003: power supply, 5004: target, 5005: cathode, 5006: stage elevator, 5007: substrate stage, 5008: gate valve, 5009: cooling water, 5010: flow rate controller, 5011: gas tank, 6400: pixel, 6401: switching transistor, 6402: driving transistor, 6403: capacitor, 6404: light-emitting element, 6405: signal line, 6406: scan line, 6407: power supply line, 6408: common electrode, 7001: driving TFT, 7002: light-emitting element, 7003: electrode, 7004: EL layer, 7005: electrode, 7009: partition, 7011: driving TFT, 7012: light-emitting element, 7013: electrode, 7014: EL layer, 7015: electrode, 7016: light-blocking film, 7017: conductive film, 7019: partition, 7021: driving TFT, 7022: light-emitting element, 7023: electrode, 7024: EL layer, 7025: electrode, 7027: conductive film, 7029: partition, 7031: insulating layer, 7032: insulating layer, 7033: color filter layer, 7034: overcoat layer, 7035: protective insulating layer, 7036: planarizing insulating film, 7042: insulating layer, 7043: color filter layer, 7044: overcoat layer, 7045: protective insulating layer, 7046: planarizing insulating film, 7051: silicon oxide layer, 7052: protective insulating layer, 7053: planarization insulating layer, 7055: insulating layer, 7056: planarization insulating layer, 9600: television set, 9601: housing, 9603: display portion, 9605: stand, 9607: display portion, 9609: operation key, 9610: remote controller, 9700: digital photo frame, 9701: housing, 9703: display portion, 9881: housing, 9882: display portion, 9883: display portion, 9884: speaker portion, 9885: operation key, 9886: recording medium insertion portion, 9887: connection terminal, 9888: sensor, 9889: microphone, 9890: LED lamp, 9891: housing, 9893: connection portion.

The invention claimed is:

1. A manufacturing method of a semiconductor device comprising steps of:
   forming a gate electrode layer over a substrate,
   forming a gate insulating layer over the gate electrode layer;
   introducing the substrate into a first treatment chamber;
   performing a first sputtering operation using an oxide semiconductor target to form an oxide semiconductor layer over the gate insulating layer;
   heating the substrate, the gate insulating layer, and the oxide semiconductor layer at a temperature higher than or equal to 100° C. and lower than or equal to 400° C. after performing the first sputtering operation; and
   forming, over and in contact with the oxide semiconductor layer, a silicon oxide layer including defects at a temperature higher than or equal to 0° C. and lower than or equal to 50° C. after the step of heating the substrate the gate insulating layer, and the oxide semiconductor layer,
   wherein the substrate is heated during the step of forming of the oxide semiconductor layer at a first temperature.

2. The manufacturing method of a semiconductor device according to claim 1, wherein the oxide semiconductor layer includes at least one of indium, gallium, and zinc.

3. The manufacturing method of a semiconductor device according to claim 1,
   wherein a mixed region having a thickness comprised between 1 nm and 10 nm is provided at an interface between the oxide semiconductor layer and the silicon oxide layer,
   wherein the mixed region includes oxygen, silicon, and at least one kind of metal element included in the oxide semiconductor layer.

4. The manufacturing method of a semiconductor device according to claim 1,
   wherein the silicon oxide layer is formed by performing a second sputtering operation.

5. The manufacturing method of a semiconductor device according to claim 1, wherein a filling rate of the oxide semiconductor target is greater than or equal to 90%.

6. The manufacturing method of a semiconductor device according to claim 1,
   wherein the step of heating the substrate, the gate insulating layer, and the oxide semiconductor layer is performed in a second chamber, and
   wherein the step of forming the silicon oxide layer is performed in a third chamber.

7. The manufacturing method of a semiconductor device according to claim 1, wherein the silicon oxide layer is in contact with the gate insulating layer.

8. A manufacturing method of a semiconductor device comprising steps of:
   forming a gate electrode layer over a substrate,
   forming a gate insulating layer over the gate electrode layer;
   introducing the substrate into a first treatment chamber;
   introducing into the first treatment chamber an oxygen gas and a rare gas, wherein each of the oxygen gas and the rare gas has a purity of 7N or higher;

performing a first sputtering operation using an oxide semiconductor target to form an oxide semiconductor layer having hydrogen concentration of $2\times10^{19}$ cm$^{-3}$ or less when measured by secondary ion mass spectrometry, over the gate insulating layer;

heating the substrate, the gate insulating layer, and the oxide semiconductor layer at a temperature higher than or equal to 100° C. and lower than or equal to 400° C. after performing the first sputtering operation; and then forming, over the oxide semiconductor layer, a silicon oxide layer including defects at a temperature higher than or equal to 0° C. and lower than or equal to 50° C., wherein the substrate is heated during the step of forming of the oxide semiconductor layer at a first temperature.

9. The manufacturing method of a semiconductor device according to claim 8, wherein the oxide semiconductor layer includes at least one of indium, gallium, and zinc.

10. The manufacturing method of a semiconductor device according to claim 8, wherein a mixed region having a thickness comprised between 1 nm and 10 nm is provided at an interface between the oxide semiconductor layer and the silicon oxide layer, wherein the mixed region includes oxygen, silicon, and at least one kind of metal element included in the oxide semiconductor layer.

11. The manufacturing method of a semiconductor device according to claim 8, wherein the silicon oxide layer is formed by performing a second sputtering operation.

12. The manufacturing method of a semiconductor device according to claim 8, wherein a filling rate of the oxide semiconductor target is greater than or equal to 90%.

13. The manufacturing method of a semiconductor device according to claim 8, wherein the step of heating the substrate, the gate insulating layer, and the oxide semiconductor layer is performed in a second chamber, and wherein the step of forming the silicon oxide layer is performed in a third chamber.

14. The manufacturing method of a semiconductor device according to claim 8, wherein the silicon oxide layer is in contact with the gate insulating layer.

* * * * *